(12) United States Patent  
Sakamoto

(10) Patent No.: US 11,283,031 B2  
(45) Date of Patent: Mar. 22, 2022

(54) ORGANIC ELECTROLUMINESCENCE DEVICE AND SILICON-CONTAINING COMPOUND FOR ORGANIC ELECTROLUMINESCENCE DEVICE

(71) Applicant: Samsung Display Co., Ltd., Yongin-si (KR)

(72) Inventor: Naoya Sakamoto, Tsurumi-ku (JP)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 16/401,082

(22) Filed: May 1, 2019

(65) Prior Publication Data

US 2019/0393432 A1    Dec. 26, 2019

(30) Foreign Application Priority Data

Jun. 20, 2018    (KR) .................. 10-2018-0070994

(51) Int. Cl.
*C07F 9/46* (2006.01)
*H01L 51/00* (2006.01)
(Continued)

(52) U.S. Cl.
CPC ........ *H01L 51/0094* (2013.01); *C07F 7/0816* (2013.01); *C07F 9/46* (2013.01);
(Continued)

(58) Field of Classification Search
None
See application file for complete search history.

(56) References Cited

U.S. PATENT DOCUMENTS

2015/0236274 A1\* 8/2015 Hatakeyama ....... H01L 51/0054 257/40
2018/0040821 A1    2/2018 Hatakeyama et al.
(Continued)

FOREIGN PATENT DOCUMENTS

JP    5724588 B2    4/2015  
JP    2017-79267 A    4/2017  
(Continued)

*Primary Examiner* — Robert S Loewe  
(74) *Attorney, Agent, or Firm* — Lewis Roca Rothgerber Christie LLP

(57) ABSTRACT

A silicon-containing compound represented by Formula 1 and an organic electroluminescence device including the same in at least one of a plurality of organic layers of the device are provided.

[Formula 1]

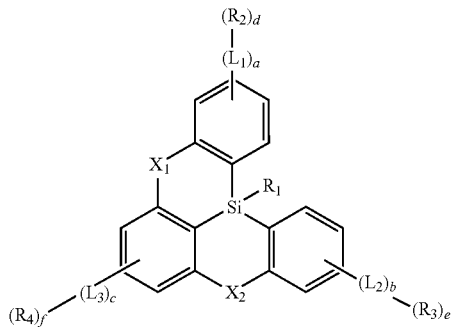

20 Claims, 2 Drawing Sheets

(51) Int. Cl.
    *C07F 7/08*      (2006.01)
    *H01L 51/50*     (2006.01)
(52) U.S. Cl.
    CPC ...... *H01L 51/5016* (2013.01); *H01L 51/5056* (2013.01); *H01L 51/5072* (2013.01)

(56) References Cited

U.S. PATENT DOCUMENTS

2018/0069182 A1*   3/2018   Hatakeyama ............. C07F 9/90
2018/0094000 A1*   4/2018   Hatakeyama .......... C09K 11/06
2018/0301629 A1*  10/2018   Hatakeyama ........ C09K 11/025
2019/0207112 A1*   7/2019   Hatakeyama ........ C07D 307/77

FOREIGN PATENT DOCUMENTS

| JP | 2018-43984 A | 3/2018 |
| KR | 10-2016-0119683 A | 10/2016 |
| KR | 10-2017-0126888 A | 11/2017 |
| WO | WO 2015/102118 A1 | 7/2015 |

\* cited by examiner

ORGANIC ELECTROLUMINESCENCE DEVICE AND SILICON-CONTAINING COMPOUND FOR ORGANIC ELECTROLUMINESCENCE DEVICE

CROSS-REFERENCE TO RELATED APPLICATIONS

This patent application claims priority to and the benefit of Korean Patent Application No. 10-2018-0070994, filed on Jun. 20, 2018, the entire content of which is hereby incorporated by reference.

BACKGROUND

1. Field

Development on an organic electroluminescence display as an image display is being actively conducted. An organic electroluminescence display is different from a liquid crystal display and is a so called self-luminescent display, which accomplishes display (e.g., display images) by recombining holes and electrons injected from a first electrode and a second electrode in an emission layer and emitting light from a luminescent material (which is an organic compound included in the emission layer).

2. Description of the Related Art

An organic electroluminescence device may include a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light when the excitons transition from an excited state back to a ground state.

In an application of an organic electroluminescence device to a display, the decrease of a driving voltage, the increase of emission efficiency and the extension of life (e.g., lifespan) for the organic electroluminescence device are desired, and development of materials which may stably implement these requirements in the organic electroluminescence device is also continuously pursued.

SUMMARY

Aspects according to embodiments of the present disclosure are directed toward an organic electroluminescence device and a silicon-containing compound utilized for the same.

In an embodiment of the inventive concept, an organic electroluminescence device may include a first electrode, a plurality of organic layers on the first electrode, and a second electrode on the plurality of organic layers, wherein the first electrode and the second electrode each independently include at least one selected from Aq, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof. At least one organic layer of the plurality of organic layers may include a silicon-containing compound represented by the following Formula 1:

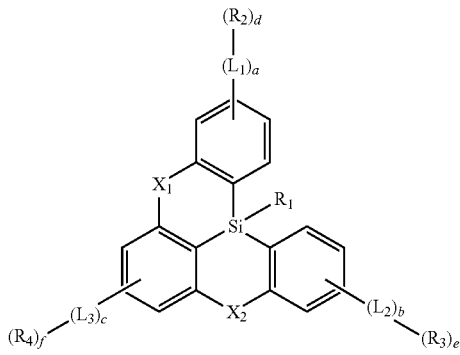

Formula 1

In Formula 1, $X_1$ and $X_2$ are each independently O or S, $R_1$ is a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $L_1$ to $L_3$ are each independently a direct linkage, a substituted or unsubstituted arylene group having 6 to 30 carbon atoms for forming a ring, or a substituted or unsubstituted heteroarylene group having 2 to 30 carbon atoms for forming a ring. a and b are each independently an integer of 0 to 4, c is an integer of 0 to 3, d to f are each independently an integer of 0 to 5, and at least one of d to f is an integer of 1 or more. $R_2$ to $R_4$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 carbon atoms for forming a ring, a substituted or unsubstituted heteroaryl group having 2 to 30 carbon atoms for forming a ring, or a moiety represented by any one of the following Formulae 2 to 4.

Formula 2

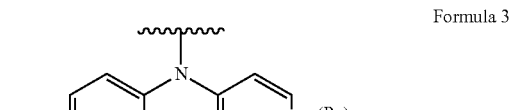

Formula 3

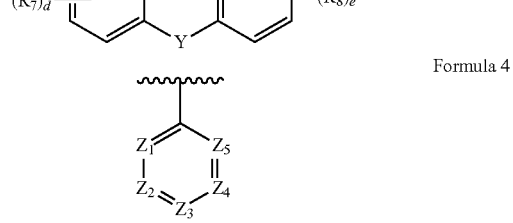

Formula 4

In Formulae 2 to 4, $X_3$ is O or S, Y is a direct linkage, $CR_9R_{10}$, or $SiR_{11}R_{12}$, $Z_1$ to $Z_5$ are each independently $CR_{13}$ or N, and at least one of $Z_1$ to $Z_5$ is N, and $R_5$ to $R_{13}$ are each independently a hydrogen atom, a deuterium atom, a substituted or unsubstituted alkoxy group having 1 to 20 carbon atoms, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring.

In an embodiment, $L_1$ to $L_3$ may be each independently a direct linkage, a substituted or unsubstituted phenylene group, or a substituted or unsubstituted divalent biphenyl group.

In an embodiment, the silicon-containing compound represented by Formula 1 may be represented by any one of the following Formulae 1-1 to 1-3.

Formula 1-1

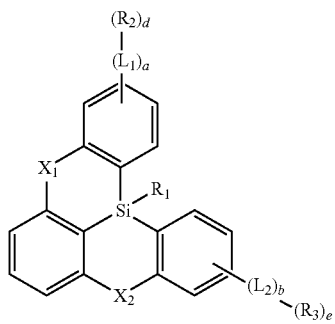

Formula 1-2

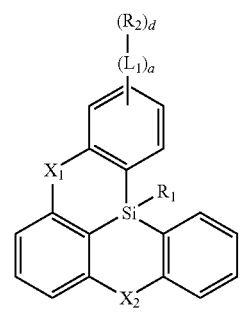

Formula 1-3

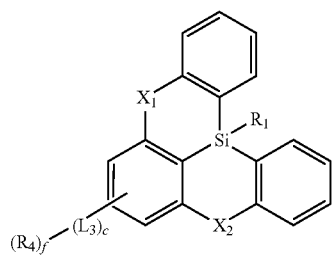

In Formulae 1-1 to 1-3, d to f may be each independently an integer of 1 to 5, and a to c, $L_1$ to $L_3$, $R_1$ to $R_4$, $X_1$ and $X_2$ are the same as respectively defined in connection with Formula 1.

In an embodiment, $R_1$ may be represented by any one of the following Formula 5 or 6.

Formula 5

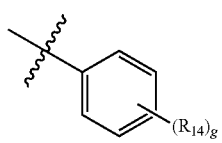

Formula 6

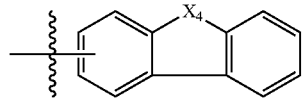

In Formula 5, g may be an integer of 0 to 5, and $R_{14}$ may be a hydrogen atom, a substituted or unsubstituted alkyl group having 1 to 10 carbon atoms, a substituted or unsubstituted alkoxy group having 1 to 10 carbon atoms, a halogen atom, a substituted or unsubstituted aryl group having 6 to 15 carbon atoms for forming a ring, or a substituted or unsubstituted heteroaryl group having 2 to 15 carbon atoms for forming a ring. In Formula 6, $X_4$ may be $NR_{15}$, O, or S, and $R_{15}$ may be a hydrogen atom, a substituted or unsubstituted alkyl group having 1 to 10 carbon atoms, a substituted or unsubstituted aryl group having 6 to 15 carbon atoms for forming a ring, or a substituted or unsubstituted heteroaryl group having 2 to 15 carbon atoms for forming a ring.

In an embodiment, the moiety represented by Formula 2 may be represented by the following Formula 2-1.

Formula 2-1

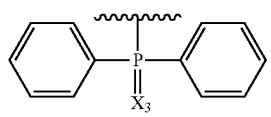

In Formula 2-1, $X_3$ is the same as defined in connection with Formula 2.

In an embodiment, the moiety represented by Formula 4 may be represented by any one of the following Formulae 4-1 to 4-3.

Formula 4-1

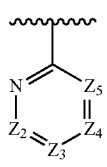

Formula 4-2

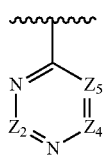

Formula 4-3

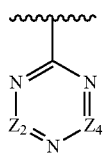

In Formulae 4-1 to 4-3, $Z_2$ to $Z_5$ are the same as respectively defined in connection with Formula 4.

In an embodiment, $R_5$ to $R_{13}$ may be each independently a hydrogen atom, a methyl group, a t-butyl group, a methoxy group, or an unsubstituted phenyl group.

In an embodiment, the plurality of organic layers may include a hole transport region on the first electrode, an emission layer on the hole transport region, and an electron transport region on the emission layer.

In an embodiment, the emission layer may include a host and a dopant, and the host may include the silicon-containing compound.

In an embodiment, at least one of the hole transport region or the electron transport region may include the silicon-containing compound.

In an embodiment, the emission layer may be configured to emit blue light with a wavelength range of about 440 nm to about 480 nm.

An embodiment of the inventive concept provides a silicon-containing compound represented by the above Formula 1.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

In the drawings.

DETAILED DESCRIPTION

Figure 1:
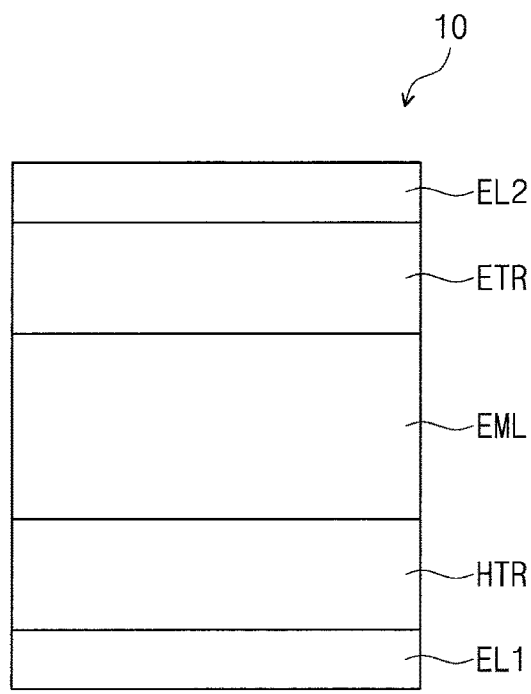
FIG. 1 is a schematic cross-sectional view of an organic electroluminescence device according to an embodiment of the inventive concept.

The above objects, other objects, features and enhancements of the inventive concept will be easily understood from exemplary embodiments with reference to the accompanying drawings. The inventive concept may, however, be embodied in different forms and should not be construed as being limited to the embodiments set forth herein. Rather, these embodiments are provided so that this disclosure will be thorough and complete, and will fully convey the scope of the inventive concept to those skilled in the art.

It will be understood that the terms "comprise," or "have," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc., is referred to as being "on" another part, it can be "directly on" the other part, or intervening layers may also be present. Similarly, when a layer, a film, a region, a plate, etc., is referred to as being "under" another part, it can be "directly under" the other part, or one or more intervening layers may also be present.

In the present disclosure, the term "substituted or unsubstituted" may refer to an unsubstituted functional group or a functional group substituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group and a heterocyclic group group, unless the context clearly indicates otherwise. In addition, each of the substituent illustrated above may be substituted or unsubstituted. For example, a biphenyl group may be interpreted as an aryl group, or a phenyl group substituted with a phenyl group. A heterocyclic group may be an aliphatic heterocycle group or an aromatic heterocycle group (heteroaryl group).

In the present disclosure, examples of a halogen atom are a fluorine atom, a chlorine atom, a bromine atom, and/or an iodine atom.

In the present disclosure, the alkyl group may have a linear, branched or cyclic form. The carbon number of the alkyl group may be 1 to 30, 1 to 20, 1 to 10, or 1 to 5. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without being limited thereto.

In the present disclosure, the alkenyl group may be linear or branched. The carbon number is not specifically limited, and may be 2 to 30, 2 to 20, or 2 to 10. Examples of the alkenyl group include vinyl, 1-butenyl, 1-pentenyl, 1,3-butadienyl aryl, styrenyl, styrylvinyl, etc., without being limited thereto.

In the present disclosure, the term "aryl group" refers to any functional group or substituent derived from an aromatic hydrocarbon ring. The aryl group may be monocyclic aryl (e.g., aryl group) or polycyclic aryl. The carbon number of the aryl group for forming a ring may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc., without being limited thereto.

In the present disclosure, the heteroaryl group may be a heteroaryl including at least one of B, O, N, P, Si, or S as a heteroatom in forming a ring. When the heteroaryl group includes two or more heteroatoms, these heteroatoms may be the same or different from each other. The heteroaryl group may be monocyclic heteroaryl (e.g., heteroacryl group) or polycyclic heteroaryl. The carbon number of the heteroaryl group for forming a ring may be 2 to 30, 2 to 20, or 2 to 10. Examples of the heteroaryl group include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc., without being limited thereto.

In the present disclosure, the silyl group may be alkyl silyl (e.g., silyl group) or aryl silyl. Examples of the silyl group include trimethylsilyl, triethylsilyl, t-butyl dimethylsilyl, vinyl dimethylsilyl, propyl dimethylsilyl, triphenylsilyl, diphenylsilyl, phenylsilyl, etc., without being limited thereto.

In the present disclosure, the boron group may be alkyl boron (e.g., boron group) or aryl boron. Examples of the boron group include trimethyl boron, triethyl boron, t-butyl dimethyl boron, triphenyl boron, diphenyl boron, phenyl boron, etc., without being limited thereto.

In the present disclosure, the carbon number of the amino group is not specifically limited, and may be 1 to 30. The amino group may be alkyl amino (e.g., amino group) or aryl amino. Examples of the amino group include methylamino, dimethylamino, phenylamino, diphenylamino, naphthylamino, 9-methyl-anthracenylamino, triphenylamino, etc., without being limited thereto.

In the present disclosure, the alkoxy group may have a linear, branched or cyclic form. The carbon number of the alkoxy group is not specifically limited, and may be 1 to 20, or 1 to 10. Examples of the alkoxy group include methoxy, ethoxy, n-propoxy, isopropoxy, butoxy, pentyloxy, hexyloxy, octyloxy, nonyloxy, decyloxy, etc., without being limited thereto.

In the present disclosure, the phosphine oxide group may be substituted with at least one of alkyl or aryl, for example. Examples of the phosphine oxide group include phenylphosphine oxide, diphenylphosphine oxide, etc., without being limited thereto.

In the present disclosure, the phosphine sulfide group may be substituted with at least one of alkyl (e.g., alkyl group) or aryl (e.g., aryl group). Examples of the phosphine sulfide group include phenylphosphine sulfide, diphenylphosphine sulfide, etc., without being limited thereto.

The above explanation on the aryl group may be applied to the arylene group, except that the arylene group is divalent.

The above explanation on the heteroaryl group may be applied to the heteroarylene group, except that the heteroarylene group is divalent.

In the present disclosure, a direct linkage may refer to a single bond between atoms.

In the present disclosure

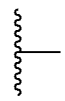

may represent a part to be connected with another atom. For example,

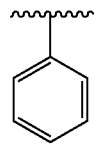 [SMILES: *c1ccccc1]

may represent a phenyl group connected with another atom.

Like reference numerals refer to like elements for explaining each drawing.

In the accompanying drawings, the sizes of elements may be enlarged for clarity of the inventive concept. It will be understood that, although the terms "first," "second," etc., may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

First of all, an organic electroluminescence device according to an embodiment of the inventive concept will be explained referring to FIGS. 1 to 3.

FIG. 1 is a schematic cross-sectional view illustrating an organic electroluminescence device according to an embodiment of the inventive concept. FIG. 2 is a schematic cross-sectional view illustrating an organic electroluminescence device according to an embodiment of the inventive concept. FIG. 3 is a schematic cross-sectional view illustrating an organic electroluminescence device according to an embodiment of the inventive concept.

Figure 2:
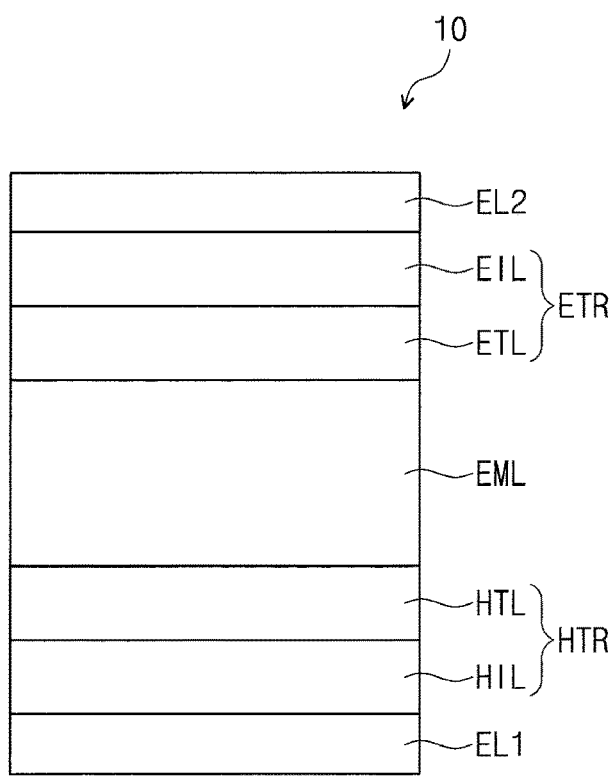
FIG. 2 is a schematic cross-sectional view of an organic electroluminescence device according to an embodiment of the inventive concept.
Figure 3:
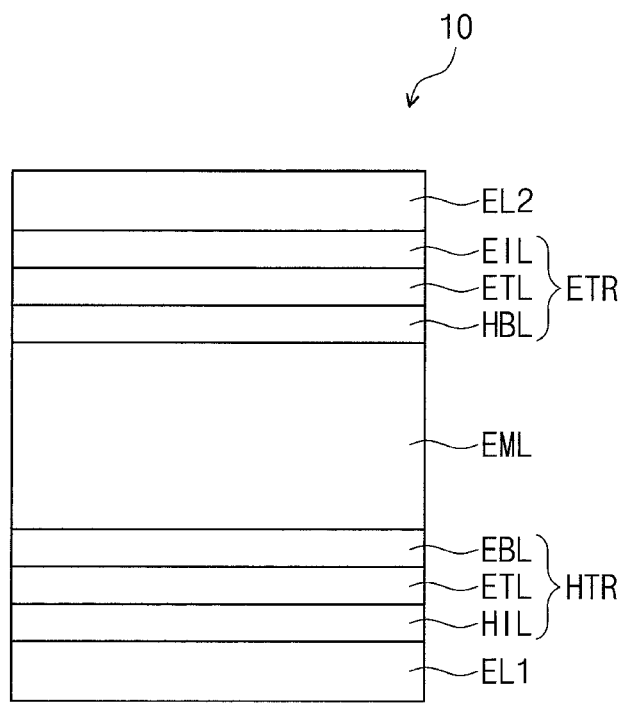
FIG. 3 is a schematic cross-sectional view of an organic electroluminescence device according to an embodiment of the inventive concept.

Referring to FIGS. 1 to 3, an organic electroluminescence device 10 according to an embodiment of the inventive concept includes a first electrode EL1, a plurality of organic layers disposed on the first electrode EL1, and a second electrode EL2 disposed on the organic layers.

The first electrode EL1 has conductivity. The first electrode EL1 may be a pixel electrode or an anode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed utilizing the above materials, and a transparent conductive layer formed utilizing ITO, IZO, ZnO, and/or ITZO. For example, the first electrode EL1 may have a triple-layer structure of ITO/Ag/ITO. However, an embodiment of the inventive concept is not limited thereto.

The thickness of the first electrode EL1 may be from about 1,000 Å to about 10,000 Å, for example, from about 1,000 Å to about 3,000 Å.

In an organic electroluminescence device 10 according to an embodiment of the inventive concept, the plurality of organic layers may include a hole transport region HTR, an emission layer EML, and an electron transport region ETR.

In an organic electroluminescence device 10 according to an embodiment of the inventive concept, at least one of the plurality of organic layers may include a silicon-containing compound represented by the following Formula 1:

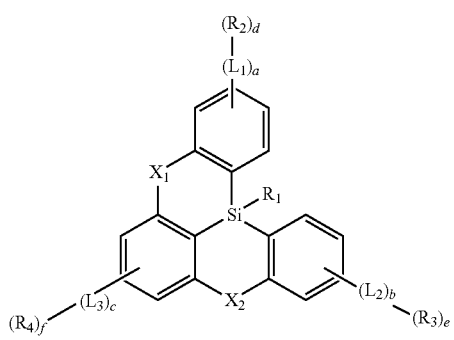

Formula 1

In Formula 1, $X_1$ and $X_2$ are each independently O or S. That is, both of $X_1$ and $X_2$ may be O or S, or one of $X_1$ and $X_2$ may be O, and the other may be S.

$R_1$ is a substituted or unsubstituted alkyl group, a substituted or unsubstituted aryl group, or a substituted or unsubstituted heteroaryl group. The substituted or unsubstituted alkyl group may have 1 to 20 carbon atoms, the substituted or unsubstituted aryl group may have 6 to 30 carbon atoms for forming a ring, and the substituted or unsubstituted heteroaryl group may have 2 to 30 carbon atoms for forming a ring.

The substituted or unsubstituted aryl group may be monocyclic aryl, and the substituted or unsubstituted heteroaryl group may be polycyclic heteroaryl.

$L_1$ to $L_3$ are each independently a direct linkage, a substituted or unsubstituted arylene group, or a substituted or unsubstituted heteroarylene group. The substituted or unsubstituted arylene group may have 6 to 30 carbon atoms for forming a ring, and the substituted or unsubstituted heteroarylene group may have 2 to 30 carbon atoms for forming a ring.

The substituted or unsubstituted arylene group may be monocyclic arylene. For example, $L_1$ to $L_3$ may be each independently a phenylene group or a divalent biphenyl group. However, an embodiment of the inventive concept is not limited thereto.

a and b are each independently an integer of 0 to 4, c is an integer of 0 to 3, d to f are each independently an integer of 0 to 5, and at least one of d to f is an integer of 1 or more.

For example, all of a to c may be 0. When a is 1, both of b and c may be 0, or b may be 1 and c may be 0. When c is 1, both of a and b may be 0. However, an embodiment of the inventive concept is not limited thereto.

For example, when d is 1, both of e and f may be 0, or e may be 1 and f may be 0. When f is 1, both of d and e may be 0. One of d and f may be 2, and the other one may be 0. However, an embodiment of the inventive concept is not limited thereto.

$R_2$ to $R_4$ are each independently a hydrogen atom, a deuterium atom, a halogen atom, a cyano group, a substituted or unsubstituted amino group, a substituted or unsubstituted silyl group, a substituted or unsubstituted alkyl group, a substituted or unsubstituted aryl group, or a substituted or unsubstituted heteroaryl group.

The substituted or unsubstituted alkyl group may have 1 to 20 carbon atoms, the substituted or unsubstituted aryl group may have 6 to 30 carbon atoms for forming a ring, and the substituted or unsubstituted heteroaryl group may have 2 to 30 carbon atoms for forming a ring The substituted or unsubstituted aryl group may be monocyclic aryl, and the substituted or unsubstituted heteroaryl group may be polycyclic heteroaryl.

In addition, $R_2$ to $R_4$ may be each independently represented by any one of the following Formulae 2 to 4.

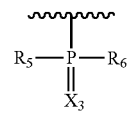

Formula 2

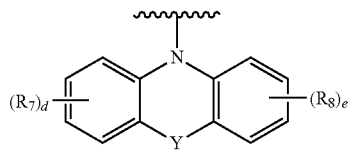

Formula 3

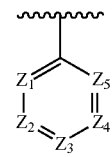

Formula 4

In Formulae 2 to 4, $X_3$ is O or S, Y is a direct linkage, $CR_9R_{10}$, or $SiR_{11}R_{12}$, $Z_1$ to $Z_5$ are each independently $CR_{13}$ or N, and at least one of $Z_1$ to $Z_5$ is N, and $R_5$ to $R_{13}$ are each independently a hydrogen atom, a deuterium atom, a substituted or unsubstituted alkoxy group, a substituted or unsubstituted alkyl group, a substituted or unsubstituted aryl group, or a substituted or unsubstituted heteroaryl group.

The substituted or unsubstituted alkoxy group may have 1 to 10 carbon atoms, the substituted or unsubstituted alkyl group may have 1 to 20 carbon atoms, and the substituted or unsubstituted aryl group may have 6 to 30 carbon atoms for forming a ring.

The substituted or unsubstituted heteroaryl group may have 2 to 30 carbon atoms for forming a ring. For example, $R_5$ to $R_{13}$ may be each independently a methyl group, a t-butyl group, a methoxy group, or an unsubstituted phenyl group. However, an embodiment of the inventive concept is not limited thereto.

For example, $R_1$ may be represented by any one of the following Formula 5 or 6.

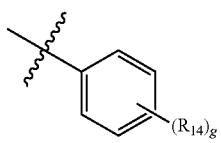

Formula 5

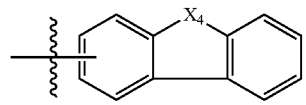

Formula 6

In Formula 5, g is an integer of 0 to 5, and $R_{14}$ is a hydrogen atom, a substituted or unsubstituted alkyl group, a substituted or unsubstituted alkoxy group, a halogen atom, a substituted or unsubstituted aryl group, or a substituted or unsubstituted heteroaryl group.

The substituted or unsubstituted alkyl group may have 1 to 10 carbon atoms, the substituted or unsubstituted alkoxy group may have 1 to 10 carbon atoms, the substituted or unsubstituted aryl group may have 6 to 15 carbon atoms for forming a ring, and the substituted or unsubstituted heteroaryl group may have 2 to 15 carbon atoms for forming a ring.

The substituted or unsubstituted heteroaryl group may be polycyclic heteroaryl group. For example, $R_{14}$ may be a methyl group, a trifluoromethyl group, a methoxy group, fluorine, or a carbazole group. However, an embodiment of the inventive concept is not limited thereto.

In Formula 6, $X_4$ is $NR_{15}$, O, or S, and $R_{15}$ is a hydrogen atom, a substituted or unsubstituted alkyl group, a substituted or unsubstituted aryl group, or a substituted or unsubstituted heteroaryl group.

The substituted or unsubstituted alkyl group may have 1 to 10 carbon atoms, the substituted or unsubstituted aryl group may have 6 to 15 carbon atoms for forming a ring, and the substituted or unsubstituted heteroaryl group may have 2 to 15 carbon atoms for forming a ring.

The substituted or unsubstituted aryl group may be monocyclic aryl. For example, $R_{15}$ may be a phenyl group. However, an embodiment of the inventive concept is not limited thereto.

The moiety represented by Formula 2 may be represented by the following Formula 2-1.

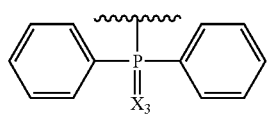

Formula 2-1

In Formula 2-1, $X_3$ is the same as defined in connection with Formula 2.

The moiety represented by Formula 4 may be represented by any one of the following Formulae 4-1 to 4-3.

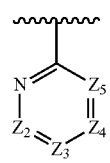

Formula 4-1

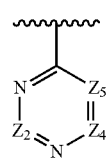

Formula 4-2

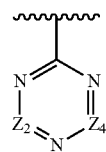

Formula 4-3

In Formulae 4-1 to 4-3, $Z_2$ to $Z_5$ are the same as respectively defined in connection with Formula 4.

The silicon-containing compound represented by Formula 1 may be represented by any one of the following Formulae 1-1 to 1-3.

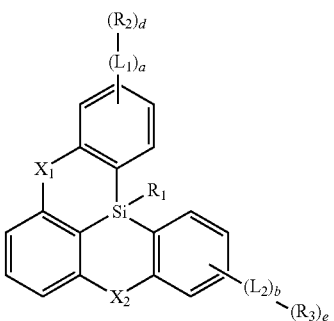

Formula 1-1

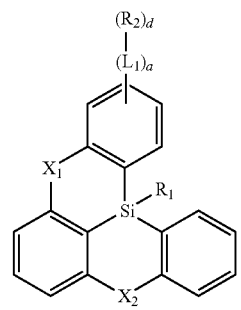

Formula 1-2

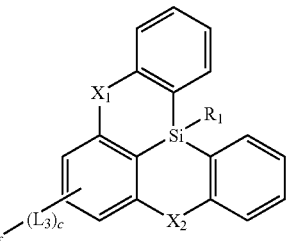

Formula 1-3

In Formulae 1-1 to 1-3, d to f are each independently an integer of 1 to 5, and a to c, $L_1$ to $L_3$, $R_1$ to $R_4$, $X_1$ and $X_2$ are the same as respectively defined in connection with Formula 1.

Formula 1-1 represents an embodiment of Formula 1 in which c and f are 0.

Formula 1-2 represents an embodiment of Formula 1 in which b, c, e and f are 0.

Formula 1-3 represents an embodiment of Formula 1 in which a, b, d and e are 0.

The silicon-containing compound according to an embodiment of the inventive concept may be any one selected from the group consisting of compounds represented in the following Compound Group 1. However, an embodiment of the inventive concept is not limited thereto.

Compound Group 1
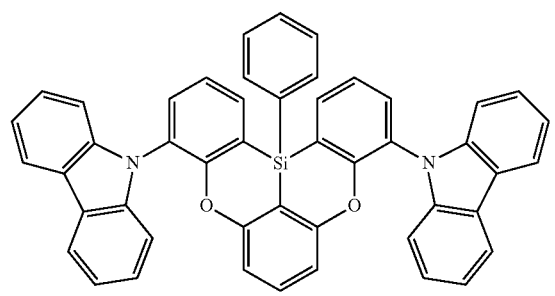
1
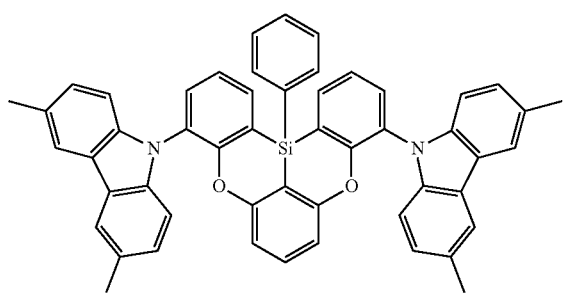
2
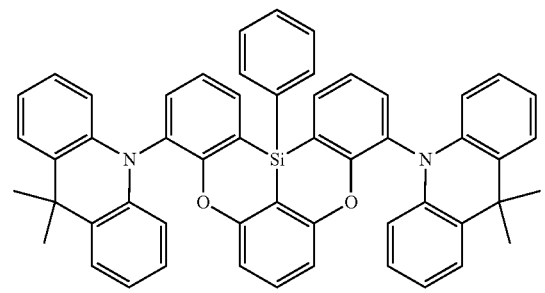
3
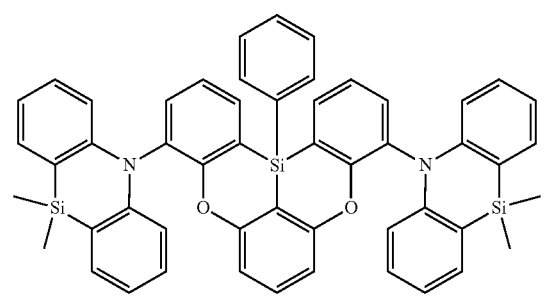
4
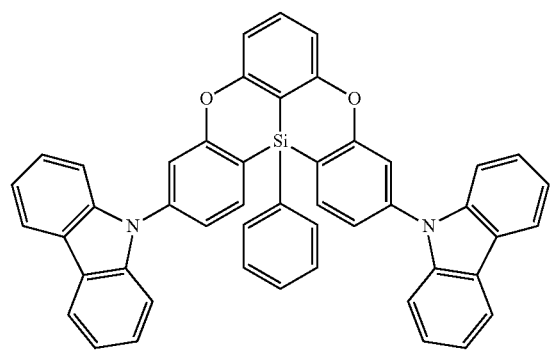
5
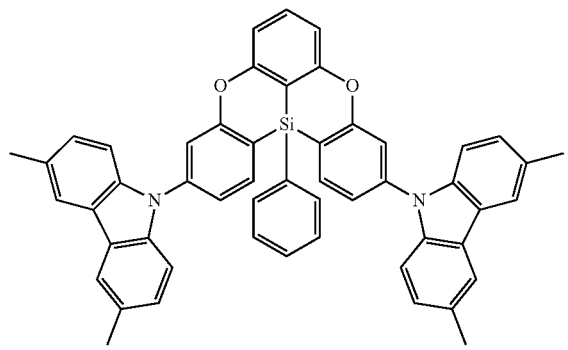
6
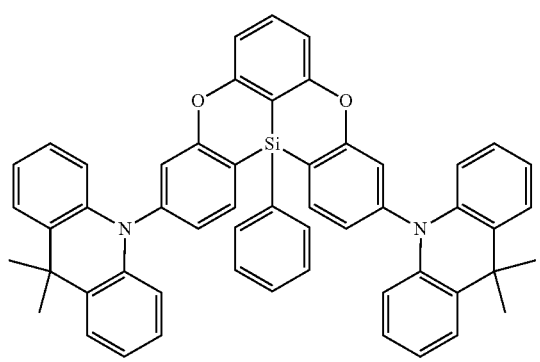
7
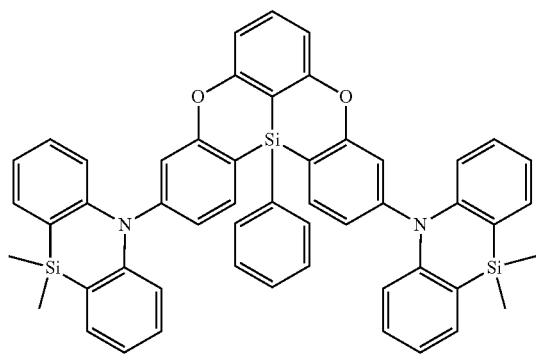
8
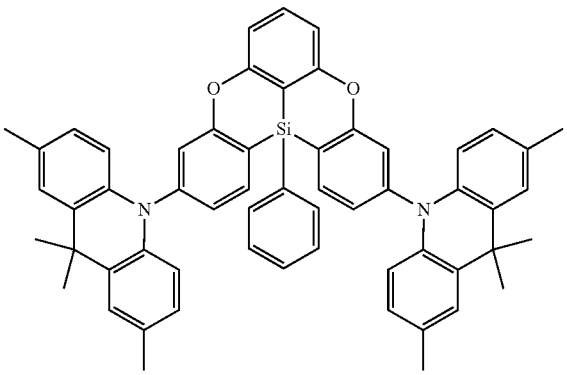
9

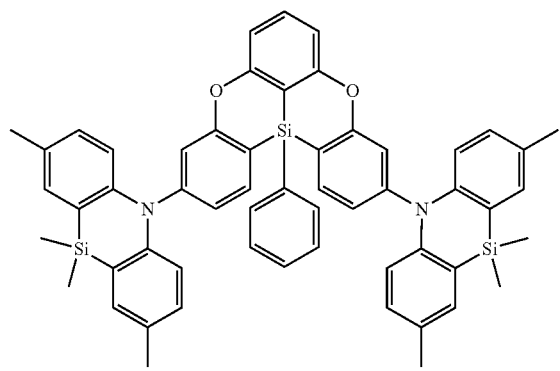
10
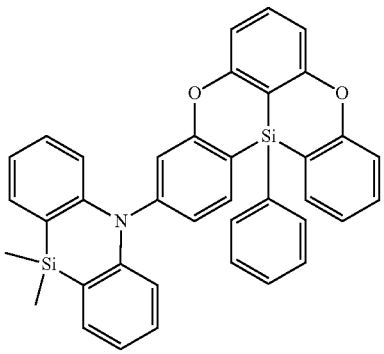
14
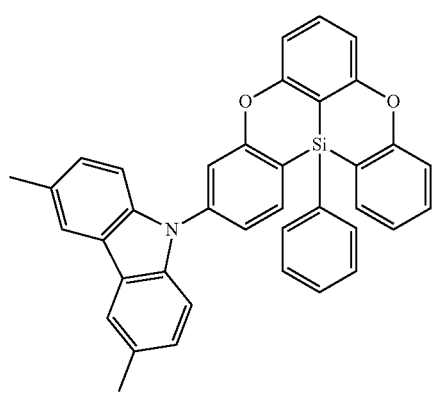
11
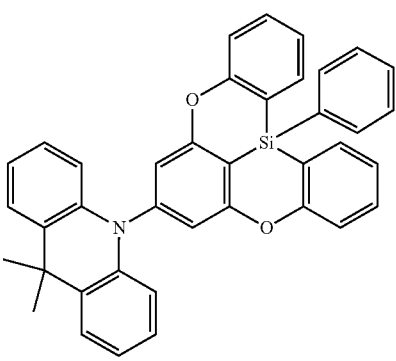
15
12
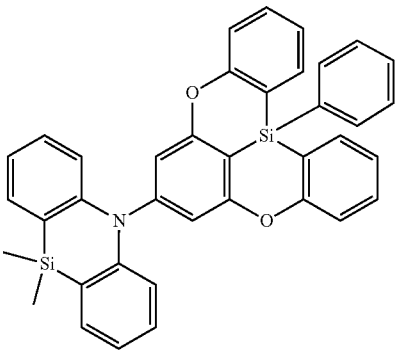
16
13
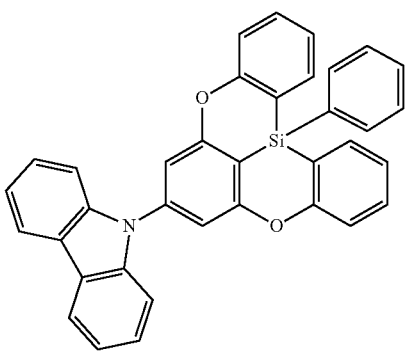
17

-continued
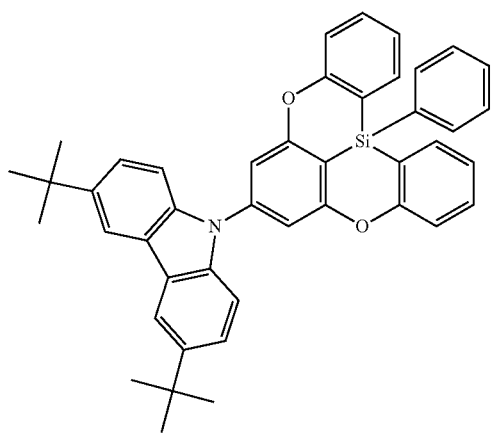
18
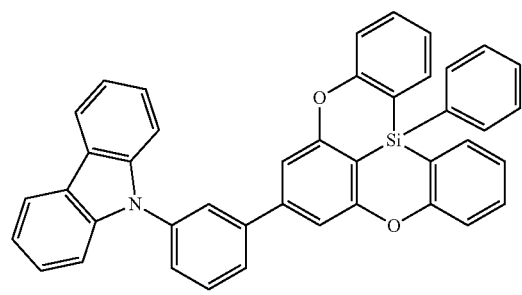
19
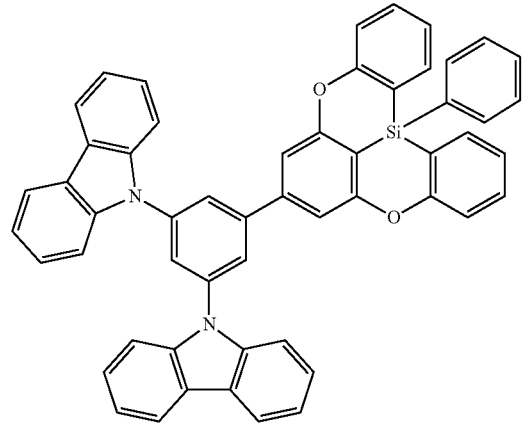
20
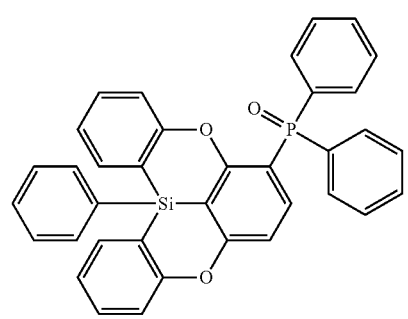
21
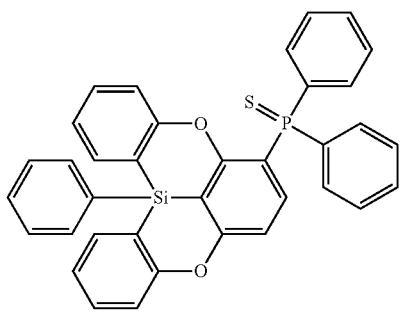
22
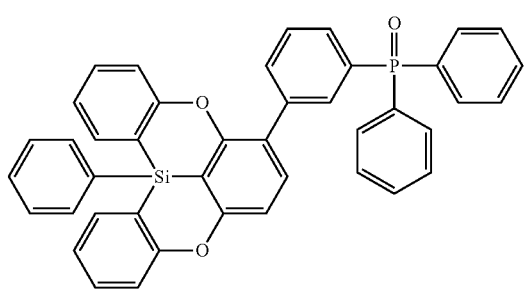
23
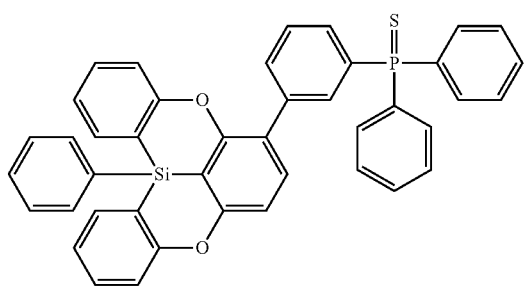
24
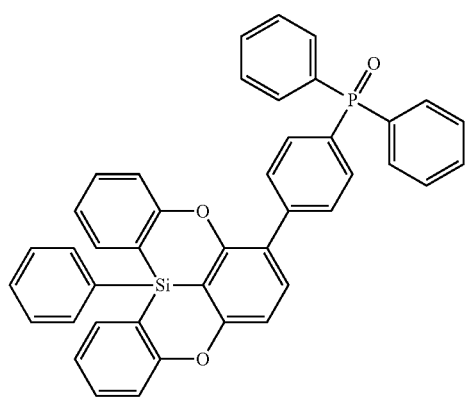
25

26
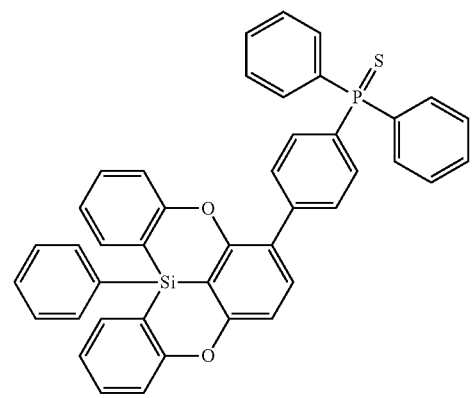
27
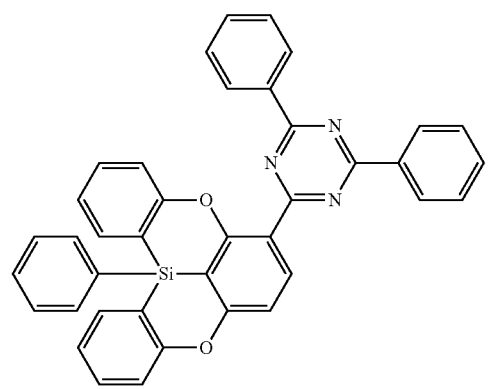
28
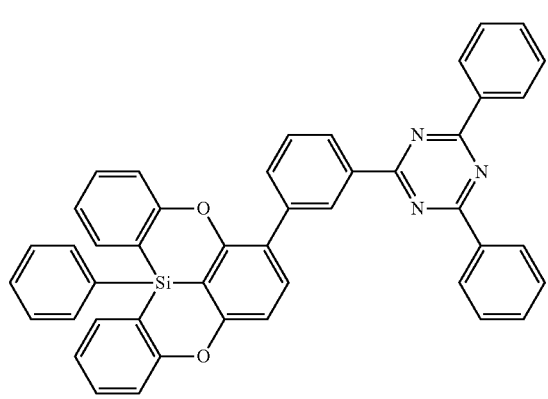
29
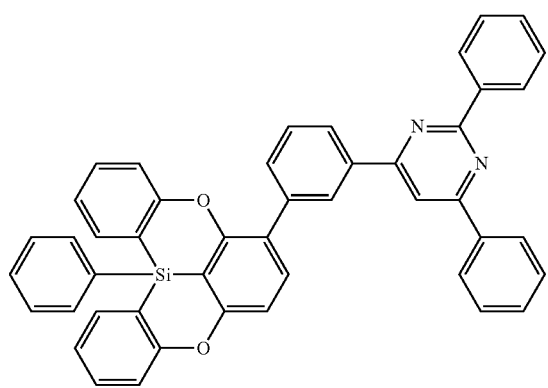
30
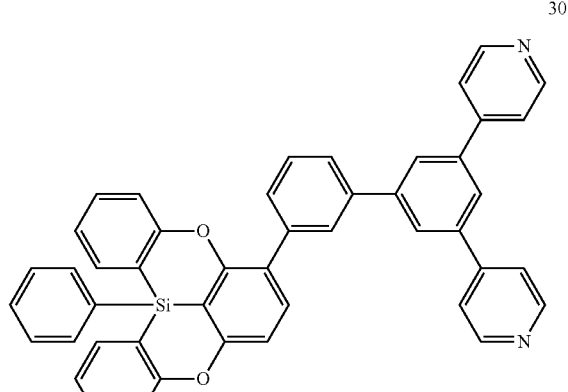
31
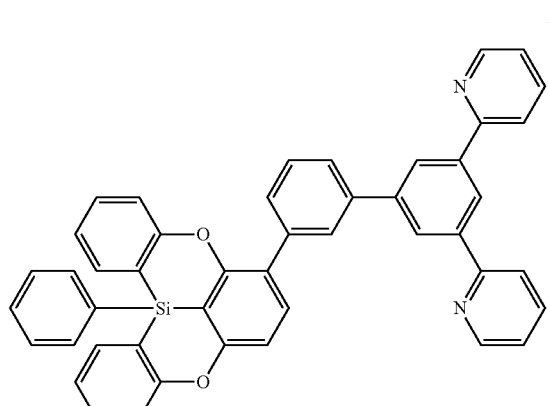
32
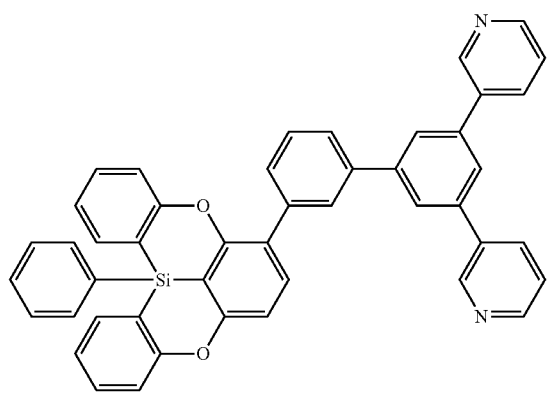
33
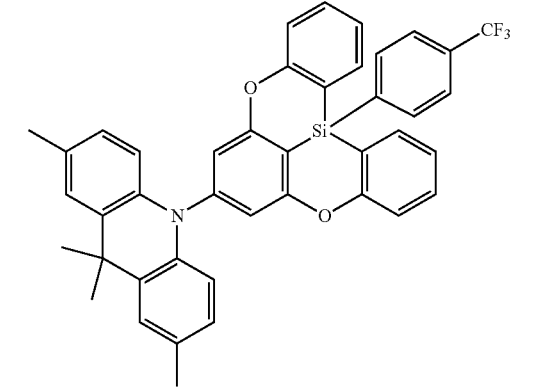

34
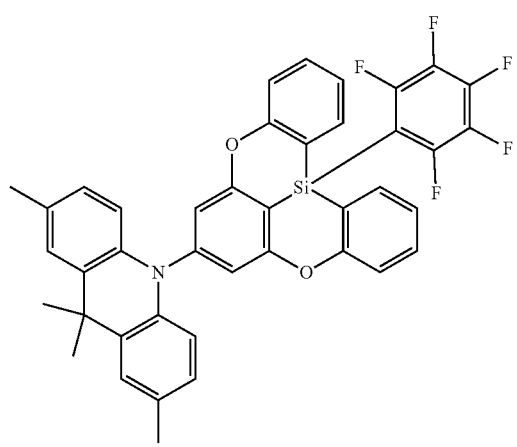
35
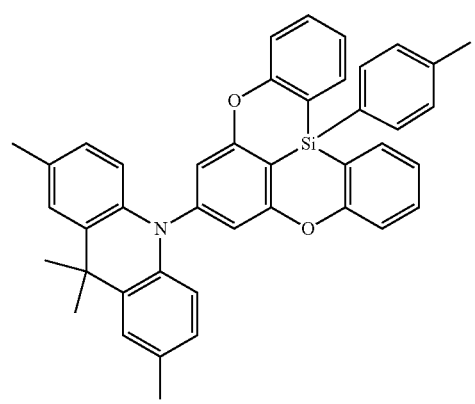
36
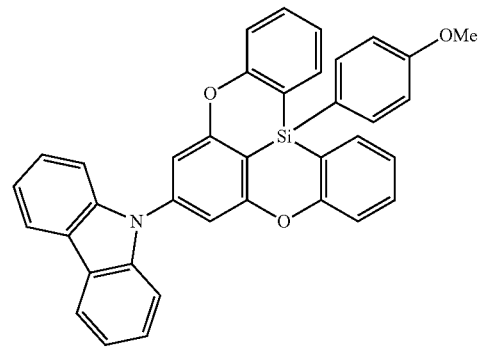
37
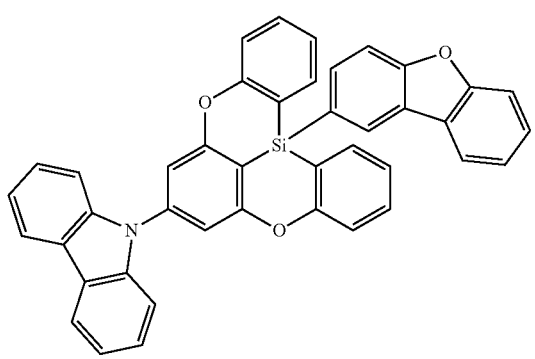
38
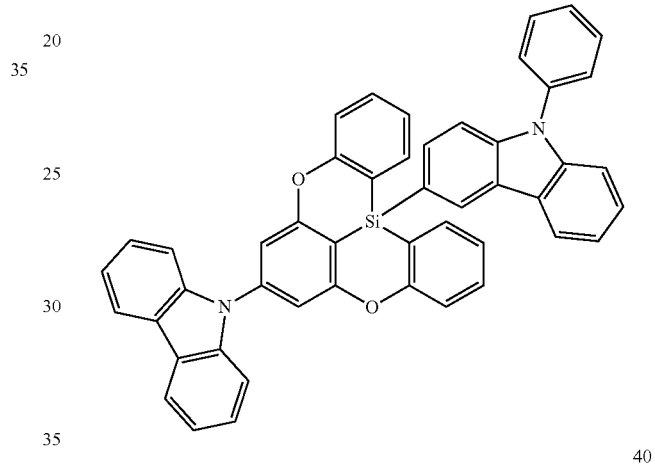
39
40
41
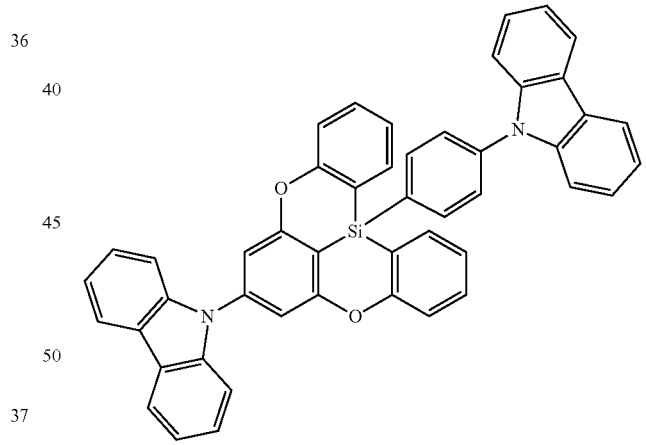
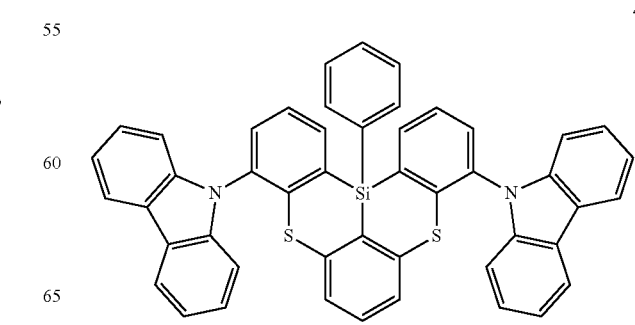

42
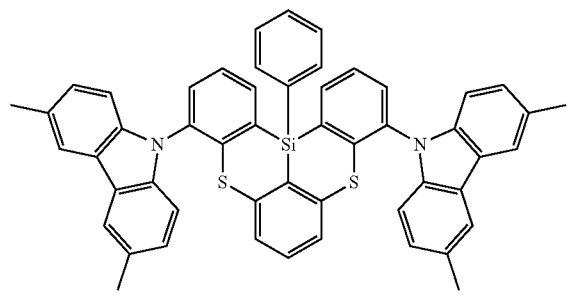
43
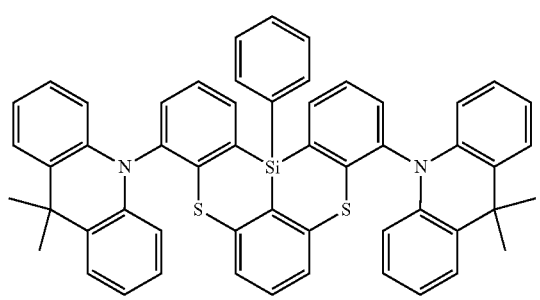
44
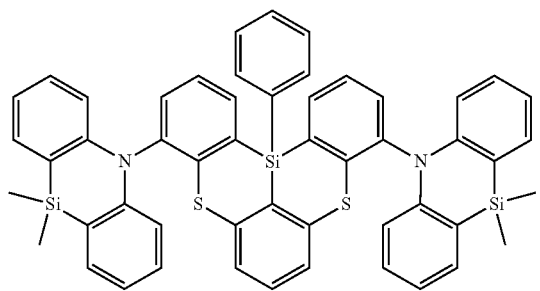
45
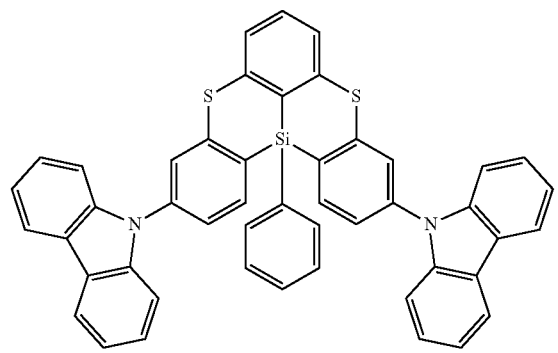
46
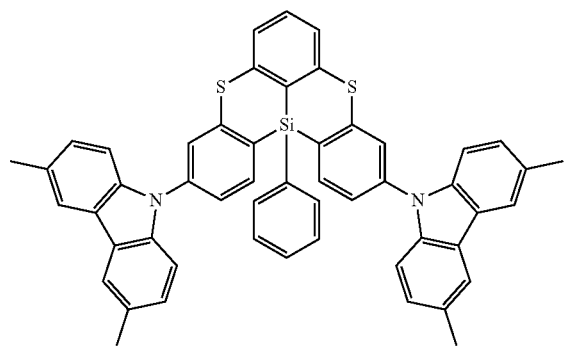
47
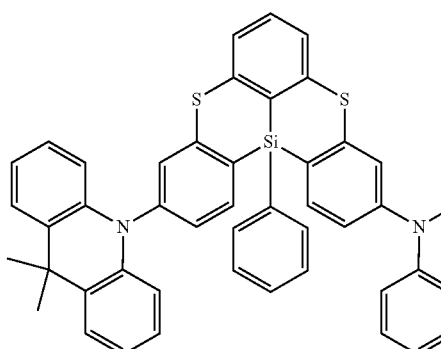
48
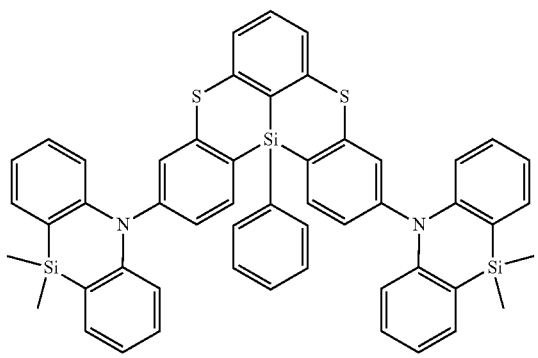
49
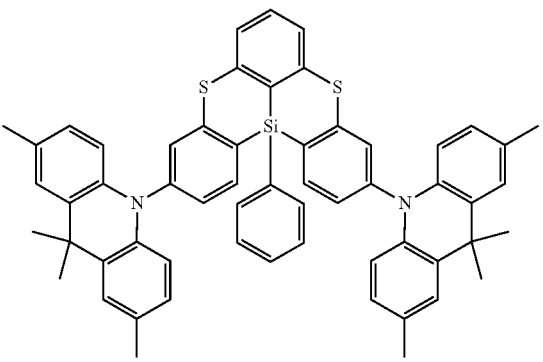

25
-continued
50
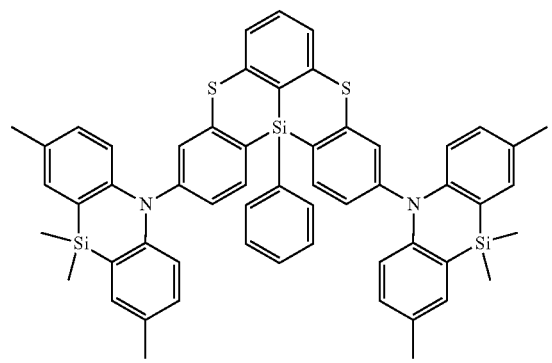
51
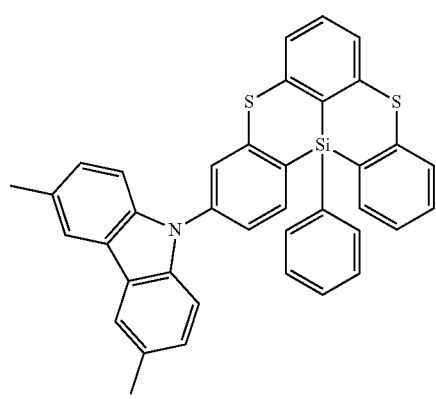
52
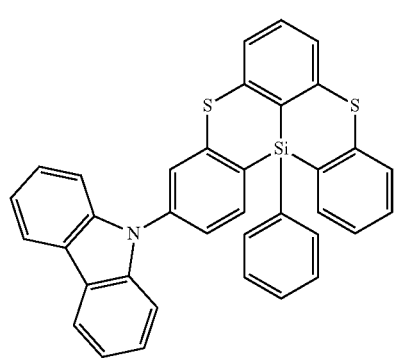
53
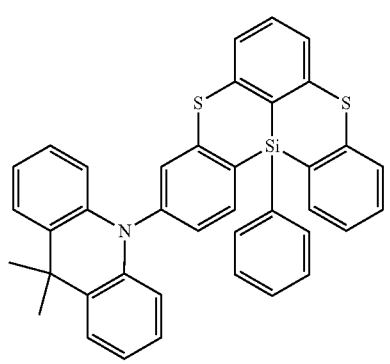
26
-continued
54
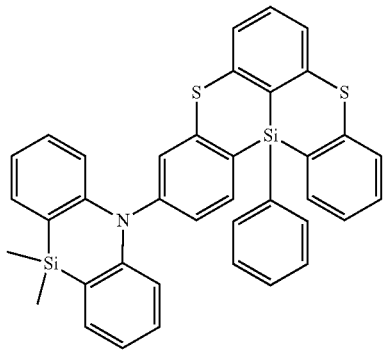
55
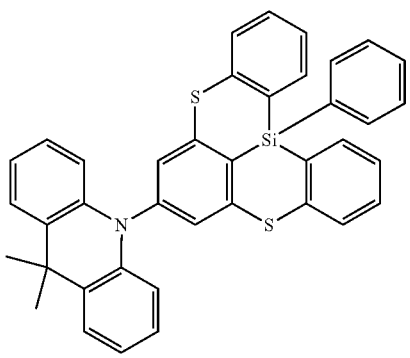
56
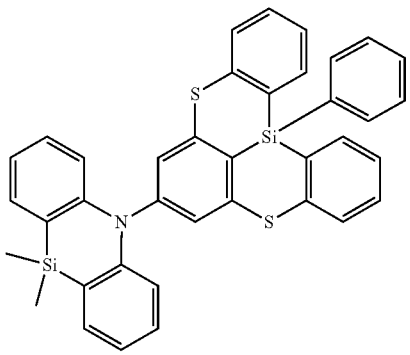
57
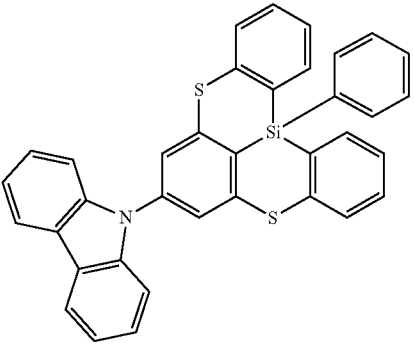

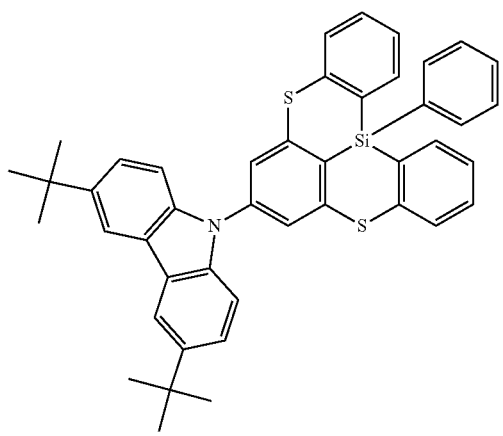
58
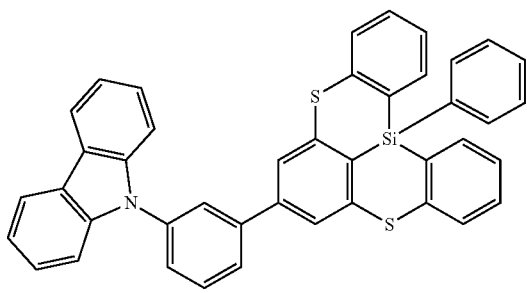
59
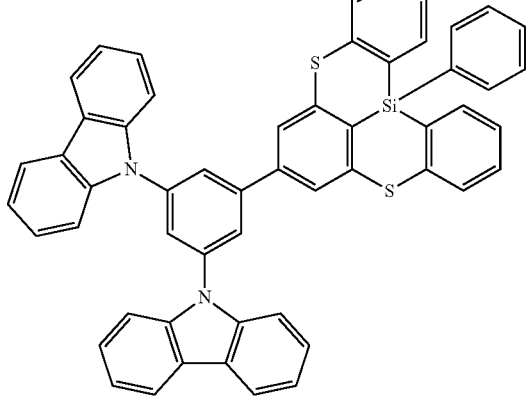
60
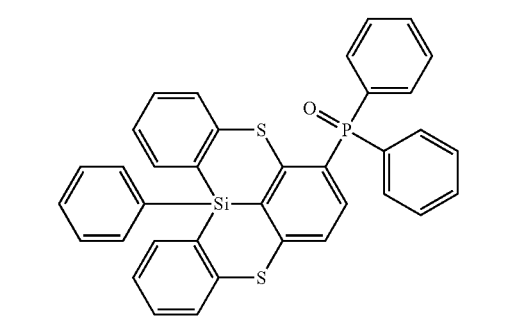
61
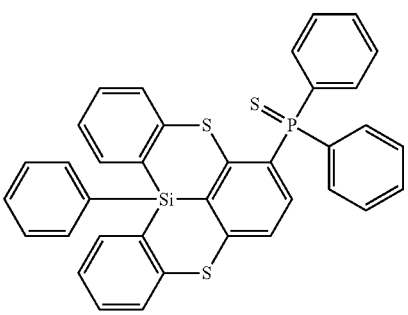
62
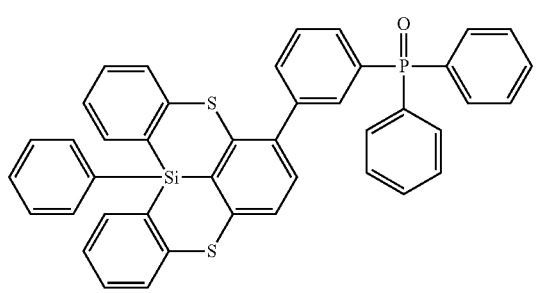
63
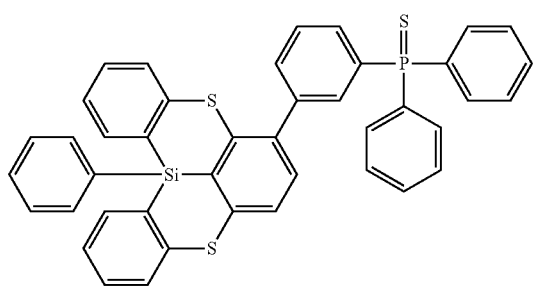
64
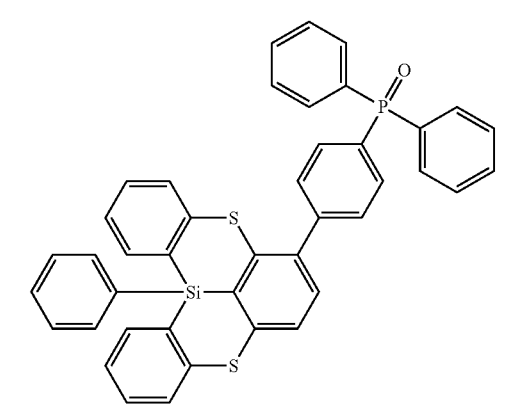
65

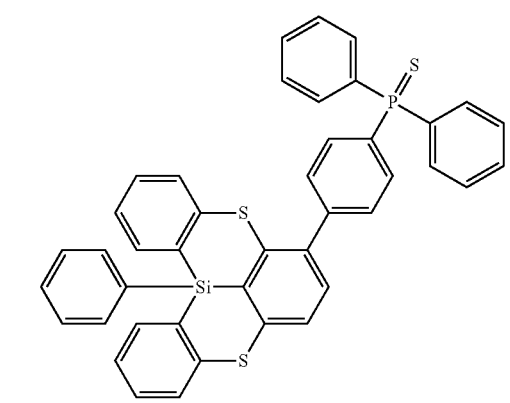
66
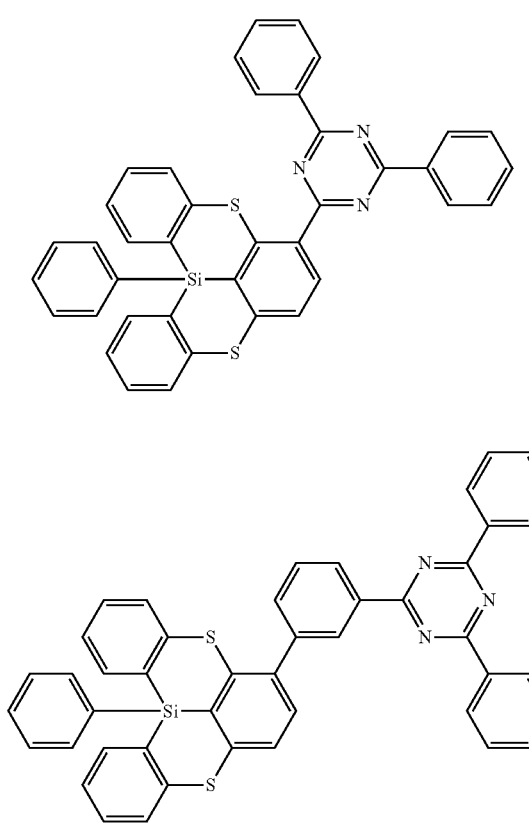
67
68
70
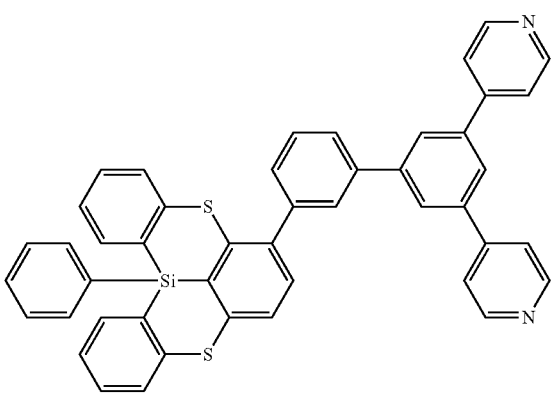
5
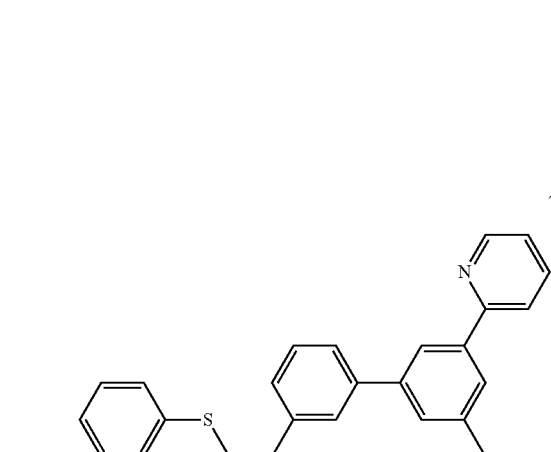
71
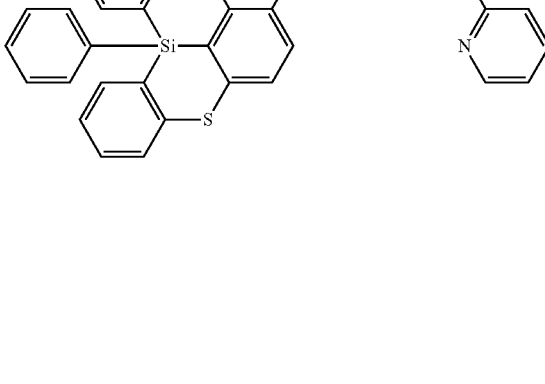
72
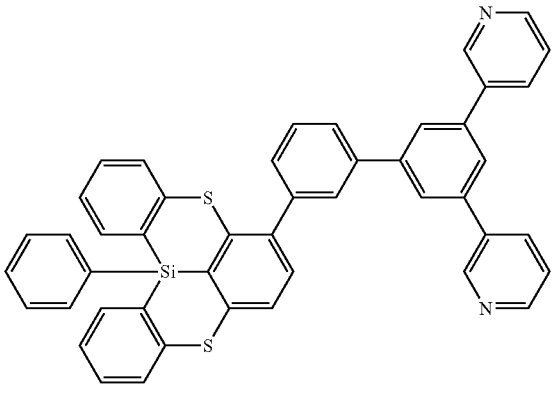

73
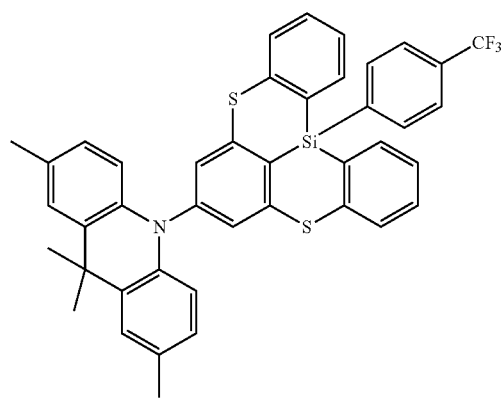
74
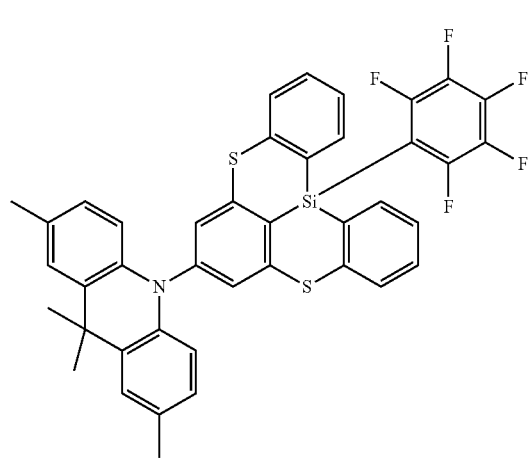
75
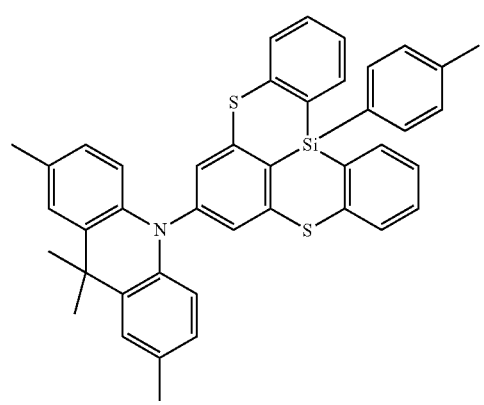
76
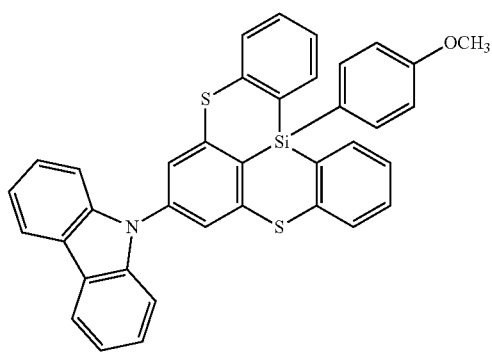
77
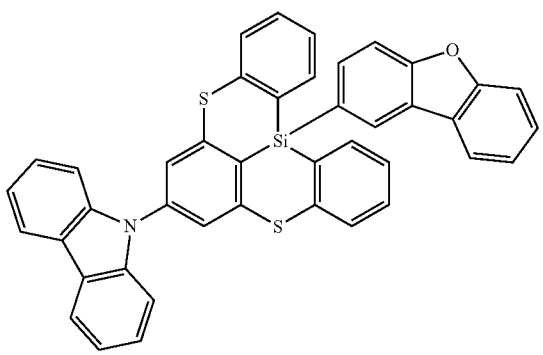
78
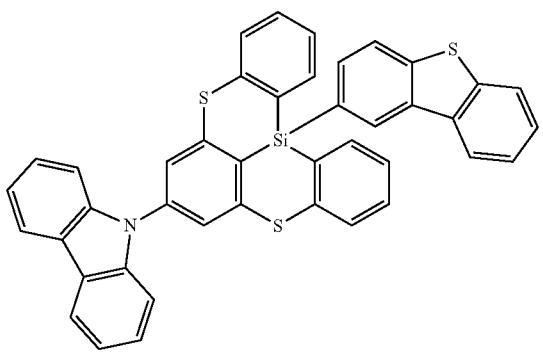
79
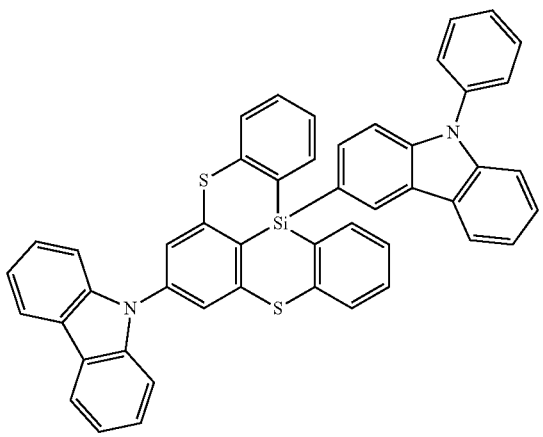

-continued

80

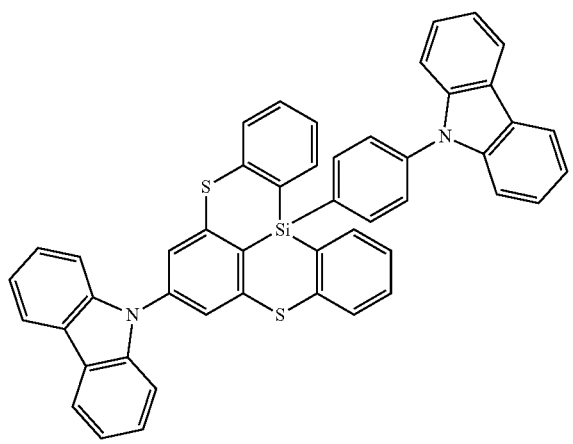

In an organic electroluminescence device 10 according to an embodiment of the inventive concept, the hole transport region HTR is disposed on the first electrode EL1. The hole transport region HTR may include at least one of a hole injection layer HIL, a hole transport layer HTL, a hole buffer layer or an electron blocking layer EBL. The thickness of the hole transport region HTR may be from about 100 Å to about 1,500 Å, for example.

The hole transport region HTR may have a single layer formed utilizing a single material, a single layer formed utilizing a plurality of different materials, or a multilayer structure including a plurality of layers formed utilizing a plurality of different materials.

For example, the hole transport region HTR may have a single layer structure of a hole injection layer HIL or a hole transport layer HTL, or may have a single layer structure formed utilizing a hole injection material and a hole transport material. In addition, the hole transport region HTR may have a single layer structure formed utilizing a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, laminated in the respective recited order from the first electrode EL1, without being limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include the above-described silicon-containing compound according to an embodiment of the inventive concept. For example, at least one of the hole injection layer HIL or the hole transport layer HTL may include the silicon-containing compound according to an embodiment of the inventive concept. Specifically, the hole transport layer HTL may include the silicon-containing compound according to an embodiment of the inventive concept.

The hole injection layer HIL may include a suitable (e.g., known) hole injection material. For example, the hole injection layer HIL may include a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino) triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HTL may include a suitable (e.g., known) hole transport material. For example, the hole transport layer HTL may include carbazole derivatives (such as N-phenyl carbazole, and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl) triphenylamine (TCTA)), N,N'-di(naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), α-NPD, 1,3-bis(N-carbazolyl)benzene (mCP), etc.

When the hole transport region HTR includes an electron blocking layer EBL, a material for the electron blocking layer EBL may be selected from the above-mentioned materials for the hole transport region HTR and the host materials to be discussed below. However, an embodiment of the inventive concept is not limited thereto. For example, when the hole transport region HTR includes an electron blocking layer EBL, mCP may be utilized as a material for the electron blocking layer EBL.

The thickness of the hole transport region HTR may be from about 100 Å to about 10,000 Å, for example, from about 100 Å to about 1,000 Å. When the hole transport region HTR includes both of the hole injection layer HIL and the hole transport layer HTL, the thickness of the hole injection layer HIL may be from about 90 Å to about 10,000 Å, for example, from about 90 Å to about 1,000 Å, and the thickness of the hole transport layer HTL may be from about 30 Å to about 1,000 Å. When the thicknesses of the hole transport region HTR, the hole injection layer HIL and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, and/or cyano group-containing compounds, without being limited thereto. For example, non-limiting examples of the p-dopant may include quinone derivatives (such as tetracyanoquinodimethane (TCNQ), and/or 2,3,5,6-tetrafluoro-tetracyanoquinodimethane (F4-TCNQ)), and/or metal oxides (such as tungsten oxide and/or molybdenum oxide), without being limited thereto.

As described above, the hole transport region HTR may further include at least one of a hole buffer layer or an electron blocking layer EBL in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be utilized as materials included in the hole buffer layer. The electron blocking layer EBL is a layer preventing or reducing electron injection from the electron transport region ETR into the hole transport region HTR.

The emission layer EML is disposed on the hole transport region HTR. The thickness of the emission layer EML may be, for example, from about 100 Å to about 1,000 Å, or from about 100 Å to about 300 Å. The emission layer EML may have a single layer formed utilizing a single material, a single layer formed utilizing a plurality of different materials, or a multilayer structure having a plurality of layers formed utilizing a plurality of different materials.

The emission layer EML may include the above-described silicon-containing compound according to an embodiment of the inventive concept. The emission layer EML may include one or more silicon-containing compounds according to an embodiment of the inventive concept. The emission layer EML may further include a suitable (e.g., known) material in addition to the silicon-containing compound according to an embodiment of the inventive concept.

The emission layer EML may include a host and a dopant, and the host may include the silicon-containing compound according to an embodiment of the inventive concept. The silicon-containing compound represented by Formula 1 may be included in the emission layer EML as a host. The silicon-containing compound represented by Formula 1 may be included in the emission layer EML as a host for thermally activated delayed fluorescence. The emission layer EML may emit blue light having a wavelength shorter than about 485 nm by including the silicon-containing compound according to an embodiment of the inventive concept. For example, the emission layer may emit blue light having a wavelength range of about 440 nm to about 480 nm, or about 465 nm to about 475 nm.

The emission layer EML may include a host and a dopant, and the dopant may include the silicon-containing compound according to an embodiment of the inventive concept.

The emission layer may further include any suitable host material commonly utilized without any specific limitation, in addition to the above-described silicon-containing compound according to an embodiment of the inventive concept. For example, the emission layer may include, as a suitable (e.g., known) host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TcTa), and/or 1,3,5-tris(N-phenylbenzimidazole-2-yl)benzene (TPBi). However, an embodiment of the inventive concept is not limited thereto. The emission layer may further include, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalen-2-yl)anthracene (ADN), 4,4',4"-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc.

For example, the emission layer EML may include, as a dopant material, at least one of N,N,N',N'-tetraphenylpyrene-1,6-diamine (TPD), 4,4'-bis(2-(9-ethyl-9H-carbazol-3-yl)vinyl)-1,1'-biphenyl (BCzVBi), 4,4'-bis(9-ethyl-3-carbazovinylene)-1,1'-biphenyl, 10-phenyl-1 OH,10'H-spiro [acridine-9,9'-anthracene]-10'-one (ACRSA), 3,4,5,6-tetra-9H-carbazol-9-yl-1,2-benzenedicarbonitrile (4CzPN), 2,4,5,6-tetra-9H-carbazol-9-yl-isophthalonitrile (4CzIPN), bis[4-(9,9-dimethyl-9,10-dihydroacridine)phenyl]sulfone (DMAC-DPS), and/or 2-phenoxazine-4,6-diphenyl-1,3,5-triazine (PSZ-TRZ). The emission layer EML may further include, as a suitable (e.g., known) dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

The emission layer EML may emit blue light. The emission layer EML may emit fluorescent light. The emission layer EML may emit thermally activated delayed fluorescence.

The electron transport region ETR is provided on the emission layer EML.

The electron transport region ETR may include at least one of a hole blocking layer HBL, an electron transport layer ETL or an electron injection layer EIL, without being limited thereto.

The electron transport region ETR may have a single layer formed utilizing a single material, a single layer formed utilizing a plurality of different materials, or a multilayer structure having a plurality of layers formed utilizing a plurality of different materials.

For example, the electron transport region ETR may have a single layer structure of an electron injection layer EIL or an electron transport layer ETL, or a single layer structure formed utilizing an electron injection material and an electron transport material. In addition, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated in the respective recited order from the emission layer EML, without being limited thereto. The thickness of the electron transport region ETR may be, for example, from about 300 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include the above-described silicon-containing compound according to an embodiment of the inventive concept. For example, at least one of the electron injection layer EIL or the electron transport layer ETL may include the silicon-containing compound according to an embodiment of the inventive concept. Specifically, the electron transport layer ETL may include the silicon-containing compound according to an embodiment of the inventive concept.

When the electron transport region ETR includes the electron transport layer ETL, the electron transport layer ETL may include anthracene derivatives. However, an embodiment of the inventive concept is not limited thereto. The electron transport layer ETL may include a suitable (e.g., known) electron transport material. For example, the electron transport layer ETL may include tris(8-hydroxyquinolinato)aluminum (Alq$_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), berylliumbis (benzoquinolin-10-olate) (Bebq$_2$), 9,10-di(naphthalen-2-yl)anthracene (ADN), and a mixture thereof. The thickness of the electron transport layer ETL may be from about 100 Å to about 1,000 Å, for example, from about 150 Å to about 500 Å. If the thickness of the electron transport layer ETL satisfies the above-described ranges, satisfactory electron transport properties may be obtained without substantial increase of a driving voltage.

When the electron transport region ETR includes the electron injection layer EIL, the electron transport region ETR may include a suitable (e.g., known) electron injection material. For example, the electron injection layer EIL may use LiF, lithium quinolate (LIQ), Li$_2$O, BaO, NaCl, CsF, a metal in lanthanoides (such as Yb), and/or a metal halide (such as RbCl and/or Rbl). However, an embodiment of the inventive concept is not limited thereto. The electron injection layer EIL may also be formed utilizing a mixture material of an electron transport material and an insulating organo metal salt. The organo metal salt may be a material having an energy band gap of about 4 eV or more. The organo metal salt may include, for example, a metal acetate, a metal benzoate, a metal acetoacetate, a metal acetylacetonate, and/or a metal stearate. The thickness of the electron injection layer EIL may be from about 1 Å to about 100 Å, for example, from about 3 Å to about 10 Å. When the thickness of the electron injection layer EIL satisfies the above described ranges, satisfactory electron injection properties may be obtained without inducing the substantial increase of a driving voltage.

The electron transport region ETR may include a hole blocking layer HBL, as described above. The hole blocking layer HBL may include, for example, at least one of 2,9-dimethyl-4,7-diphenyl-1,10-phenanthroline (BCP) or 4,7-diphenyl-1,10-phenanthroline (Bphen), without being limited thereto.

The second electrode EL2 is disposed on the electron transport region ETR.

The second electrode EL2 may be a common electrode or a cathode. The second electrode EL2 may be a transmissive electrode, a transflective electrode or a reflective electrode. When the second electrode EL2 is the transmissive electrode, the second electrode EL2 may be formed utilizing transparent metal oxides, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed utilizing the above-described materials and a transparent conductive layer formed utilizing ITO, IZO, ZnO, ITZO, etc.

Even not shown, the second electrode EL2 may be connected with an auxiliary electrode. When the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

The organic electroluminescence device 10 according to an embodiment of the inventive concept includes the above-described silicon-containing compound according to an embodiment of the inventive concept as a material for at least one organic layers of the hole transport region, the emission layer, or the electron transport region, thereby securing excellent emission efficiency.

The organic electroluminescence device 10 according to an embodiment of the inventive concept includes the above-described silicon-containing compound according to an embodiment of the inventive concept in the emission layer, in particular, as a host material for thermally activated delayed fluorescence, thereby securing excellent emission efficiency.

An embodiment of the inventive concept provides a silicon-containing compound represented by the above Formula 1. The silicon-containing compound may be utilized as a material for an organic electroluminescence device.

Particular explanation on the silicon-containing compound according to an embodiment of the inventive concept may refer to the above description and will not be repeated. For example, the silicon-containing compound according to an embodiment of the inventive concept may be any one selected from the group consisting of compounds represented in the above Compound Group 1.

The silicon-containing compound according to an embodiment of the inventive concept may have a high triplet energy level, and therefore, may be utilized as a host material for thermally activated delayed fluorescence, or a material for a hole transport layer HTL or an electron transport layer ETL. The silicon-containing compound according to an embodiment of the inventive concept may be utilized as a material for an organic electroluminescence device, thereby contributing to increased emission efficiency.

Hereinafter, the inventive concept will be explained in more detail with reference to specific embodiments and comparative embodiments. The following embodiments are illustrated only for assisting the understanding of the inventive concept, and the scope of the inventive concept is not limited thereto.

Examples

1. Synthesis of Silicon-Containing Compound

The silicon-containing compound according to an embodiment of the inventive concept may be synthesized, for example, as follows. However, the synthetic method of the silicon-containing compound according to an embodiment of the inventive concept is not limited thereto.

(1) Synthesis of Compound 5

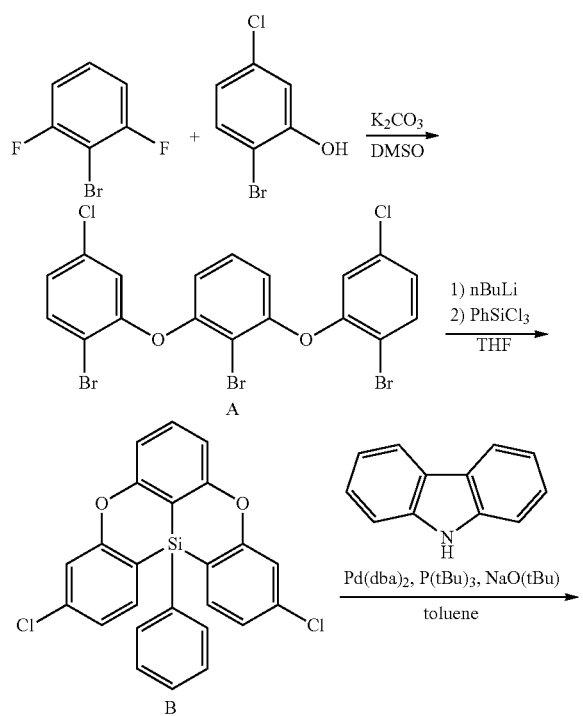

(Synthesis of Intermediate A)

Under an argon (Ar) atmosphere, 2-bromo-1,3-difluorobenzene (5.00 g), 2-bromo-5-chlorophenol (10.75 g) and potassium carbonate ($K_2CO_3$) (17.90 g) were dissolved in dehydrated DMSO (150 mL) in a 500 mL three-neck flask, and the resultant was heated and stirred at about 150° C. for about 8 hours. After cooling at room temperature, the reaction solution was mixed with water (1,000 mL) and stirred.

The resulting precipitate was recovered by suction filtration, and then dissolved in $CH_2Cl_2$ (300 mL). The resultant was dried over $MgSO_4$, and solvents were evaporated under reduced pressure. The crude product thus obtained was purified by silica gel column chromatography to obtain 11.48 g (yield 78%) of Intermediate A. The molecular weight of Intermediate A measured by FAB-MS was 576.

(Synthesis of Intermediate B)

Under an argon (Ar) atmosphere, Intermediate A (10.00 g) was dissolved in dehydrated THF (100 mL) in a 300 mL three-neck flask, and n-BuLi (1.6 M in hexane) (33.0 mL) was added thereto dropwise at about −78° C. The mixture was stirred at about −78° C. for about 1 hour, and then phenyltrichlorosilane (4.16 mL) was added thereto dropwise. The resultant was slowly cooled and stirred at room temperature for about 16 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 4.58 g (yield 60%) of Intermediate B. The molecular weight of Intermediate B measured by FAB-MS was 433.

(Synthesis of Compound 5)

Under an argon (Ar) atmosphere, Intermediate B (4.00 g), carbazole (3.08 g), bis(dibenzylideneacetone)palladium(0) ($Pd(dba)_2$) (0.53 g), tri-tert-butylphosphine ($P(tBu)_3$) (0.74 g) and sodium tert-butoxide (NaO(tBu)) (1.80 g) were dissolved in dehydrated toluene (50 mL) in a 200 mL three-neck flask, and the resultant was heated to reflux for about 12 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 3.98 g (yield 62%) of Compound 5. The molecular weight of Compound 5 measured by FAB-MS was 694.

(2) Synthesis of Compound 17

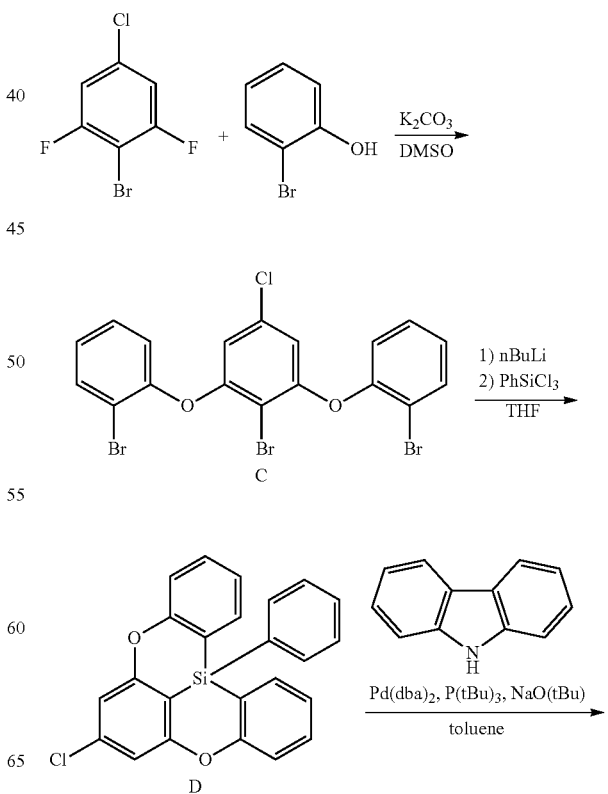

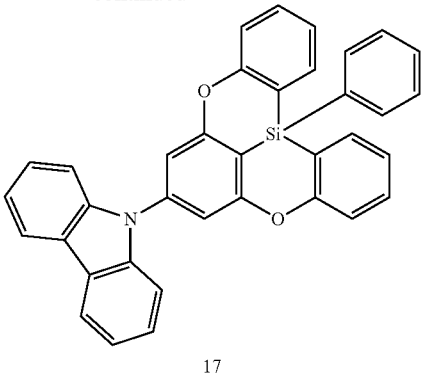

17

(Synthesis of Intermediate C)

Under an argon (Ar) atmosphere, 2-bromo-5-chloro-1,3-difluorobenzene (5.00 g), 2-bromophenol (7.61 g) and $K_2CO_3$ (15.19 g) were dissolved in dehydrated DMSO (150 mL) in a 500 mL three-neck flask, and the resultant was stirred at about 150° C. for about 8 hours. After cooling at room temperature, the reaction solution was mixed with water (1,000 mL) and stirred. The resulting precipitate was recovered by suction filtration, and then dissolved in $CH_2Cl_2$ (300 mL). The resultant was dried over $MgSO_4$, and solvents were evaporated under reduced pressure. The crude product thus obtained was purified by silica gel column chromatography to obtain 9.50 g (yield 81%) of Intermediate C. The molecular weight of Intermediate C measured by FAB-MS was 533.

(Synthesis of Intermediate D)

Under an argon (Ar) atmosphere, Intermediate C (9.00 g) was dissolved in dehydrated THF (100 mL) in a 300 mL three-neck flask, and n-BuLi (1.6 M in hexane) (31.6 mL) was added thereto dropwise at about −78° C. The mixture was stirred at about −78° C. for about 1 hour, and then phenyltrichlorosilane (3.98 mL) was added thereto dropwise. The resultant was slowly cooled and stirred at room temperature for about 16 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 4.37 g (yield 65%) of Intermediate D. The molecular weight of Intermediate D measured by FAB-MS was 398.

(Synthesis of Compound 17)

Under an argon (Ar) atmosphere, Intermediate D (4.00 g), carbazole (1.67 g), $Pd(dba)_2$ (0.28 g), $P(tBu)_3$ (0.40 g) and NaO(tBu) (1.00 g) were dissolved in dehydrated toluene (50 mL) in a 200 mL three-neck flask, and the resultant was heated to reflux for about 12 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 3.45 g (yield 65%) of Compound 17. The molecular weight of Compound 17 measured by FAB-MS was 529.

(Reaction scheme 3)

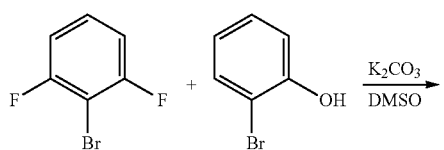

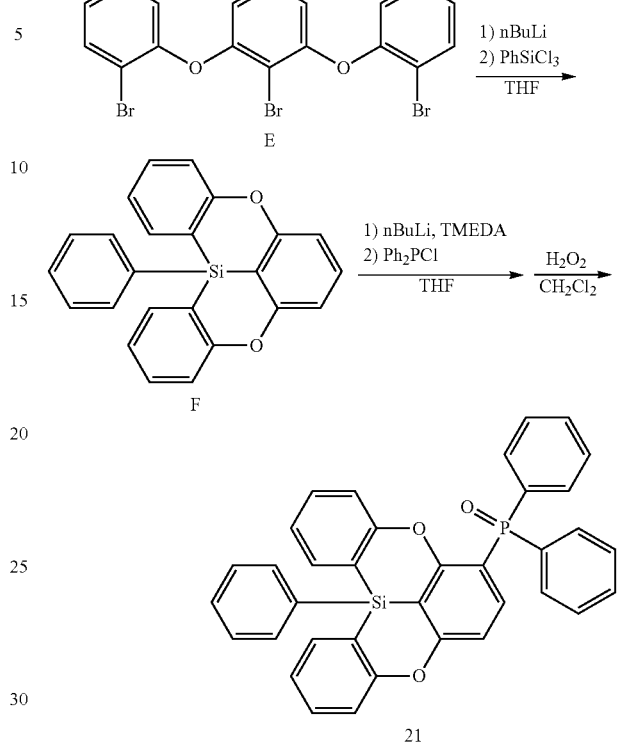

(Synthesis of Intermediate E)

Under an argon (Ar) atmosphere, 2-bromo-1,3-difluorobenzene (5.00 g), 2-bromophenol (8.96 g) and $K_2CO_3$ (17.90 g) were dissolved in dehydrated DMSO (150 mL) in a 500 mL three-neck flask, and the resultant was stirred at about 150° C. for about 8 hours. After cooling at room temperature, the reaction solution was mixed with water (1,000 mL) and stirred. The resulting precipitate was recovered by suction filtration, and then dissolved in $CH_2Cl_2$ (300 mL). The resultant was dried over $MgSO_4$, and solvents were evaporated under reduced pressure. The crude product thus obtained was purified by silica gel column chromatography to obtain 9.57 g (yield 74%) of Intermediate E. The molecular weight of Intermediate E measured by FAB-MS was 498.

(Synthesis of Intermediate F)

Under an argon (Ar) atmosphere, Intermediate E (9.00 g) was dissolved in dehydrated THF (100 mL) in a 300 mL three-neck flask, and n-BuLi (1.6 M in hexane) (33.8 mL) was added thereto dropwise at about −78° C. The mixture was stirred at about −78° C. for about 1 hour, and then phenyltrichlorosilane (4.26 mL) was added thereto dropwise. The resultant was slowly cooled and stirred at room temperature for about 16 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 4.40 g (yield 67%) of Intermediate F. The molecular weight of Intermediate F measured by FAB-MS was 364.

(Synthesis of Compound 21)

Under an argon (Ar) atmosphere, Intermediate F (4.00 g) and N,N,N',N'-tetramethylethylenediamine (TMEDA) (1.7 mL) were dissolved in dehydrated THF (100 mL) in a 300 mL three-neck flask, and n-BuLi (1.6 M in hexane) (6.86 mL) was added thereto dropwise at about 0° C. The mixture was stirred at room temperature for about 16 hour, and then chlorodiphenylphosphine (2.0 mL) was added thereto dropwise at about 0° C. The resultant was stirred at room temperature for about 16 hours. After adding water to the reactant, the mixture was extracted with CH$_2$Cl$_2$. An organic layer was dried over MgSO$_4$, and solvents were evaporated under reduced pressure. The crude product thus obtained was dissolved in CH$_2$Cl$_2$ (140 mL), and hydrogen peroxide (30%, 3 mL) was added thereto dropwise at 0° C. The mixture was stirred at room temperature for about 3 hours. After adding water to the reactant, the mixture was extracted with CH$_2$Cl$_2$. An organic layer was dried over MgSO$_4$, and solvents were evaporated under reduced pressure. The crude product thus obtained was purified by recrystallization with toluene to obtain 3.41 g (yield 55%) of Compound 21. The molecular weight of Compound 21 measured by FAB-MS was 564.

(4) Synthesis of Compound 27

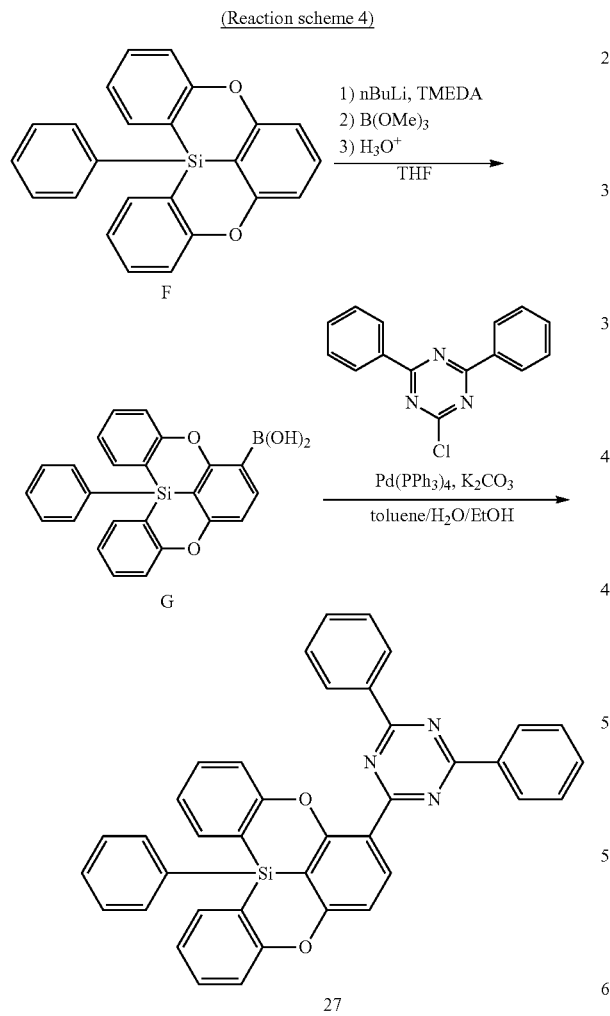

(Synthesis of Intermediate G)

Under an argon (Ar) atmosphere, Intermediate F (3.00 g) and TMEDA (1.3 mL) were dissolved in dehydrated THF (50 mL) in a 300 mL three-neck flask, and n-BuLi (1.6 M in hexane) (5.14 mL) was added thereto dropwise at about 0° C. The mixture was stirred at room temperature for about 16 hour, and then trimethyl borate (0.9 mL) was added thereto dropwise at about 0° C. The resultant was stirred at room temperature for about 16 hours. After adding aqueous NH$_4$Cl solution (2 M) (50 mL) to the reactant, the mixture was stirred at room temperature for about 1 hour and extracted with CH$_2$O$_{12}$. An organic layer was dried over MgSO$_4$, and solvents were evaporated under reduced pressure. The crude product thus obtained was purified by recrystallization with CH$_2$Cl$_2$ and hexane to obtain 2.05 g (yield 61%) of Intermediate G. The molecular weight of Intermediate G measured by FAB-MS was 408.

(Synthesis of Compound 27)

Under an argon (Ar) atmosphere, Intermediate G (2.00 g), 2-chloro-4,6-diphenyl-1,3,5-triazine (1.31 g), tetrakis(triphenylphosphine)palladium(0) (Pd(PPh$_3$)$_4$) (0.28 g) and K$_2$CO$_3$ (1.35 g) were dissolved in a deaerated mixture solution of toluene/ethanol/water (10:1:2) (50 mL) in a 200 mL three-neck flask, and the mixture was stirred at about 80° C. for about 6 hours. After adding water to the reactant, the mixture was extracted with CH$_2$Cl$_2$. An organic layer was dried over MgSO$_4$, and solvents were evaporated under reduced pressure. The crude product thus obtained was purified by silica gel column chromatography to obtain 2.31 g (yield 79%) of Compound 27. The molecular weight of Compound 27 measured by FAB-MS was 595.

(5) Synthesis of Compound 37

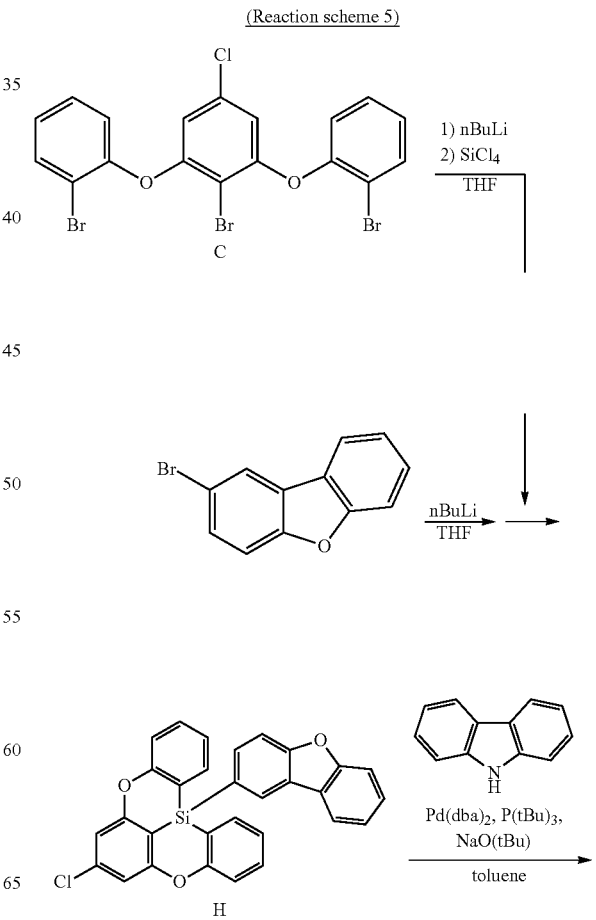

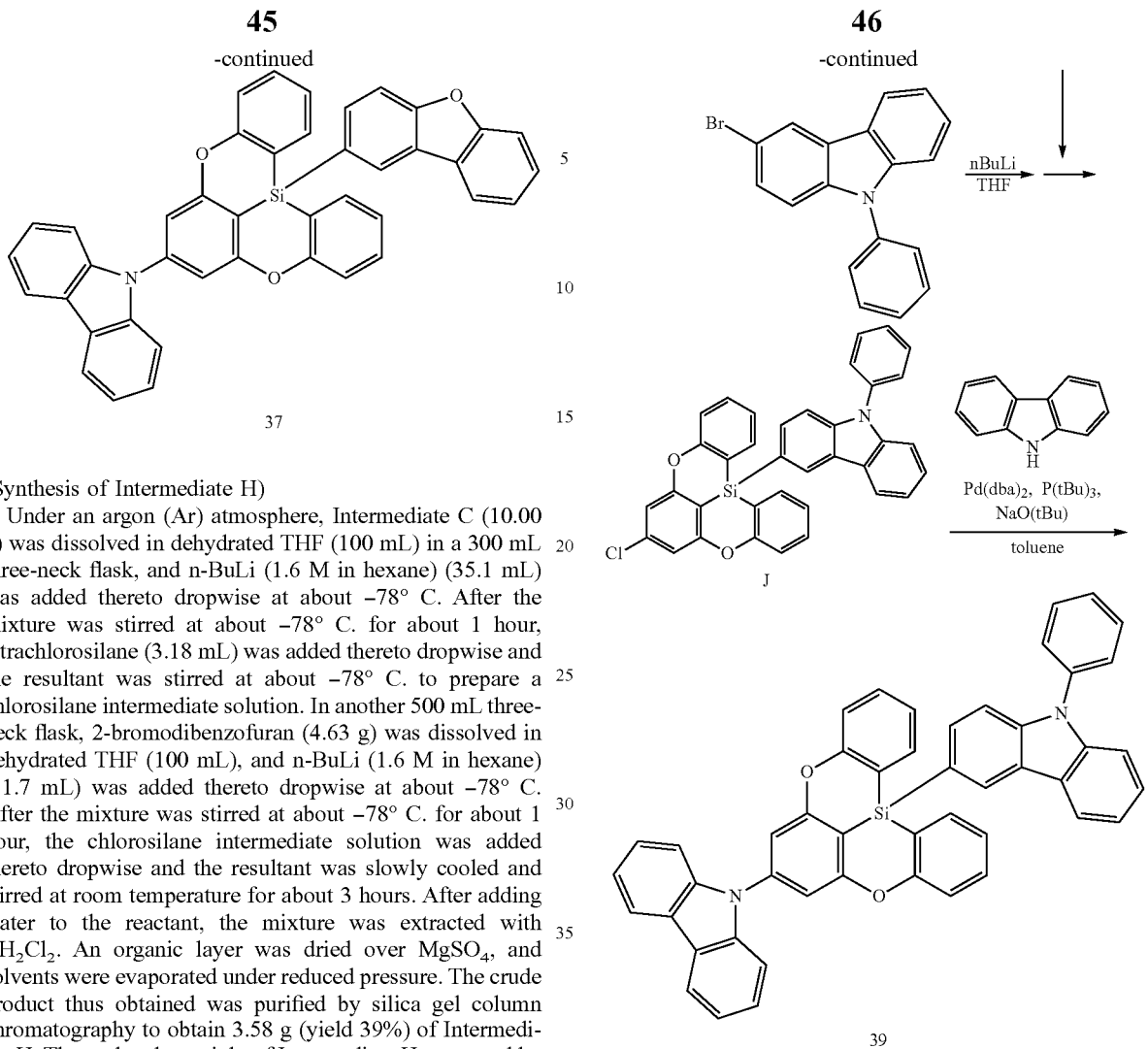

(Synthesis of Intermediate H)

Under an argon (Ar) atmosphere, Intermediate C (10.00 g) was dissolved in dehydrated THF (100 mL) in a 300 mL three-neck flask, and n-BuLi (1.6 M in hexane) (35.1 mL) was added thereto dropwise at about −78° C. After the mixture was stirred at about −78° C. for about 1 hour, tetrachlorosilane (3.18 mL) was added thereto dropwise and the resultant was stirred at about −78° C. to prepare a chlorosilane intermediate solution. In another 500 mL three-neck flask, 2-bromodibenzofuran (4.63 g) was dissolved in dehydrated THF (100 mL), and n-BuLi (1.6 M in hexane) (11.7 mL) was added thereto dropwise at about −78° C. After the mixture was stirred at about −78° C. for about 1 hour, the chlorosilane intermediate solution was added thereto dropwise and the resultant was slowly cooled and stirred at room temperature for about 3 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 3.58 g (yield 39%) of Intermediate H. The molecular weight of Intermediate H measured by FAB-MS was 488.

(Synthesis of Compound 37)

Under an argon (Ar) atmosphere, Intermediate H (3.00 g), carbazole (1.03 g), $Pd(dba)_2$ (0.18 g), $P(tBu)_3$ (0.25 g) and NaO(tBu) (0.59 g) were dissolved in dehydrated toluene (50 mL) in a 200 mL three-neck flask, and the mixture was heated to reflux for about 6 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.66 g (yield 70%) of Compound 37. The molecular weight of Compound 37 measured by FAB-MS was 619.

(6) Synthesis of Compound 39

(Reaction scheme 6)

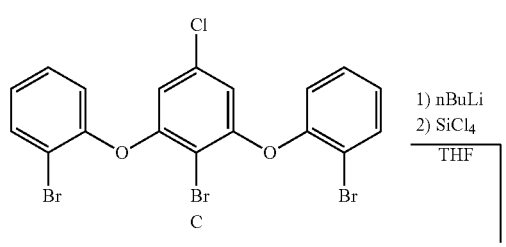

(Synthesis of Intermediate J)

Under an argon (Ar) atmosphere, Intermediate C (10.00 g) was dissolved in dehydrated THF (100 mL) in a 300 mL three-neck flask, and n-BuLi (1.6 M in hexane) (35.1 mL) was added thereto dropwise at about −78° C. After the mixture was stirred at about −78° C. for about 1 hour, tetrachlorosilane (3.18 mL) was added thereto dropwise and the resultant was stirred at about −78° C. to prepare a chlorosilane intermediate solution. In another 500 mL three-neck flask, 3-bromo-9-phenylcarbazole (6.04 g) was dissolved in dehydrated THF (100 mL), and n-BuLi (1.6 M in hexane) (11.7 mL) was added thereto dropwise at about −78° C. After the mixture was stirred at about −78° C. for about 1 hour, the chlorosilane intermediate solution was added thereto dropwise and the resultant was slowly cooled and stirred at room temperature for about 3 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 3.28 g (yield 31%) of Intermediate J. The molecular weight of Intermediate J measured by FAB-MS was 564.

(Synthesis of Compound 39)

Under an argon (Ar) atmosphere, Intermediate J (3.00 g), carbazole (0.89 g), $Pd(dba)_2$ (0.15 g), $P(tBu)_3$ (0.21 g) and NaO(tBu) (0.51 g) were dissolved in dehydrated toluene (50 mL) in a 200 mL three-neck flask, and the mixture was heated to reflux for about 6 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.66 g (yield 72%) of Compound 39. The molecular weight of Compound 39 measured by FAB-MS was 694.

(7) Synthesis of Compound 45

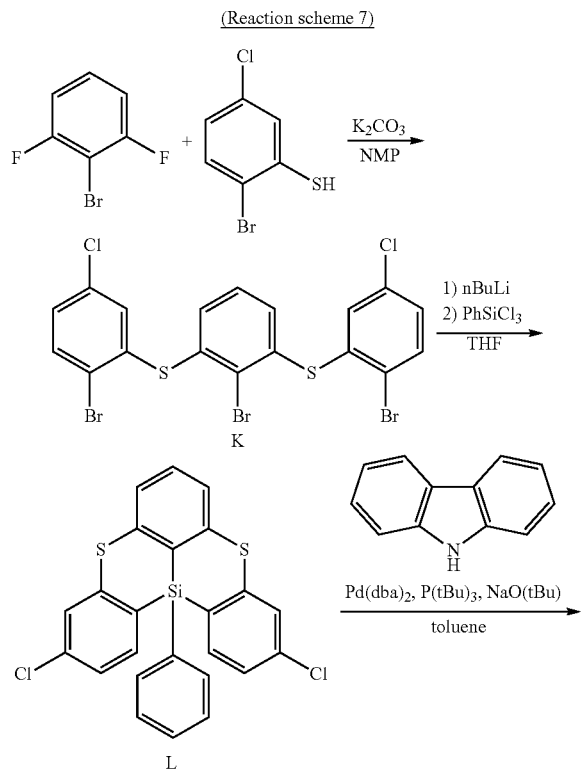

(Synthesis of Intermediate K)

Under an argon (Ar) atmosphere, 2-bromo-1,3-difluorobenzene (10.00 g), 2-bromo-5-chlorobenzenethiol (23.2 g) and $K_2CO_3$ (35.8 g) were dissolved in dehydrated NMP (100 mL) in a 500 mL three-neck flask, and the resultant was stirred at about 180° C. for about 14 hours. After cooling at room temperature, the reaction solution was mixed with water (1,000 mL) and stirred. The resulting precipitate was recovered by suction filtration, and then dissolved in $CH_2Cl_2$ (300 mL). The resultant was dried over $MgSO_4$, and solvents were evaporated under reduced pressure. The crude product thus obtained was purified by silica gel column chromatography to obtain 6.22 g (yield 20%) of Intermediate K. The molecular weight of Intermediate K measured by FAB-MS was 600.

(Synthesis of Intermediate L)

Under an argon (Ar) atmosphere, Intermediate K (6.00 g) was dissolved in dehydrated THF (100 mL) in a 300 mL three-neck flask, and n-BuLi (1.6 M in hexane) (18.8 mL) was added thereto dropwise at about −78° C. The mixture was stirred at about −78° C. for about 1 hour, and then phenyltrichlorosilane (2.36 mL) was added thereto dropwise. The resultant was slowly cooled and stirred at room temperature for about 16 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.79 g (yield 60%) of Intermediate L. The molecular weight of Intermediate L measured by FAB-MS was 465.

(Synthesis of Compound 45)

Under an argon (Ar) atmosphere, Intermediate L (2.50 g), carbazole (1.80 g), $Pd(dba)_2$ (0.15 g), $P(tBu)_3$ (0.22 g) and NaO(tBu) (0.52 g) were dissolved in dehydrated toluene (50 mL) in a 200 mL three-neck flask, and the resultant was heated to reflux for about 12 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.73 g (yield 70%) of Compound 45. The molecular weight of Compound 45 measured by FAB-MS was 726.

(8) Synthesis of Compound 57

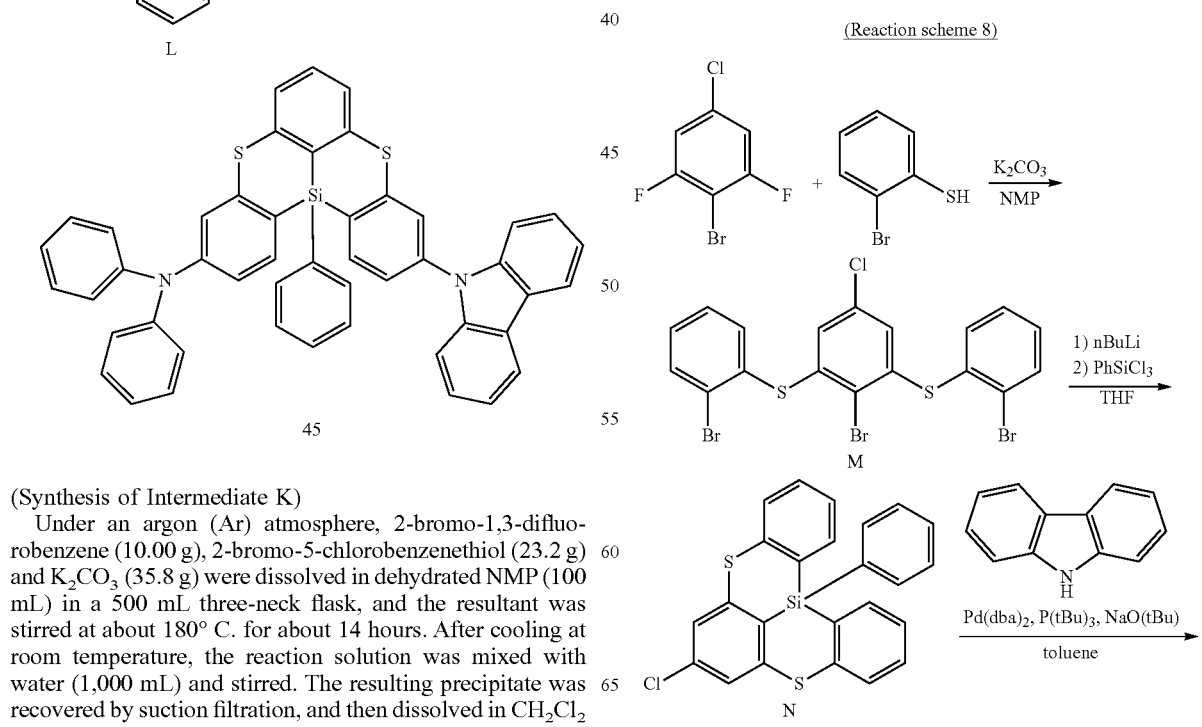

-continued

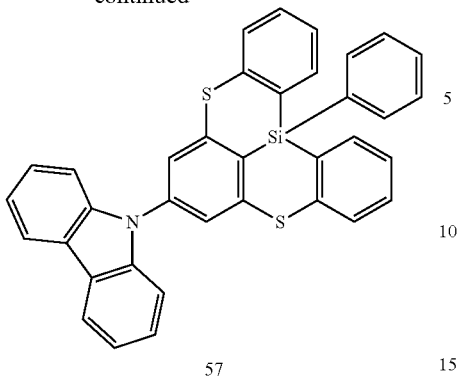

57

(Synthesis of Intermediate M)

Under an argon (Ar) atmosphere, 2-bromo-5-chloro-1,3-difluorobenzene (10.00 g), 2-bromobenzenethiol (16.6 g) and $K_2CO_3$ (30.4 g) were dissolved in dehydrated NMP (100 mL) in a 500 mL three-neck flask, and the resultant was stirred at about 180° C. for about 12 hours. After cooling at room temperature, the reaction solution was mixed with water (1,000 mL) and stirred. The resulting precipitate was recovered by suction filtration, and then dissolved in $CH_2Cl_2$ (300 mL). The resultant was dried over $MgSO_4$, and solvents were evaporated under reduced pressure. The crude product thus obtained was purified by silica gel column chromatography to obtain 5.47 g (yield 22%) of Intermediate M. The molecular weight of Intermediate M measured by FAB-MS was 565.

(Synthesis of Intermediate N)

Under an argon (Ar) atmosphere, Intermediate M (5.00 g) was dissolved in dehydrated THF (100 mL) in a 300 mL three-neck flask, and n-BuLi (1.6 M in hexane) (16.6 mL) was added thereto dropwise at about −78° C. The mixture was stirred at about −78° C. for about 1 hour, and then phenyltrichlorosilane (2.09 mL) was added thereto dropwise. The resultant was slowly cooled and stirred at room temperature for about 16 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.32 g (yield 61%) of Intermediate N. The molecular weight of Intermediate N measured by FAB-MS was 431.

(Synthesis of Compound 57)

Under an argon (Ar) atmosphere, Intermediate N (2.00 g), carbazole (1.56 g), $Pd(dba)_2$ (0.13 g), $P(tBu)_3$ (0.18 g) and NaO(tBu) (0.45 g) were dissolved in dehydrated toluene (50 mL) in a 200 mL three-neck flask, and the resultant was heated to reflux for about 12 hours. After adding water to the reactant, the mixture was extracted with $CH_2Cl_2$. An organic layer was dried over $MgSO_4$, and solvents were evaporated under reduced pressure. The crude product thus obtained was purified by silica gel column chromatography to obtain 2.09 g (yield 80%) of Compound 57. The molecular weight of Compound 57 measured by FAB-MS was 561.

2. Manufacture of Organic Electroluminescence Device Including Silicon-Containing Compound and Evaluation Thereof 2-1. Example A Organic electroluminescence devices of Examples 1 to 8 and Comparative Examples 1 to 8 were manufactured by utilizing the above Compounds 5, 17, 21, 27, 37, 39, 45 and 57, DPEPO, and Comparative Compounds X-1 to X-7 as a host material in a respective emission layer.

Example Compounds

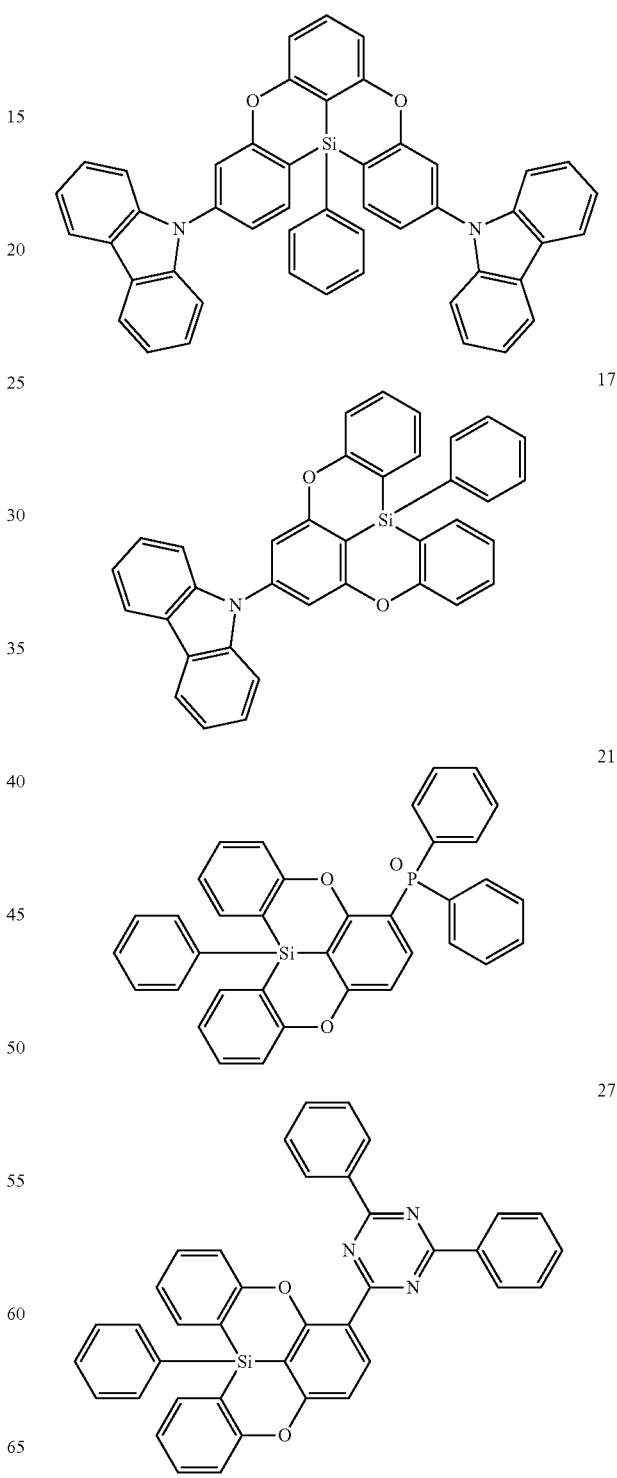

-continued
37
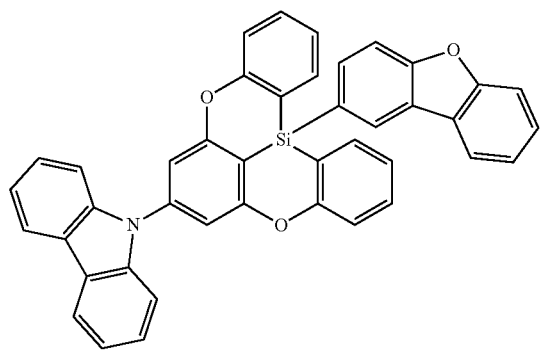
39
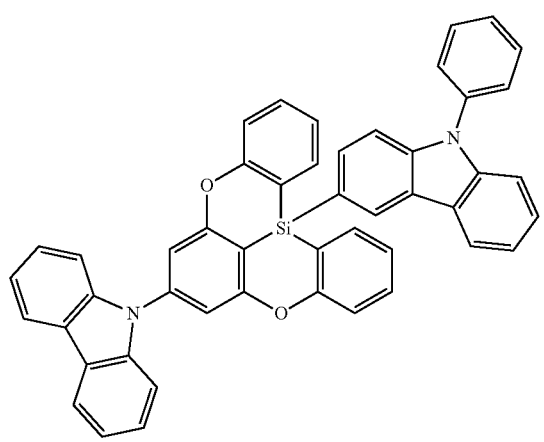
45
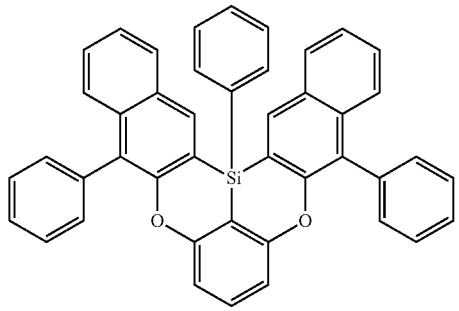
57
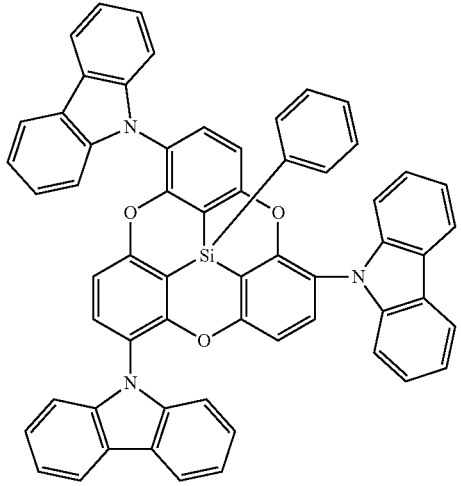
Comparative Compounds
X-1
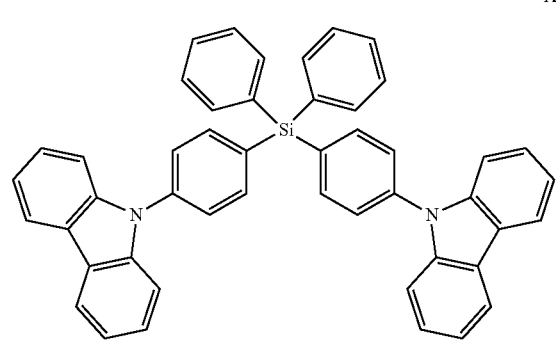
X-2
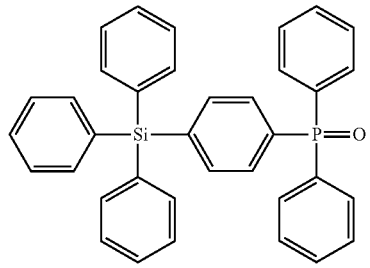
X-3
X-4

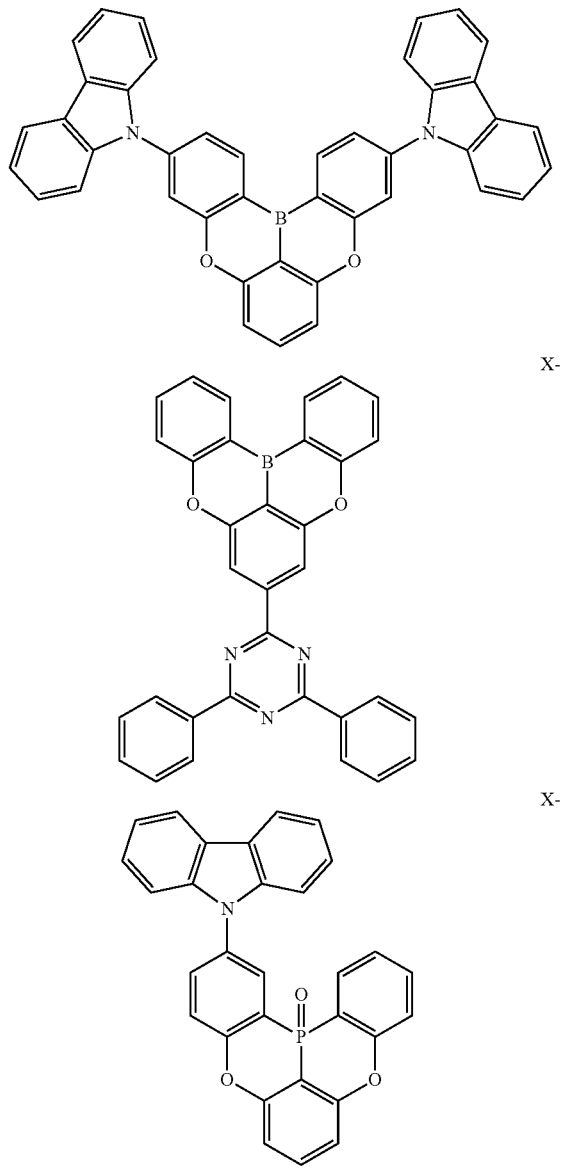

(Manufacture of Organic Electroluminescence Devices)

The organic electroluminescence devices according to Examples 1 to 8 and Comparative Examples 1 to 8 were manufactured by forming a first electrode EL1 utilizing ITO to a thickness of about 150 nm, a hole injection layer HIL utilizing HAT-CN to a thickness of about 10 nm, a hole transport layer HTL utilizing α-NPD to a thickness of about 80 nm, an electron blocking layer EBL utilizing mCP to a thickness of about 5 nm, an emission layer EML utilizing the respective example compounds or the comparative compounds doped (e.g., mixed) with 18% ACRSA to a thickness of about 20 nm, a hole blocking layer HBL utilizing DPEPO to a thickness of about 10 nm, an electron transport layer ETL utilizing TPBi to a thickness of about 30 nm, an electron injection layer EIL utilizing LiF to a thickness of about 0.5 nm, and a second electrode EL2 utilizing Al to a thickness of about 100 nm. Each layer was formed by a vacuum deposition method.

(Property Evaluation of Organic Electroluminescence Devices)

The light emitting property of organic electroluminescence devices was evaluated by utilizing a brightness light distribution characteristics measurement system C9920-11 (Hamamatsu Photonics, Japan). The values of maximum light emitting efficiency and half-life were measured to evaluate the properties of the organic electroluminescence devices manufactured in the Examples and Comparative Examples. The maximum light emitting efficiency was a value measured at a current density of 50 mA/cm². The initial current density for the half-life measurement was 50 mA/cm². The light emitting devices utilized in the Examples and Comparative Examples are organic electroluminescence devices emitting blue light. The property evaluation results in Table 1 were shown utilizing the maximum light emitting efficiency and brightness half-life of the organic electroluminescence device according to Comparative Example 1 (utilizing DPEPO as a host material) as the reference value (i.e., 100%).

TABLE 1

| Examples | Host material | Maximum light-emitting efficiency | Brightness half-life |
|---|---|---|---|
| Example 1 | Example Compound 5 | 180% | 250% |
| Example 2 | Example Compound 17 | 160% | 240% |
| Example 3 | Example Compound 21 | 190% | 200% |
| Example 4 | Example Compound 27 | 160% | 230% |
| Example 5 | Example Compound 37 | 150% | 220% |
| Example 6 | Example Compound 39 | 150% | 230% |
| Example 7 | Example Compound 45 | 160% | 230% |
| Example 8 | Example Compound 57 | 140% | 220% |
| Comparative Example 1 | DPEPO | 100% | 100% |
| Comparative Example 2 | Comparative Compound X-1 | 120% | 100% |
| Comparative Example 3 | Comparative Compound X-2 | 120% | 110% |
| Comparative Example 4 | Comparative Compound X-3 | 80% | 120% |
| Comparative Example 5 | Comparative Compound X-4 | 130% | 150% |
| Comparative Example 6 | Comparative Compound X-5 | 110% | 80% |
| Comparative Example 7 | Comparative Compound X-6 | 100% | 80% |
| Comparative Example 8 | Comparative Compound X-7 | 100% | 90% |

Referring to the results in Table 1, it may be found that the organic electroluminescence devices utilizing the silicon-containing compound according to an embodiment of the inventive concept as a host material may attain high efficiency and long device life. Specifically, it may be found that the organic electroluminescence devices of Examples 1 to 8 each have enhanced efficiency and extended life when compared with those of Comparative Examples 1 to 8. The organic electroluminescence devices of Examples 1 to 8 each have a maximum light emitting efficiency of 140% to 180% and a brightness half-life of 220% to 250%, attaining high efficiency and long device life. Meanwhile, the organic electroluminescence devices of Comparative Examples 1 to 8 each have a maximum light emitting efficiency of 80% to 130% and a brightness half-life of 80% to 150%, which shows lower efficiency and shorter device life when compared with those of the Examples.

Especially, the organic electroluminescence devices of Examples 1 and 7 attained high efficiency and long device life when compared with that of Comparative Example 1. Without being bond by any particular theory, it is envisioned that the phenyl groups bound to the silicon atom are cross-linked with the oxygen atom or sulfur atom, thereby enhancing the stability of the emission layer and the electron transport ability of the device.

Furthermore, the organic electroluminescence device of Example 3 attained high efficiency and long device life when compared with that of Comparative Example 3. Without being bond by any particular theory, it is envisioned that the phenyl groups bound to silicon are cross-linked with oxygen atom, thereby enhancing the stability of emission layer and the electron transport ability of the device.

The Comparative Compound X-3 utilized in Comparative Example 4 has no substituent having electron transport ability linked with the phenyl groups bound to the silicon atom, contrary to the Example Compounds. Therefore, the organic electroluminescence device of Comparative Example 4 had decreased emission efficiency and did not attain long device life when compared with those of the Examples.

The Comparative Compound X-4 utilized in Comparative Example 5 has three oxygen atoms cross-linked with the phenyl groups bound to the silicon atom, and is likely to have a complex backbone compared with the Example Compounds. Due to such a structural feature, the organic electroluminescence device of Comparative Example 5 had decreased stability of the emission layer, resulting in low efficiency and short device life when compared with those of the Examples.

The Comparative Compounds X-5 and X-6 utilized in Comparative Examples 6 and 7, respectively, each have a core structure substituted with a boron atom, which is different from the silicon atom in the Example Compounds, and the Comparative Compounds X-7 utilized in Comparative Examples 8 has a core structure substituted with phosphine oxide, which is different from the silicon atom in the Example Compounds. Accordingly, the organic electroluminescence devices of Comparative Examples 6 to 8 showed lower efficiency and shorter device life when compared with those of the Examples.

The organic electroluminescence devices according to an embodiment of the inventive concept use one or more of the thermally activated delayed fluorescence compounds emitting blue light as a dopant material in the emission layer, and one or more of the Example Compounds as a host material in the emission layer, thereby attaining emission efficiency equal to or higher than those utilizing DPEPO, a typical host material for thermally activated delayed fluorescence emitting blue light. This may be attributed to the silicon-containing compound according to an embodiment of the inventive concept having a high triplet energy level, which may be applied as a host material for thermally activated delayed fluorescence emitting blue light of an organic electroluminescence device. 2-2. Example B Organic electroluminescence devices of Examples 9 to 12 and Comparative Examples 9 to 11 were manufactured by utilizing Example Compounds 5, 17, 37 and 39, mCP, and Comparative Compounds X-1 and X-4 as a material for a respective hole transport layer.

Example Compounds

5

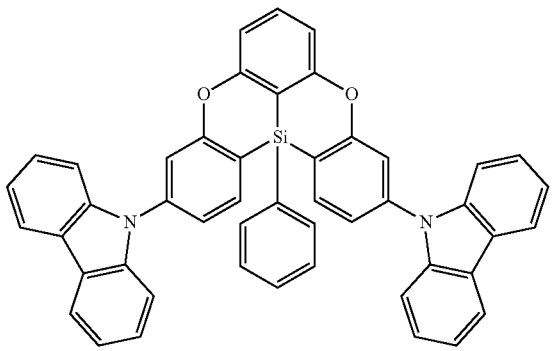

17

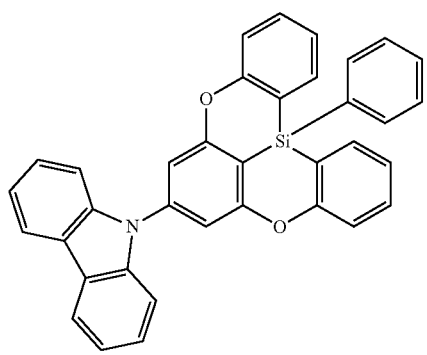

37

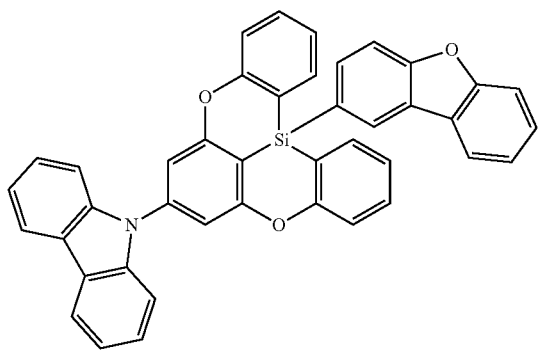

39

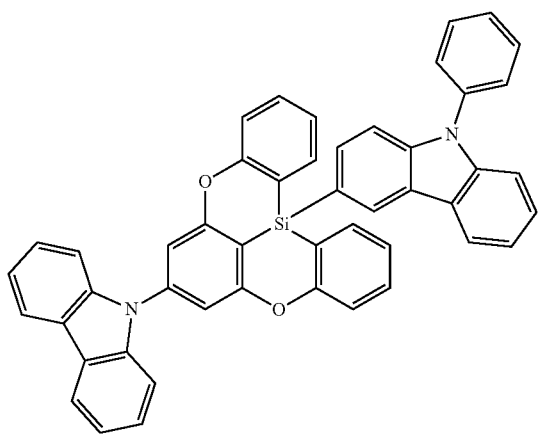

Comparative Compounds

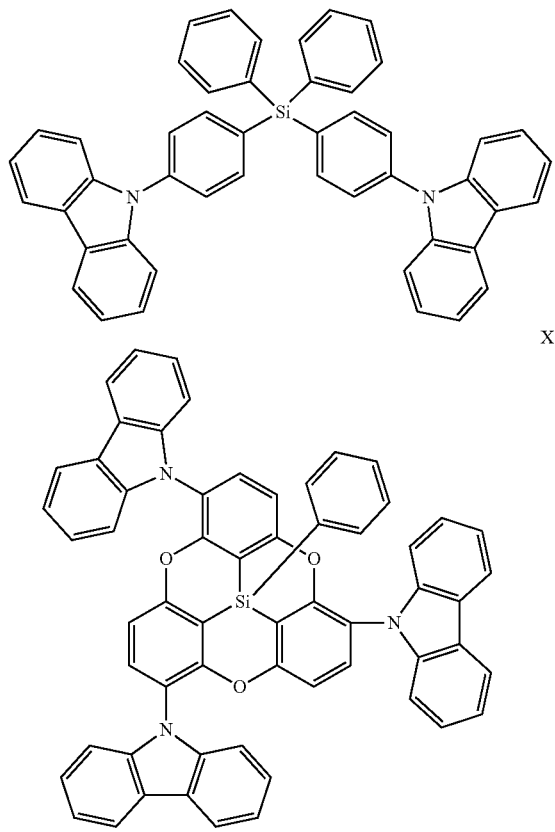

(Manufacture of Organic Electroluminescence Devices)

The organic electroluminescence devices according to Examples 9 to 12 and Comparative Examples 9 to 11 were manufactured by forming a first electrode EL1 utilizing ITO to a thickness of about 150 nm, a hole injection layer HIL utilizing HAT-CN to a thickness of about 10 nm, a hole transport layer HTL utilizing the respective example compounds or the comparative compounds to a thickness of about 80 nm, an electron blocking layer EBL utilizing mCP to a thickness of about 5 nm, an emission layer EML utilizing DPEPO doped with 18% ACRSA to a thickness of about 20 nm, a hole blocking layer HBL utilizing DPEPO to a thickness of about 10 nm, an electron transport layer ETL utilizing TPBi to a thickness of about 30 nm, an electron injection layer EIL utilizing LiF to a thickness of about 0.5 nm, and a second electrode EL2 utilizing Al to a thickness of about 100 nm. Each layer was formed by a vacuum deposition method.

(Property Evaluation of Organic Electroluminescence Devices)

The light emitting property of organic electroluminescence devices was evaluated by utilizing a brightness light distribution characteristics measurement system C9920-11 (Hamamatsu Photonics, Japan). The values of maximum light emitting efficiency and half-life were measured to evaluate the properties of the organic electroluminescence devices manufactured in the Examples and Comparative Examples. The maximum light emitting efficiency was a value measured at a current density of 50 mA/cm$^2$. The initial current density for the half-life measurement was 50 mA/cm$^2$. The light emitting devices utilized in the Examples and Comparative Examples are organic electroluminescence devices emitting blue light. The property evaluation results in Table 2 were shown utilizing the maximum light emitting efficiency and brightness half-life of the organic electroluminescence device according to Comparative Example 9 (utilizing mCP as a hole transport material) as the reference value (i.e., 100%).

TABLE 2

| Examples | Hole transport material | Maximum light-emitting efficiency | Brightness half-life |
| --- | --- | --- | --- |
| Example 9 | Example Compound 5 | 150% | 160% |
| Example 10 | Example Compound 17 | 150% | 140% |
| Example 11 | Example Compound 37 | 140% | 140% |
| Example 12 | Example Compound 39 | 140% | 150% |
| Comparative Example 9 | mCP | 100% | 100% |
| Comparative Example 10 | Comparative Compound X-1 | 120% | 110% |
| Comparative Example 11 | Comparative Compound X-4 | 120% | 110% |

Referring to the results in Table 2, it may be found that the organic electroluminescence devices each utilizing the silicon-containing compound according to an embodiment of the inventive concept as a material for a hole transport layer HTL may attain high efficiency and long device life. Specifically, it may be found that the organic electroluminescence devices of Examples 9 to 12 each have enhanced efficiency and extended life when compared with those of Comparative Examples 9 to 11. The organic electroluminescence devices of Examples 9 to 12 each have a maximum light emitting efficiency of 140% to 150% and a brightness half-life of 140% to 160%, attaining high efficiency and long device life. Meanwhile, the organic electroluminescence devices of Comparative Examples 9 to 11 each have a maximum light emitting efficiency of 100% to 120% and a brightness half-life of 100% to 110%, which shows lower efficiency and shorter device life when compared with those of the Examples.

This may be attributed to the Example Compounds each having a high triplet energy level, which inhibits the diffusion of energy released from the excitons into the peripheral layers.

2-2. Example C

Organic electroluminescence devices of Examples 13 and 14 and Comparative Examples 12 to 14 were manufactured by utilizing Example Compounds 21 and 27, DPEPO, and Comparative Compounds X-2 and X-3 as a material for a respective electron transport layer.

Example Compounds

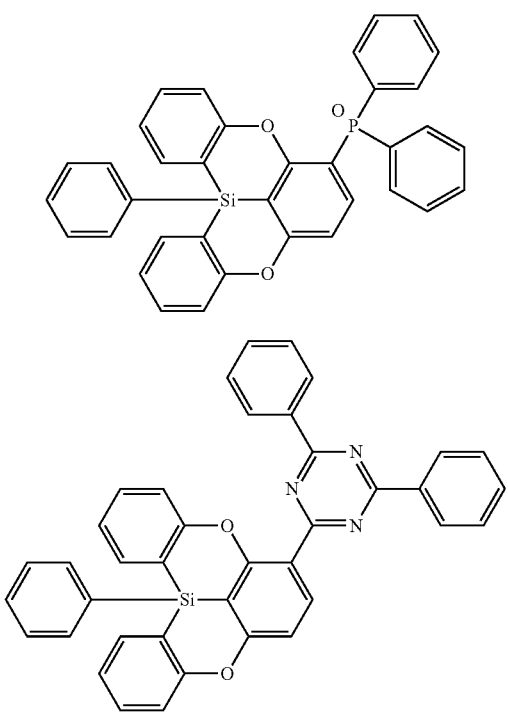

21

27

Comparative Compounds

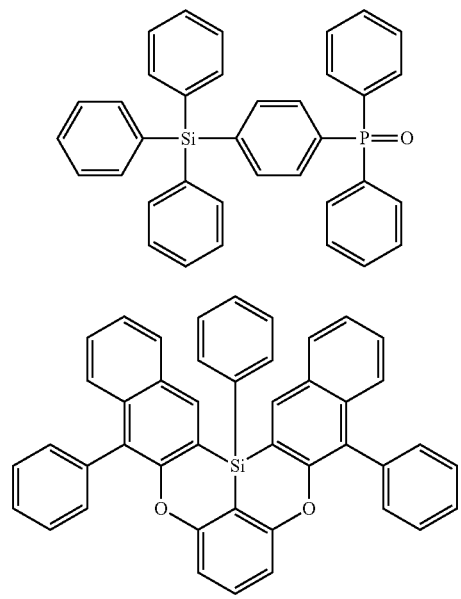

X-2

X-3

(Manufacture of Organic Electroluminescence Devices)

The organic electroluminescence devices according to Examples 13 and 14 and Comparative Examples 12 to 14 were each manufactured by forming a first electrode EL1 utilizing ITO to a thickness of about 150 nm, a hole injection layer HIL utilizing HAT-CN to a thickness of about 10 nm, a hole transport layer HTL utilizing α-NPD to a thickness of about 80 nm, an electron blocking layer EBL utilizing mCP to a thickness of about 5 nm, an emission layer EML utilizing DPEPO doped with 18% ACRSA to a thickness of about 20 nm, a hole blocking layer HBL utilizing DPEPO to a thickness of about 10 nm, an electron transport layer ETL utilizing a respective one of the example compounds or the comparative compounds to a thickness of about 30 nm, an electron injection layer EIL utilizing LiF to a thickness of about 0.5 nm, and a second electrode EL2 utilizing Al to a thickness of about 100 nm. Each layer was formed by a vacuum deposition method.

(Property Evaluation of Organic Electroluminescence Devices)

The light emitting property of each of the organic electroluminescence devices was evaluated by utilizing a brightness light distribution characteristics measurement system C9920-11 (Hamamatsu Photonics, Japan). The values of maximum light emitting efficiency and half-life were measured to evaluate the properties of the organic electroluminescence devices manufactured in the Examples and Comparative Examples. The maximum light emitting efficiency was a value measured at a current density of 50 mA/cm$^2$. The initial current density for the half-life measurement was 50 mA/cm$^2$. The light emitting devices utilized in the Examples and Comparative Examples are organic electroluminescence devices emitting blue light. The property evaluation results in Table 3 were shown utilizing the maximum light emitting efficiency and brightness half-life of the organic electroluminescence device according to Comparative Example 12 (utilizing DPEPO as a hole transport material) as the reference value (i.e, 100%).

TABLE 3

| Examples | Electron transport material | Maximum light-emitting efficiency | Brightness half-life |
|---|---|---|---|
| Example 13 | Example Compound 21 | 150% | 170% |
| Example 14 | Example Compound 27 | 150% | 200% |
| Comparative Example 12 | DPEPO | 100% | 100% |
| Comparative Example 13 | Comparative Compound X-2 | 110% | 110% |
| Comparative Example 14 | Comparative Compound X-3 | 100% | 120% |

Referring to the results in Table 3, it may be found that the organic electroluminescence devices utilizing one or more of the silicon-containing compound according to an embodiment of the inventive concept as a material for an electron transport layer ETL may attain high efficiency and long device life. Specifically, it may be found that the organic electroluminescence devices of Examples 13 and 14 each have enhanced efficiency and extended life when compared with those of Comparative Examples 12 to 14. The organic electroluminescence devices of Examples 13 and 14 each have a maximum light emitting efficiency of 150% and a brightness half-life of 170% to 200%, attaining high efficiency and long device life. Meanwhile, the organic electroluminescence devices of Comparative Examples 12 to 14 each have a maximum light emitting efficiency of 100% to 110% and a brightness half-life of 100% to 120%, which show lower efficiency and shorter device life when compared with those of the Examples.

This may be attributed to the Example Compounds each having a high triplet energy level which inhibits the diffusion of energy released from excitons into peripheral layers.

The organic electroluminescence device according to an embodiment of the inventive concept has high efficiency.

The silicon-containing compound according to an embodiment of the inventive concept may be applied to an organic electroluminescence device, thereby contributing to high efficiency and long life of the organic electroluminescence device.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the exemplary embodiments of the present invention have been described referring to the attached drawings, it is understood that the present invention should not be limited to these exemplary embodiments but various changes and modifications can be made by one ordinary skilled in the art within the spirit and scope of the present invention as hereinafter claimed, and equivalents thereof. It is also understood that the exemplary embodiments described above are merely descriptive, rather than limiting.

What is claimed is:
1. An organic electroluminescence device, comprising:
   a first electrode;
   a plurality of organic layers on the first electrode; and
   a second electrode on the plurality of organic layers,
   wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof, and
   wherein at least one organic layer of the plurality of organic layers comprises a silicon-containing compound represented by the following Formula 1:

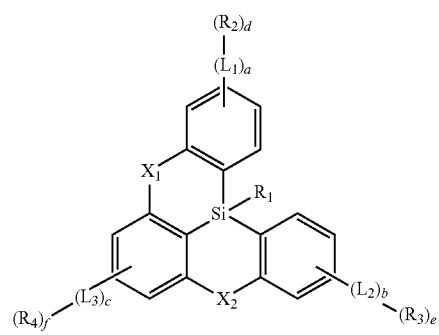

[Formula 1]

wherein in Formula 1,
$X_1$ and $X_2$ are each independently O or S,
$R_1$ is a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
$L_1$ to $L_3$ are each independently a direct linkage, a substituted or unsubstituted arylene group having 6 to 30 carbon atoms for forming a ring, or a substituted or unsubstituted heteroarylene group having 2 to 30 carbon atoms for forming a ring,
a and b are each independently an integer of 0 to 4,
c is an integer of 0 to 3,
d to f are each independently an integer of 0 to 5, and at least one of d to f is an integer of 1 or more, and
$R_2$ to $R_4$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 carbon atoms for forming a ring, a substituted or unsubstituted heteroaryl group having 2 to 30 carbon atoms for forming a ring, or a moiety represented by any one of the following Formulae 2 to 4:

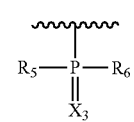

[Formula 2]

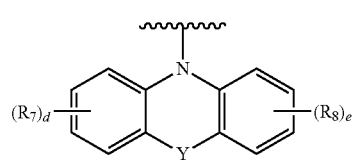

[Formula 3]

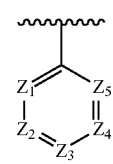

[Formula 4]

wherein in Formulae 2 to 4,
$X_3$ is O or S,
Y is a direct linkage, $CR_9R_{10}$, or $SiR_{11}R_{12}$, $Z_1$ to $Z_5$ are each independently $CR_{13}$ or N, and at least one of $Z_1$ to $Z_5$ is N, and $R_5$ to $R_{13}$ are each independently a hydrogen atom, a deuterium atom, a substituted or unsubstituted alkoxy group having 1 to 10 carbon atoms, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and wherein at least one of $R_2$ to $R_4$:
  is the moiety represented by any one of the Formulae 2 to 4; or
  is a phenyl group or a biphenyl group, each substituted with the moiety represented by any one of the Formulae 2 to 4.

2. The organic electroluminescence device of claim 1, wherein $L_i$ to $L_3$ are each independently a direct linkage, a substituted or unsubstituted phenylene group, or a substituted or unsubstituted divalent biphenyl group.

3. The organic electroluminescence device of claim 1, wherein the silicon-containing compound represented by Formula 1 is represented by any one of the following Formulae 1-1 to 1-3:

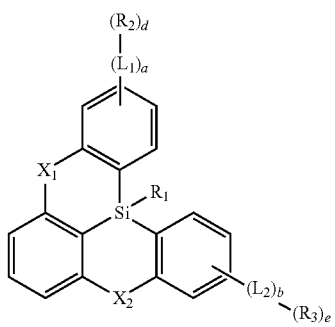

[Formula 1-1]

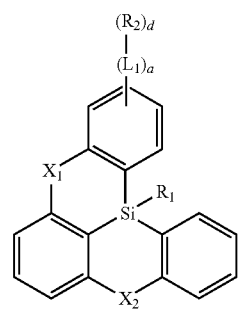

[Formula 1-2]

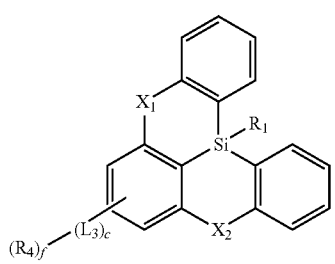

[Formula 1-3]

wherein in Formulae 1-1 to 1-3,
d to f are each independently an integer of 1 to 5, and
a to c, $L_1$ to $L_3$, $R_1$ to $R_4$, $X_1$ and $X_2$ are the same as respectively defined in connection with Formula 1.

4. The organic electroluminescence device of claim 1, wherein $R_1$ is represented by any one of the following Formula 5 or 6:

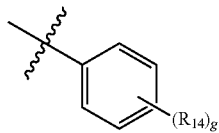

[Formula 5]

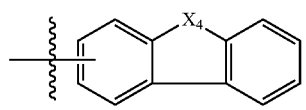

[Fromula 6]

wherein in Formulae 5 and 6,
g is an integer of 0 to 5,
$R_{14}$ is a hydrogen atom, a substituted or unsubstituted alkyl group having 1 to 10 carbon atoms, a substituted or unsubstituted alkoxy group having 1 to 10 carbon atoms, a halogen atom, a substituted or unsubstituted aryl group having 6 to 15 carbon atoms for forming a ring, or a substituted or unsubstituted heteroaryl group having 2 to 15 carbon atoms for forming a ring,
$X_4$ is $NR_{15}$, O, or S, and
$R_{15}$ is a hydrogen atom, a substituted or unsubstituted alkyl group having 1 to 10 carbon atoms, a substituted or unsubstituted aryl group having 6 to 15 carbon atoms for forming a ring, or a substituted or unsubstituted heteroaryl group having 2 to 15 carbon atoms for forming a ring.

5. The organic electroluminescence device of claim 1, wherein the moiety represented by Formula 2 is represented by the following Formula 2-1:

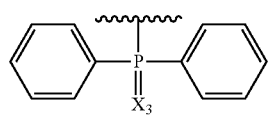

[Formula 2-1]

wherein in Formula 2-1, $X_3$ is the same as defined in connection with Formula 2.

6. The organic electroluminescence device of claim 1, wherein the moiety represented by Formula 4 is represented by any one of the following Formulae 4-1 to 4-3:

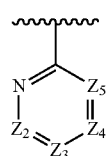

[Formula 4-1]

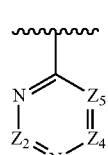

[Formula 4-2]

[Formula 4-3]

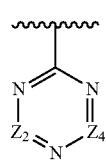

wherein in Formulae 4-1 to 4-3, $Z_2$ to $Z_5$ are the same as respectively defined in connection with Formula 4.

7. The organic electroluminescence device of claim 1, wherein $R_5$ to $R_{13}$ are each independently a hydrogen atom, a methyl group, a t-butyl group, a methoxy group, or an unsubstituted phenyl group.

8. The organic electroluminescence device of claim 1, wherein the plurality of organic layers comprise:
   a hole transport region on the first electrode;
   an emission layer on the hole transport region; and
   an electron transport region on the emission layer.

9. The organic electroluminescence device of claim 8, wherein
   the emission layer comprises a host and a dopant, and
   the host comprises the silicon-containing compound.

10. The organic electroluminescence device of claim 8, wherein at least one of the hole transport region or the electron transport region comprises the silicon-containing compound.

11. The organic electroluminescence device of claim 8, wherein the emission layer is configured to emit blue light with a wavelength range of about 440 nm to about 480 nm.

12. The organic electroluminescence device of claim 1, wherein the silicon-containing compound is at least one selected from the group consisting of compounds represented in the following Compound Group 1:

[Compound Group 1]

1

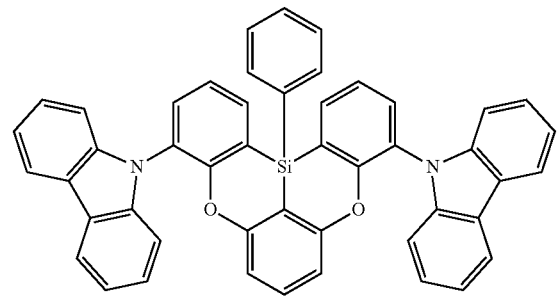

2

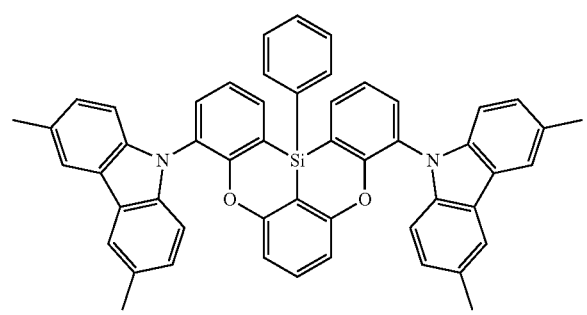

3

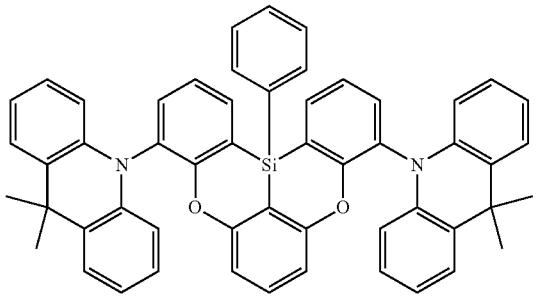

4

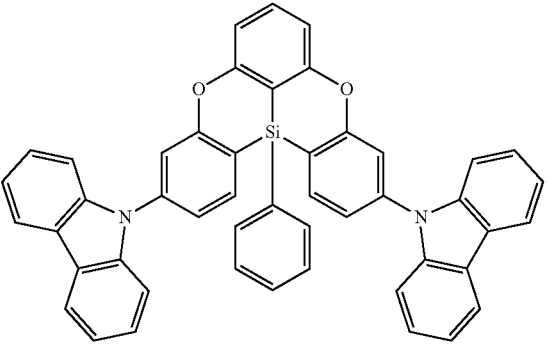

5

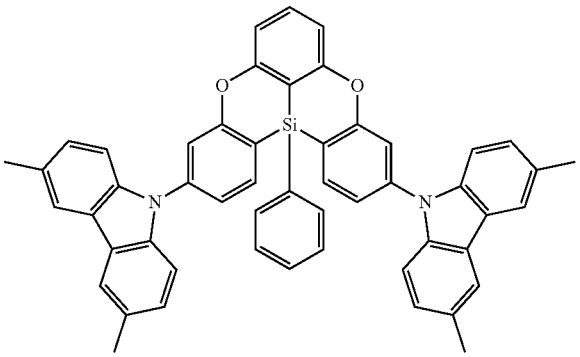

6

7
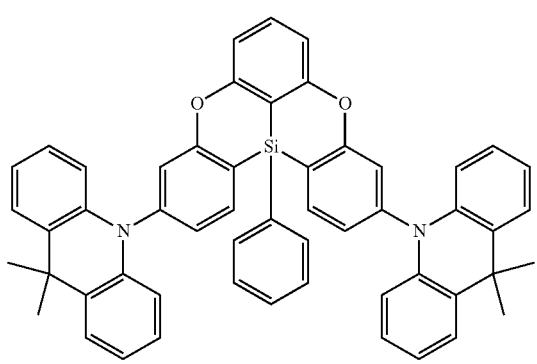
8
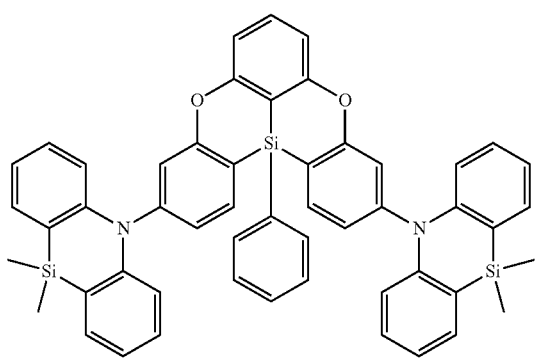
9
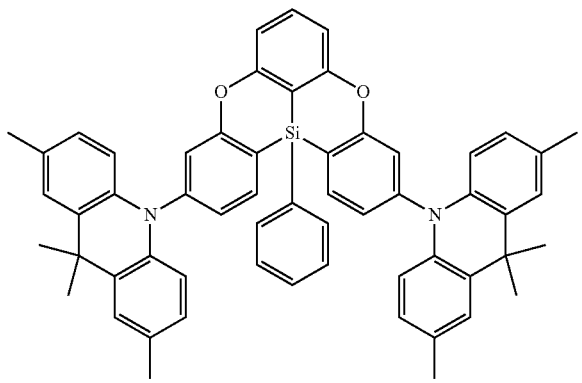
10
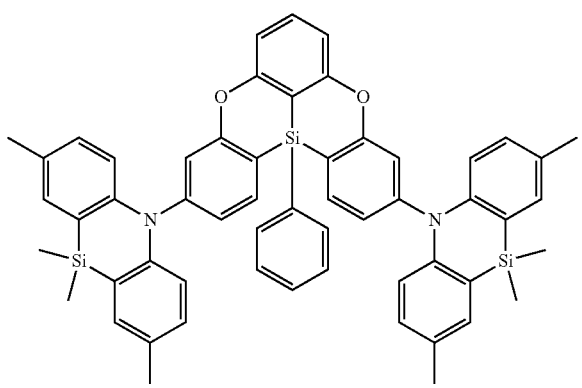
11
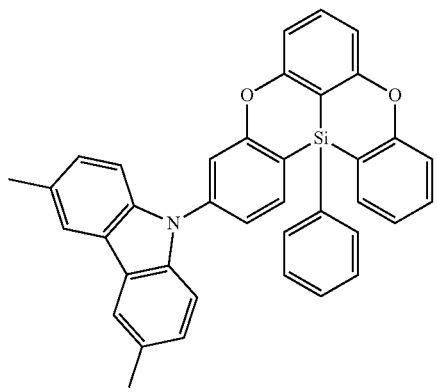
12
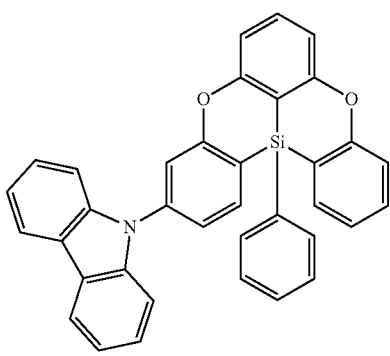
13
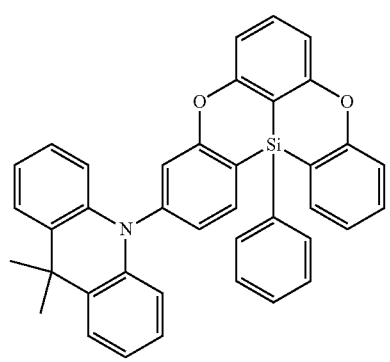
14
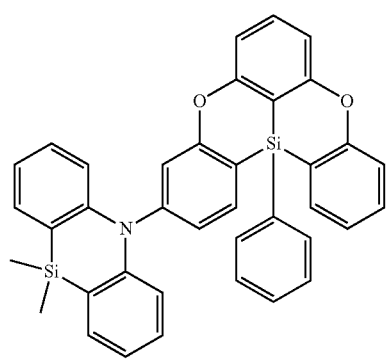

15
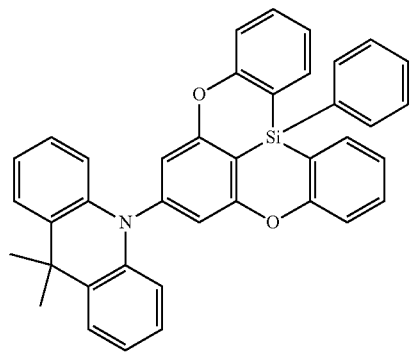
16
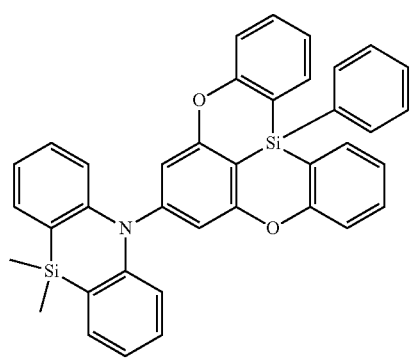
17
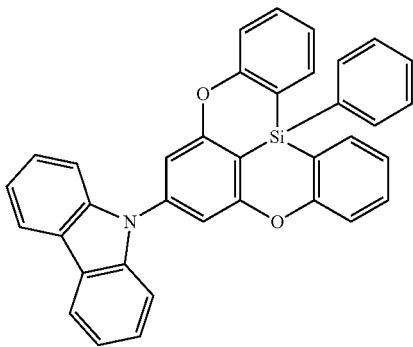
18
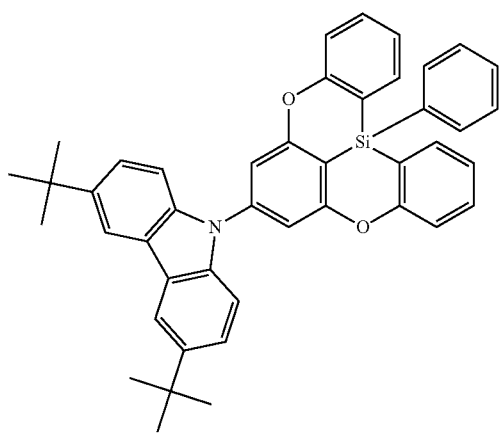
19
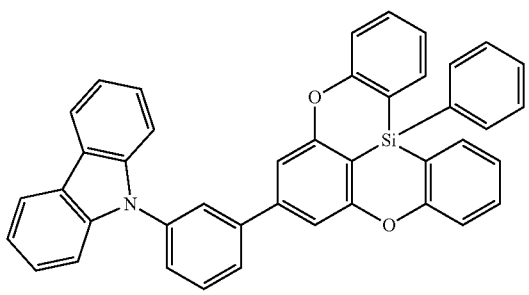
20
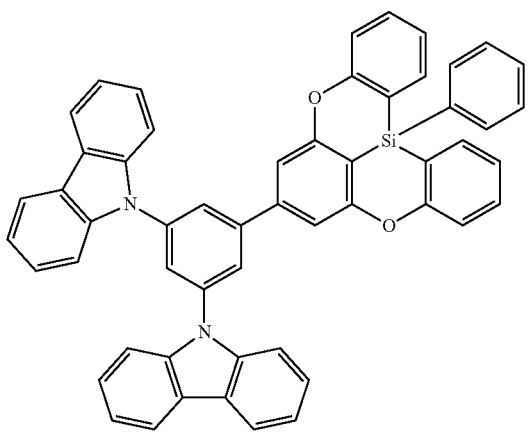
21
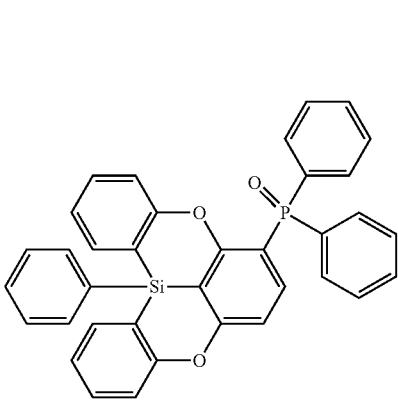
22
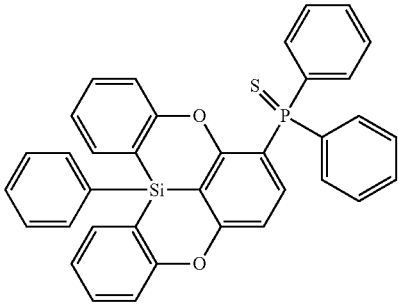

23
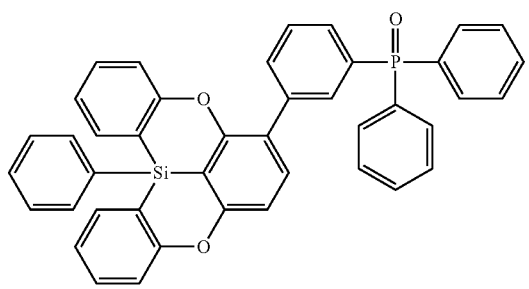
24
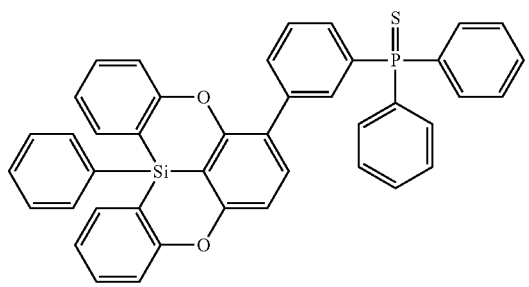
25
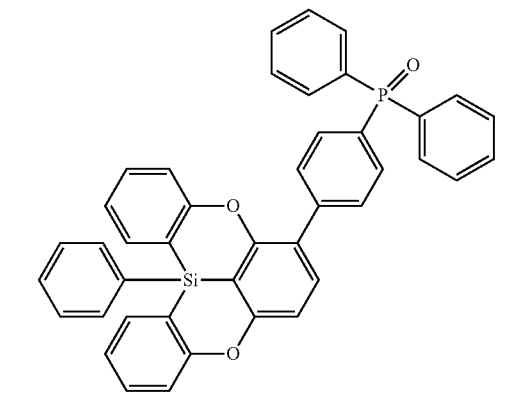
26
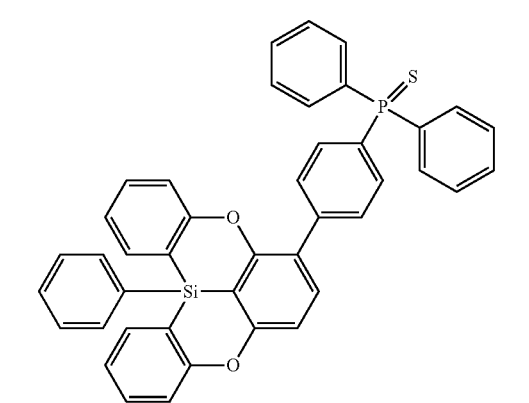
27
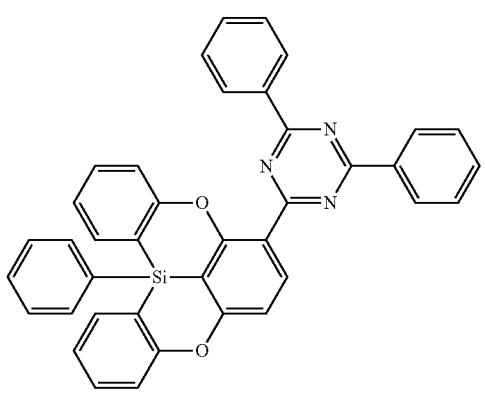
28
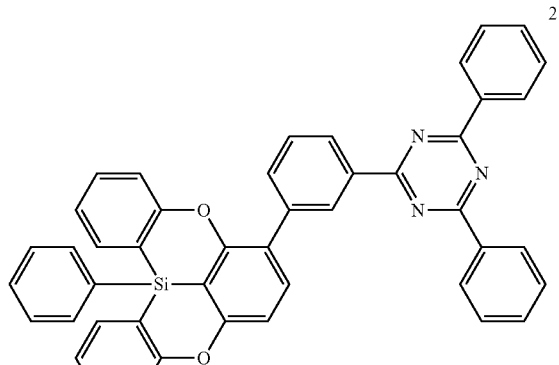
29
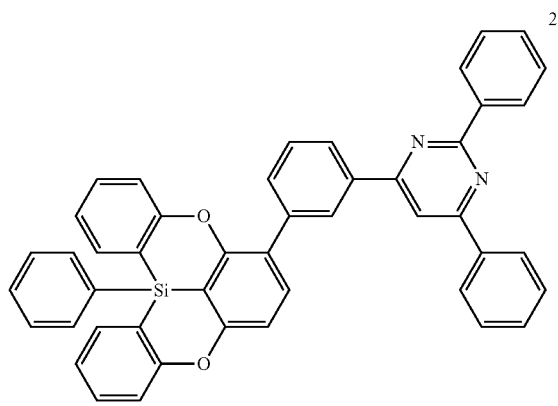
30
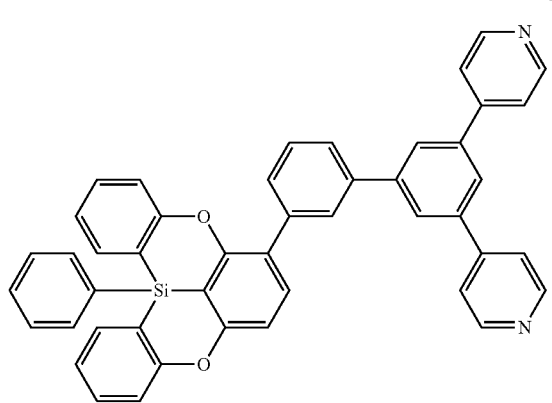

31
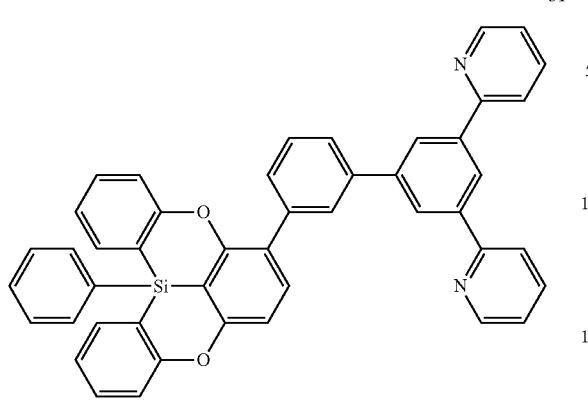
32
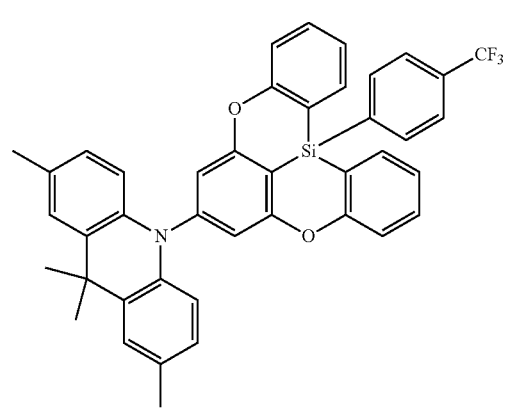
33
34
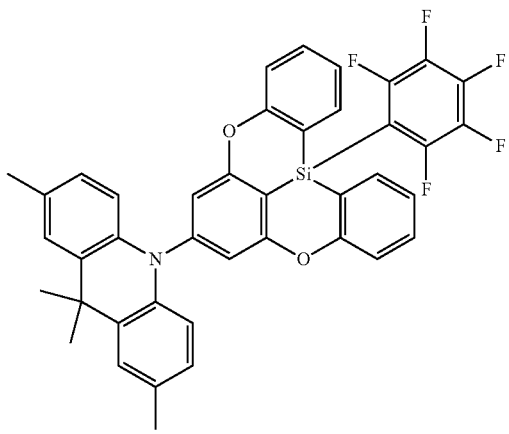
35
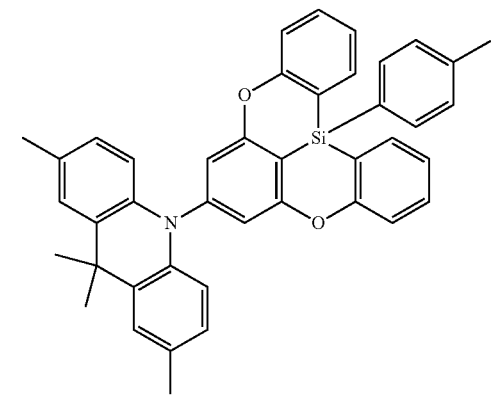
36
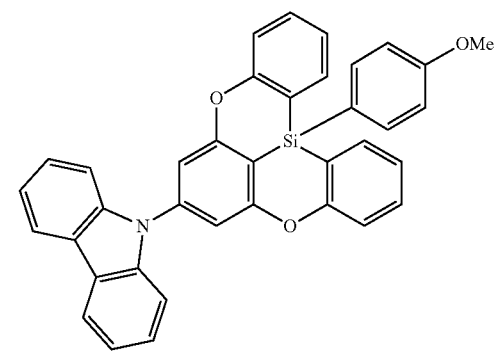
37

38
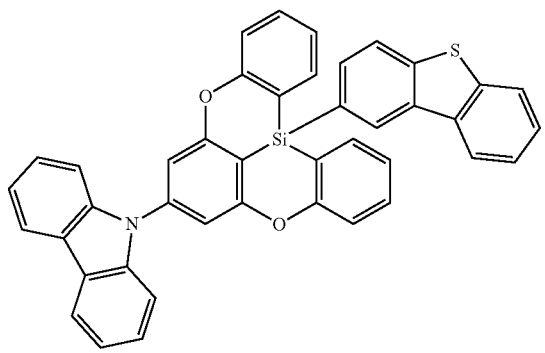
39
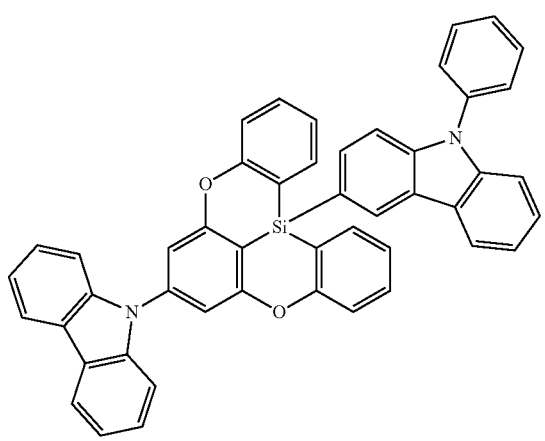
40
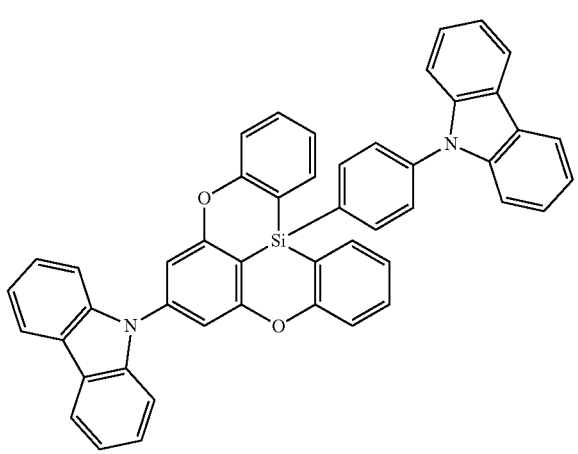
41
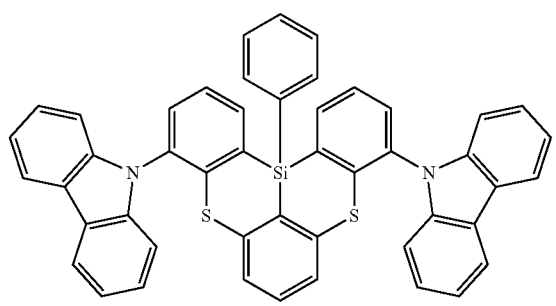
42
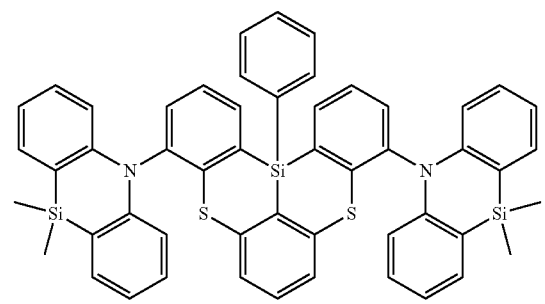
43
44
45
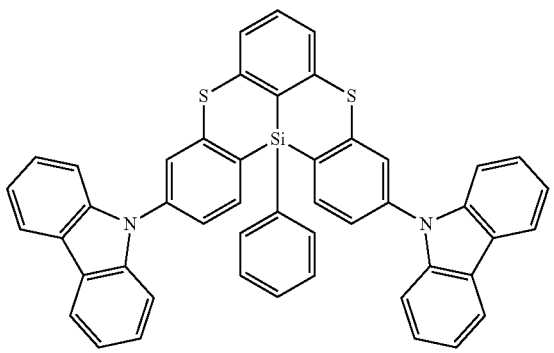

46
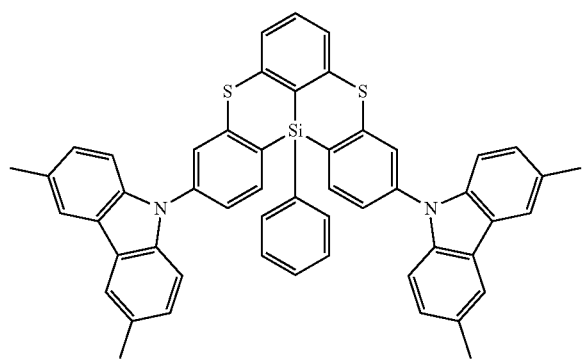
47
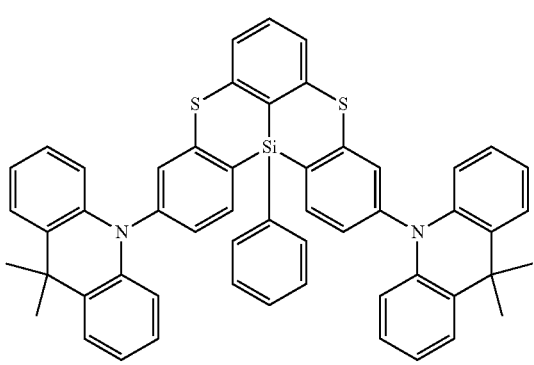
48
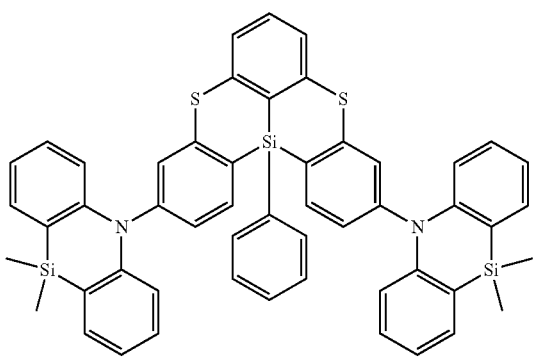
49
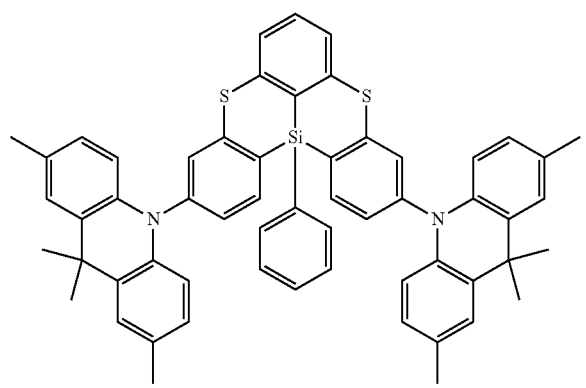
50
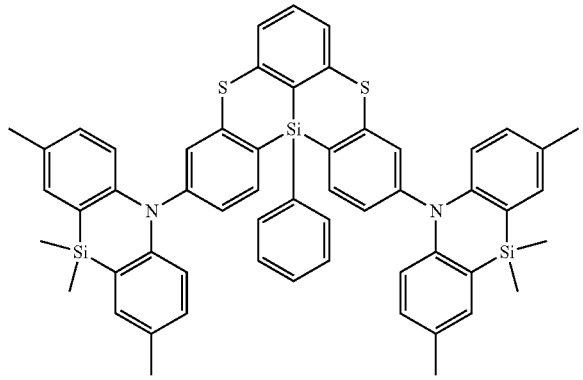
51
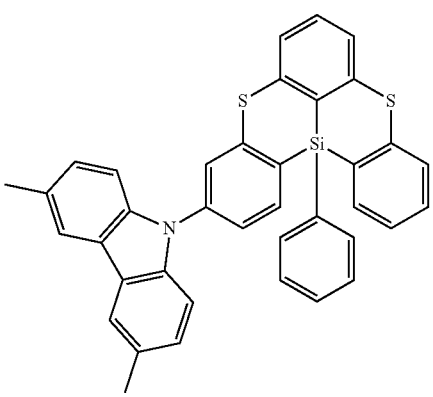
52
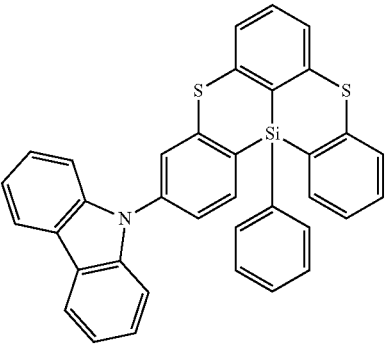
53
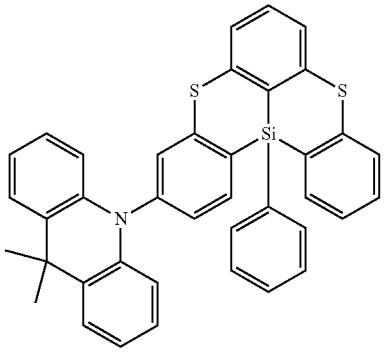

54
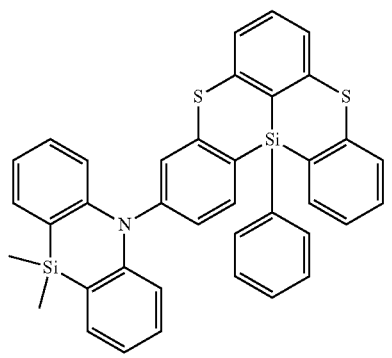
55
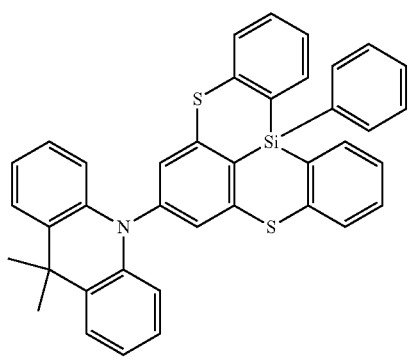
56
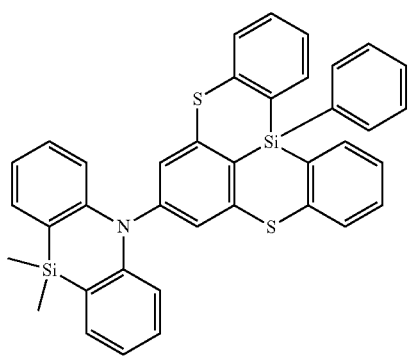
57
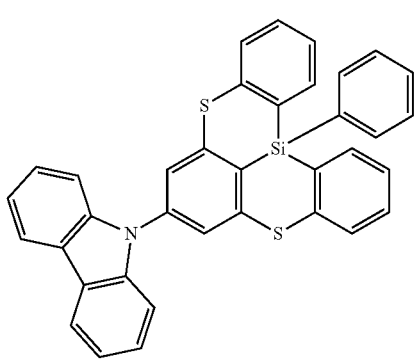
58
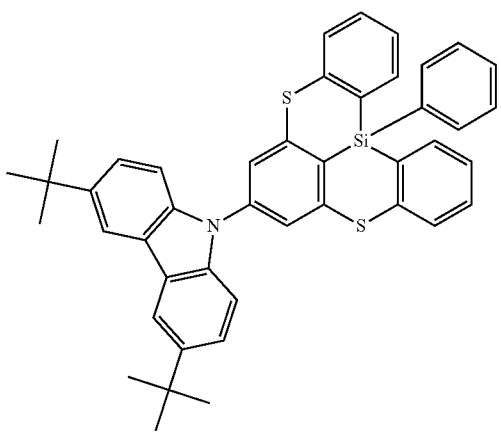
59
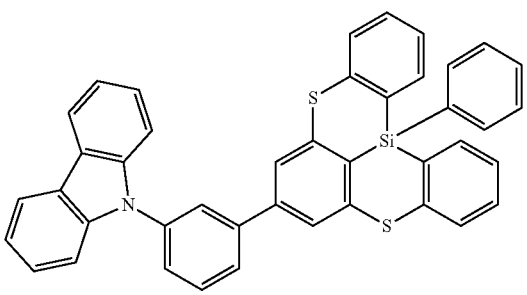
60
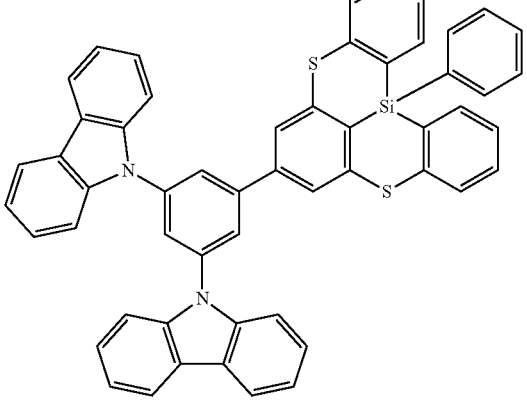
61
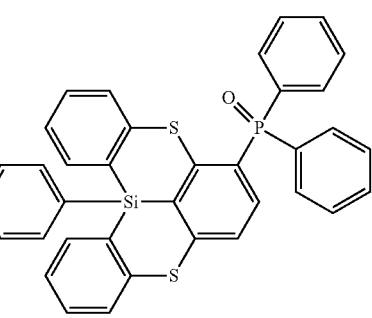

81
-continued
82
-continued
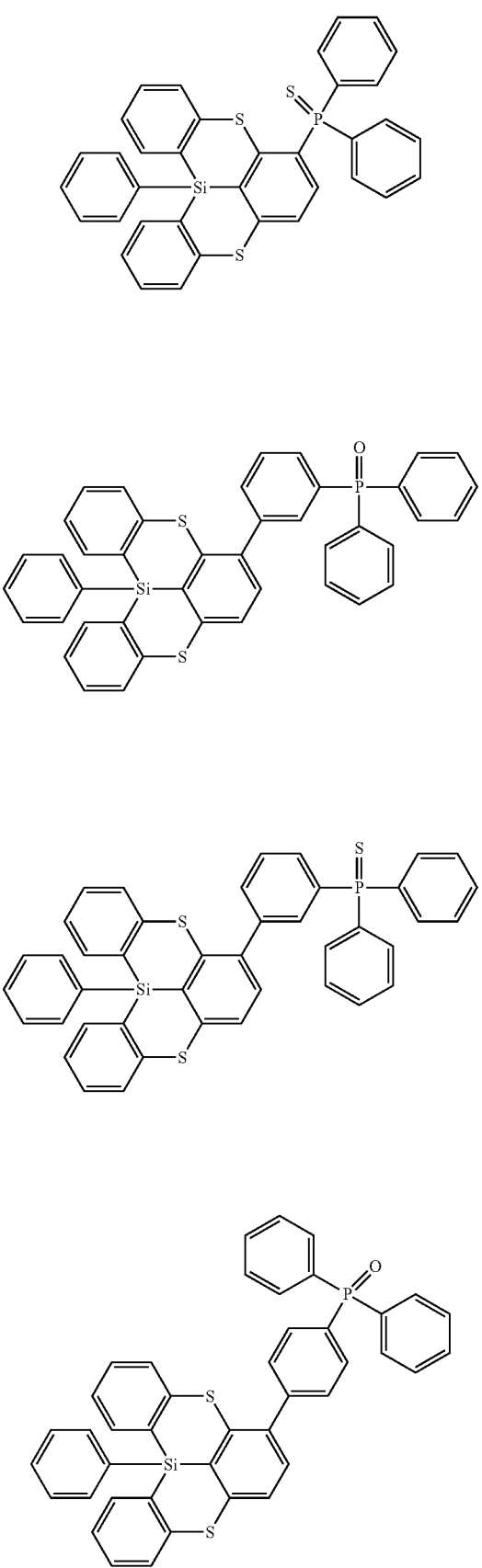
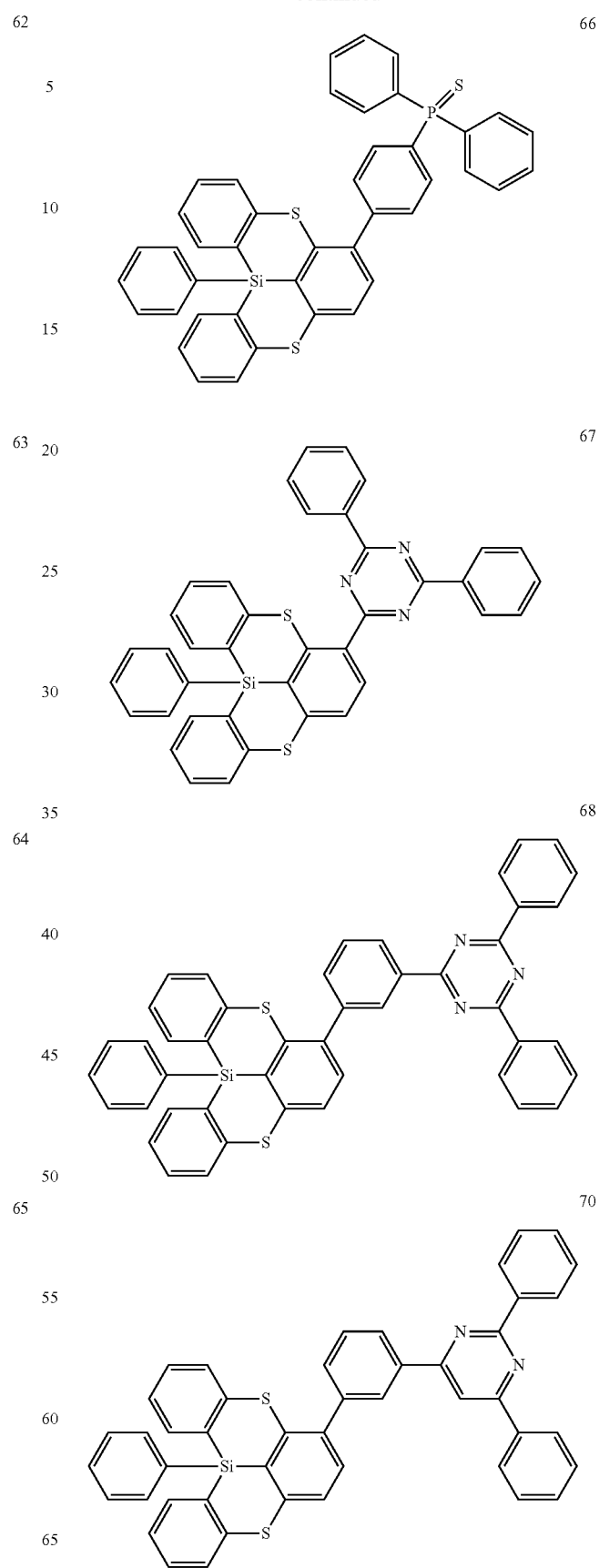

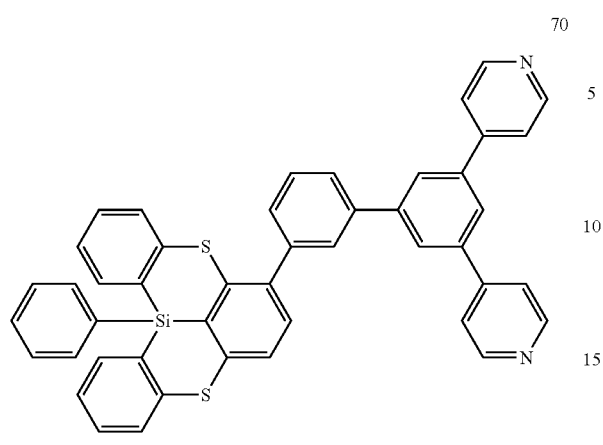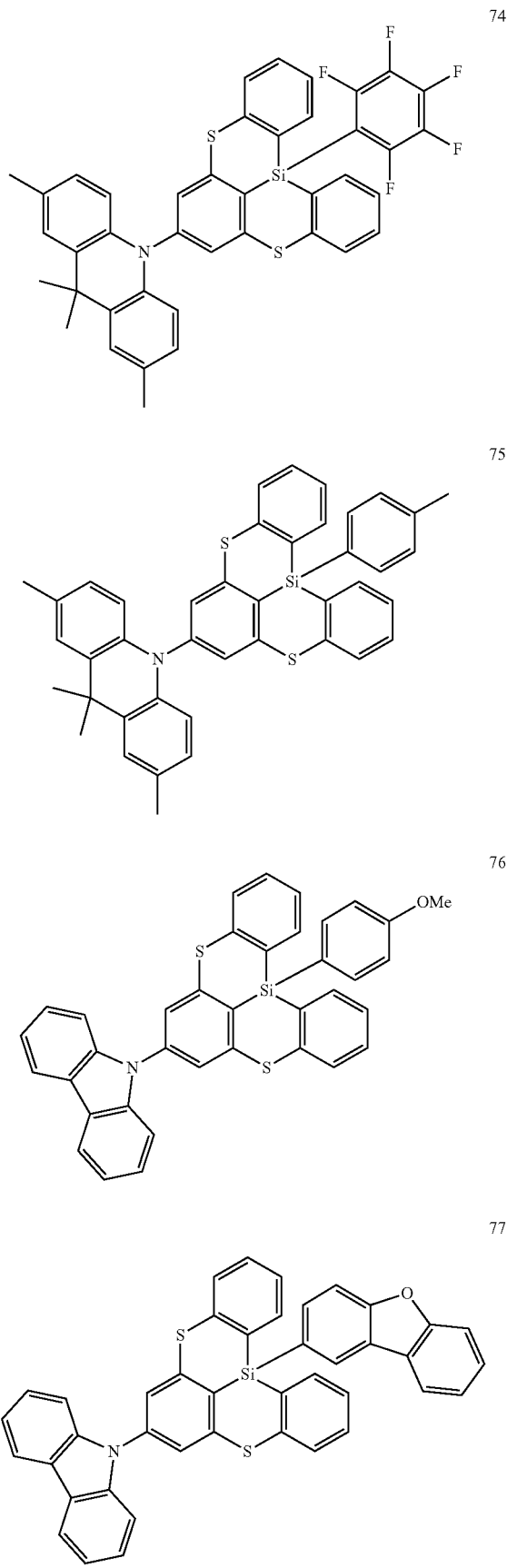

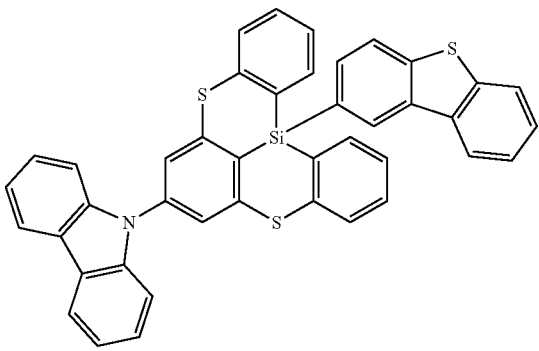

78

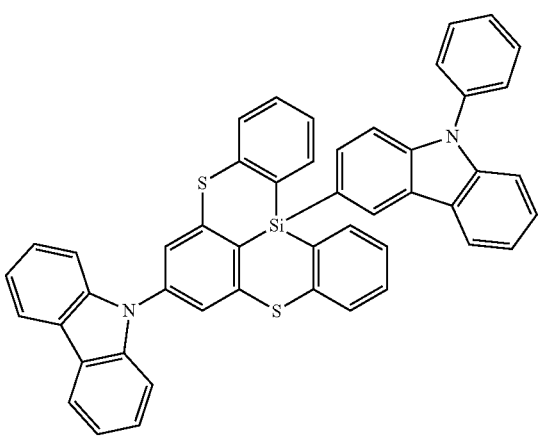

79

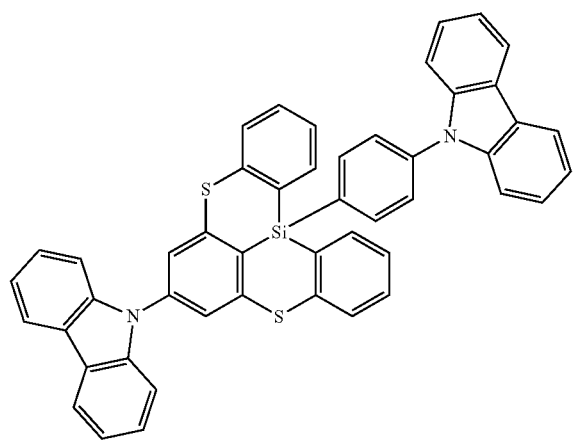

80

13. A silicon-containing compound represented by the following Formula 1:

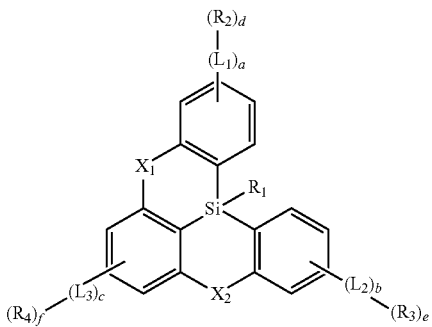

[Formula 1]

wherein Formula 1, $X_1$ and $X_2$ are each independently O or S, $R_1$ is a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, $L_1$ to $L_3$ are each independently a direct linkage, a substituted or unsubstituted arylene group having 6 to 30 carbon atoms for forming a ring, or a substituted or unsubstituted heteroarylene group having 2 to 30 carbon atoms for forming a ring, a and b are each independently an integer of 0 to 4, c is an integer of 0 to 3, d to f are each independently an integer of 0 to 5, and at least one of d to f is an integer of 1 or more, and $R_2$ to $R_4$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 carbon atoms for forming a ring, a substituted or unsubstituted heteroaryl group having 2 to 30 carbon atoms for forming a ring, or a moiety represented by any one of the following Formulae 2 to 4:

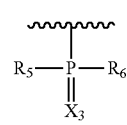

[Formula 2]

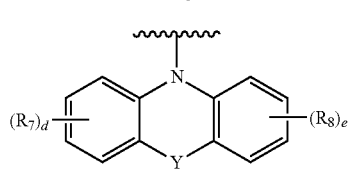

[Formula 3]

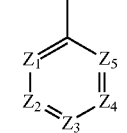

[Formula 4]

wherein in Formulae 2 to 4, $X_3$ is O or S,

Y is a direct linkage, $CR_9R_{10}$, or $SiR_{11}R_{12}$, $Z_1$ to $Z_5$ are each independently $CR_{13}$ or N, and at least one of $Z_1$ to $Z_5$ is N, and $R_5$ to $R_{13}$ are each independently a hydrogen atom, a deuterium atom, a substituted or unsubstituted alkoxy group having 1 to 10 carbon atoms, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and wherein at least one of $R_2$ to $R_4$:
is the moiety represented by any one of the Formulae 2 to 4; or
is a phenyl group or a biphenyl group, each substituted with the moiety represented by any one of the Formulae 2 to 4.

14. The silicon-containing compound of claim 13, wherein $L_1$ to $L_3$ are each independently a direct linkage, a substituted or unsubstituted phenylene group, or a substituted or unsubstituted divalent biphenyl group.

15. The silicon-containing compound of claim 13, wherein the silicon-containing compound represented by Formula 1 is represented by any one of the following Formulae 1-1 to 1-3:

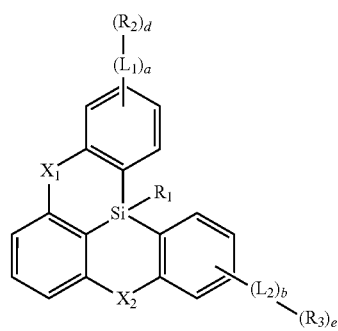

[Formula 1-1]

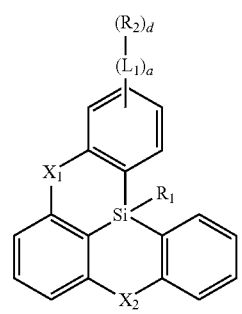

[Formula 1-2]

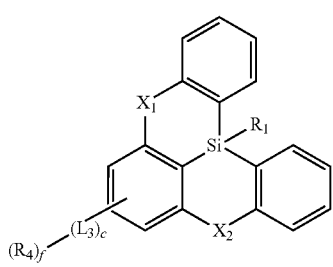

[Formula 1-3]

wherein in Formulae 1-1 to 1-3,
d to f are each independently an integer of 1 to 5, and
a to c, $L_1$ to $L_3$, $R_1$ to $R_4$, $X_1$ and $X_2$ are the same as respectively defined in connection with Formula 1.

16. The silicon-containing compound of claim 13, wherein $R_1$ is represented by any one of the following Formula 5 or 6:

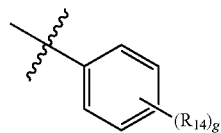

[Formula 5]

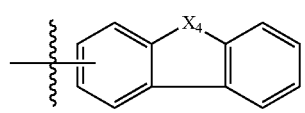

[Formula 6]

wherein in Formulae 5 and 6,
g is an integer of 0 to 5,
$R_{14}$ is a hydrogen atom, a substituted or unsubstituted alkyl group having 1 to 10 carbon atoms, a substituted or unsubstituted alkoxy group having 1 to 10 carbon atoms, a halogen atom, a substituted or unsubstituted aryl group having 6 to 15 carbon atoms for forming a ring, or a substituted or unsubstituted heteroaryl group having 2 to 15 carbon atoms for forming a ring,
$X_4$ is $NR_{15}$, O, or S, and
$R_{15}$ is a hydrogen atom, a substituted or unsubstituted alkyl group having 1 to 10 carbon atoms, a substituted or unsubstituted aryl group having 6 to 15 carbon atoms for forming a ring, or a substituted or unsubstituted heteroaryl group having 2 to 15 carbon atoms for forming a ring.

17. The silicon-containing compound of claim 13, wherein moiety represented by Formula 2 is represented by the following Formula 2-1:

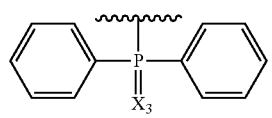

[Formula 2-1]

wherein in Formula 2-1, $X_3$ is the same as defined in connection with Formula 2.

18. The silicon-containing compound of claim 13, wherein the moiety represented by Formula 4 is represented by any one of the following Formulae 4-1 to 4-3:

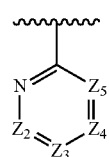

[Formula 4-1]

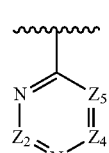

[Formula 4-2]

[Formula 4-3]

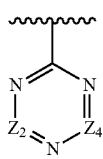

wherein in Formulae 4-1 to 4-3, $Z_2$ to $Z_5$ are the same as respectively defined in connection with Formula 4.

19. The silicon-containing compound of claim 13, wherein $R_5$ to $R_{13}$ are each independently a hydrogen atom, a methyl group, a t-butyl group, a methoxy group, or an unsubstituted phenyl group.

20. The silicon-containing compound of claim 13, wherein the silicon-containing compound represented by Formula 1 is any one selected from the group consisting of compounds represented in the following Compound Group 1:

[Compound Group 1]

1

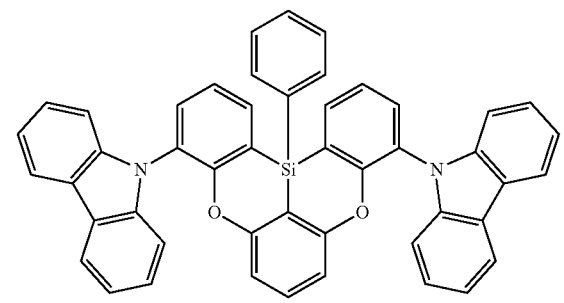

2

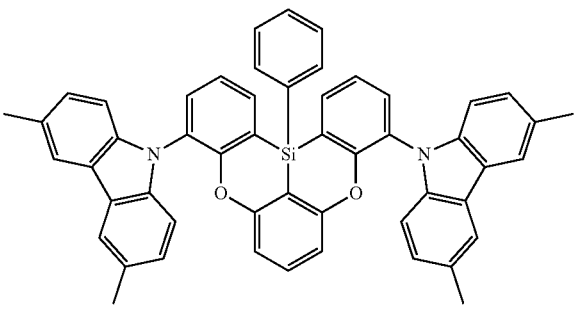

3

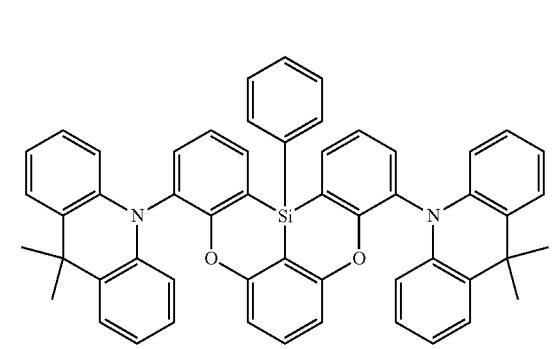

4

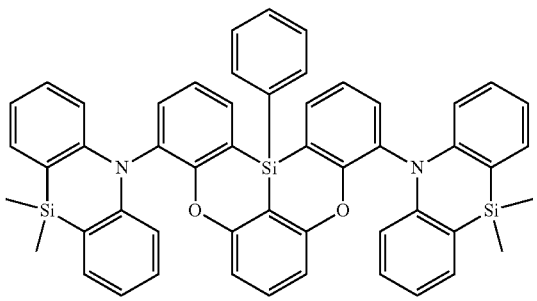

5

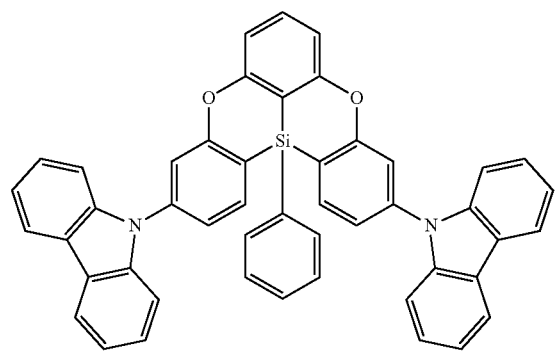

6

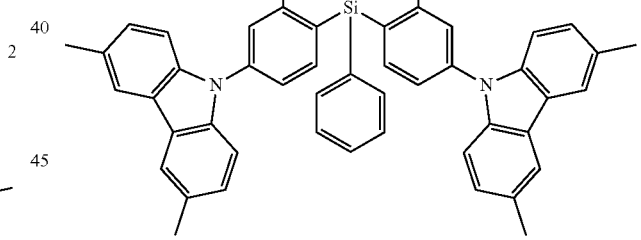

7

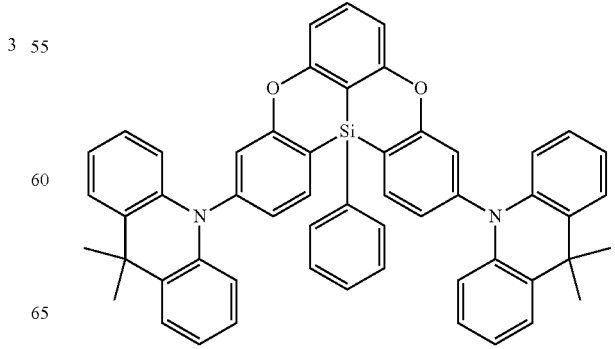

-continued
8
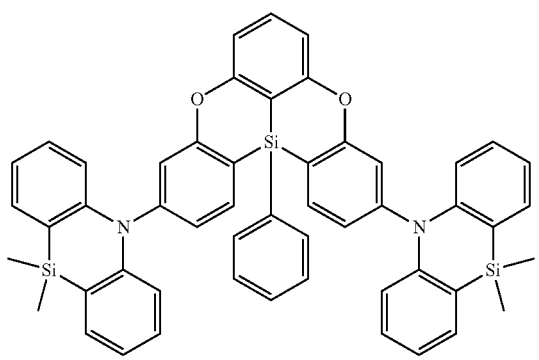
9
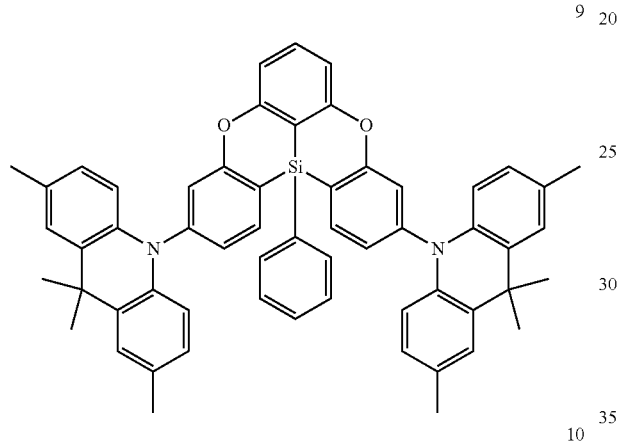
10
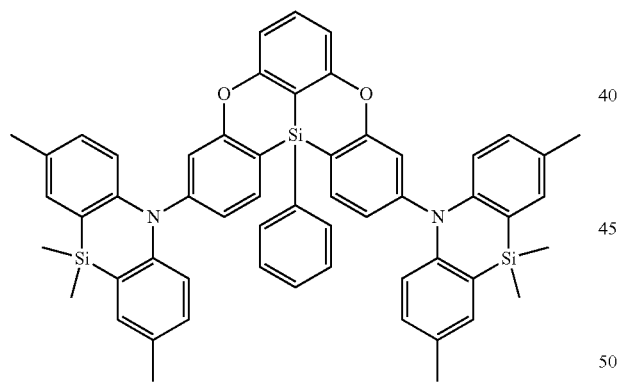
11
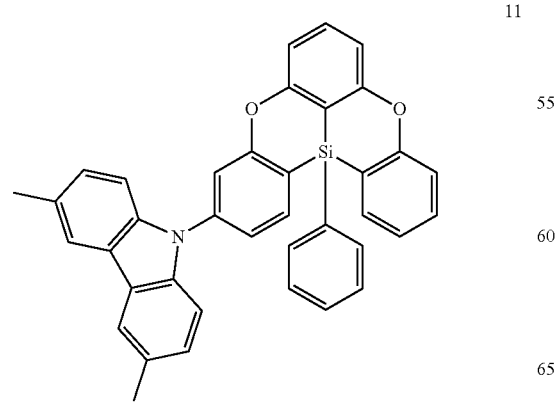
-continued
12
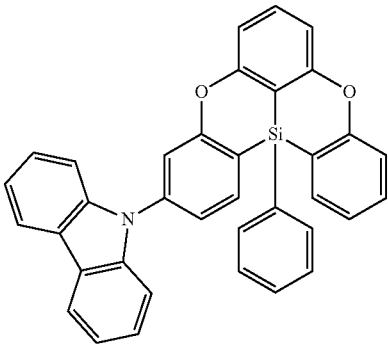
13
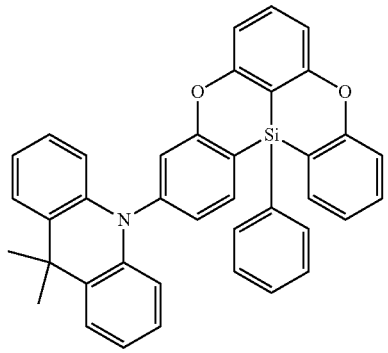
14
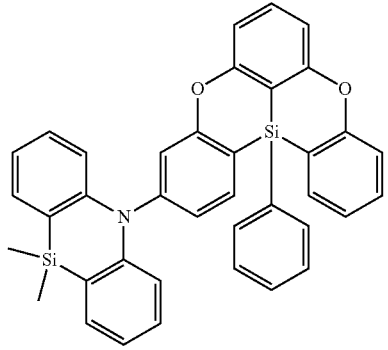
15
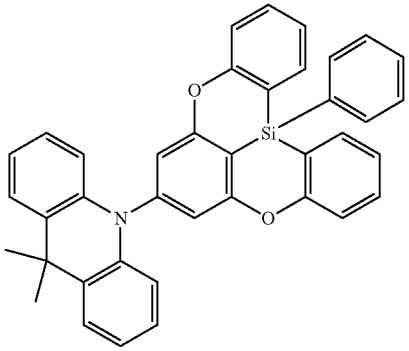

16
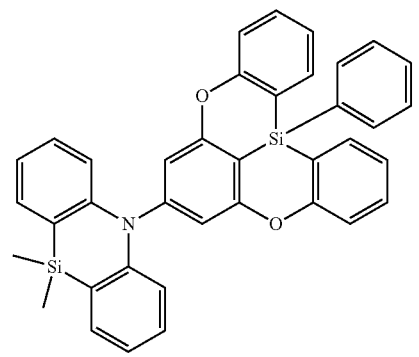
17
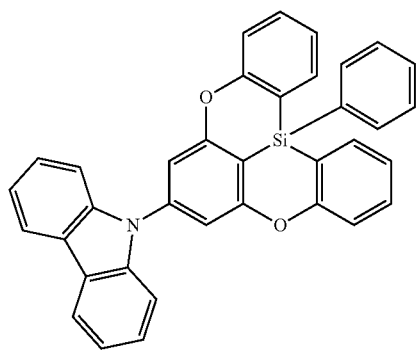
18
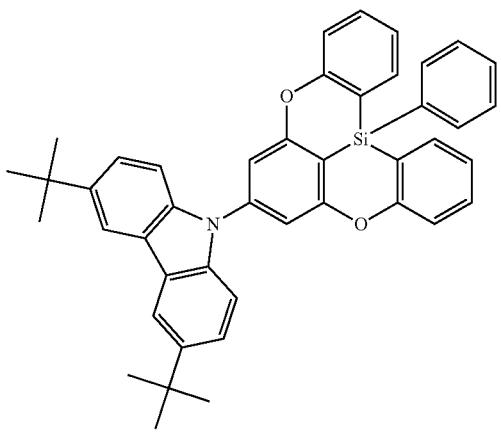
19
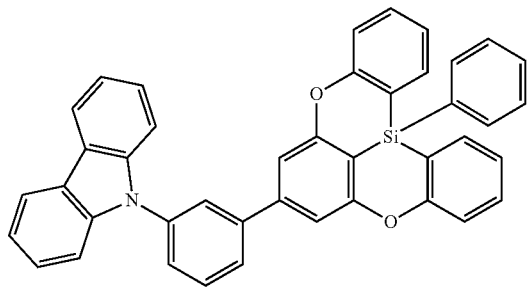
20
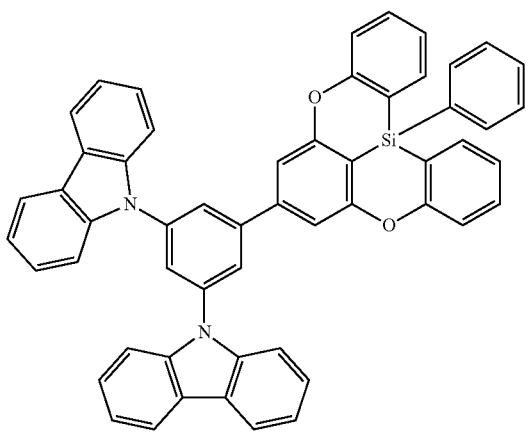
21
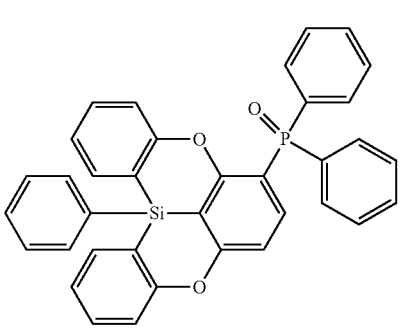
22
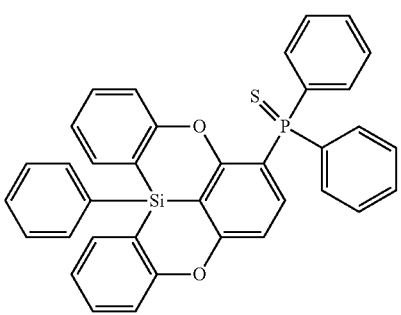
23
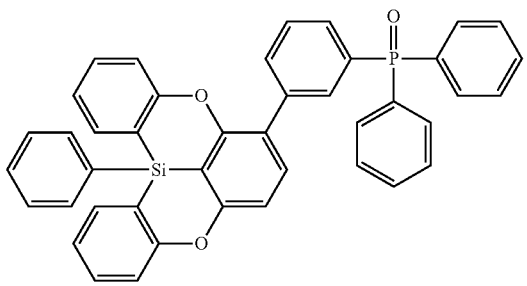
24
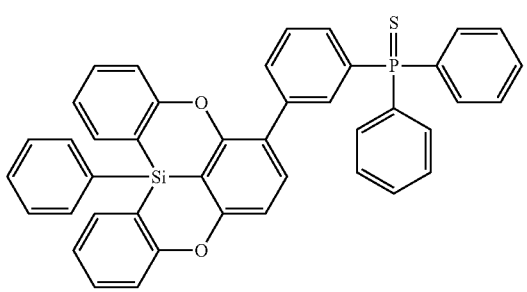

95
-continued
25
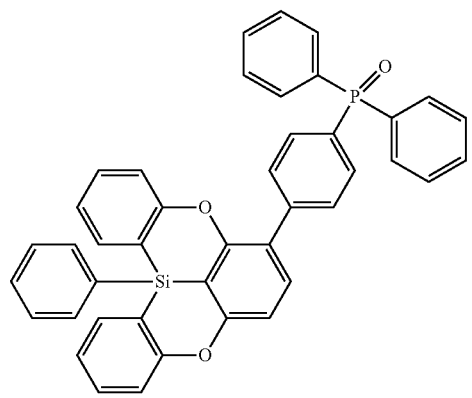
26
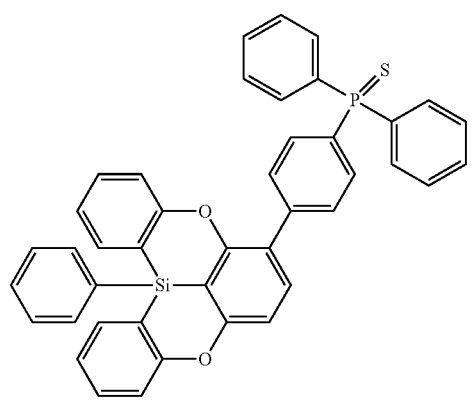
27
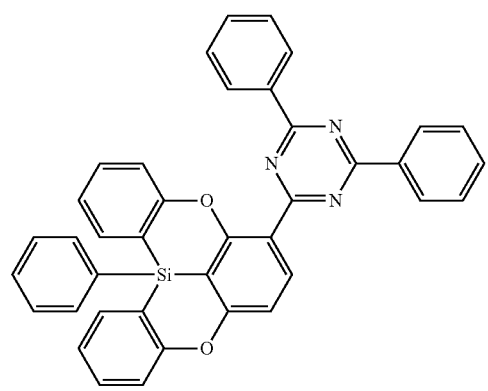
28
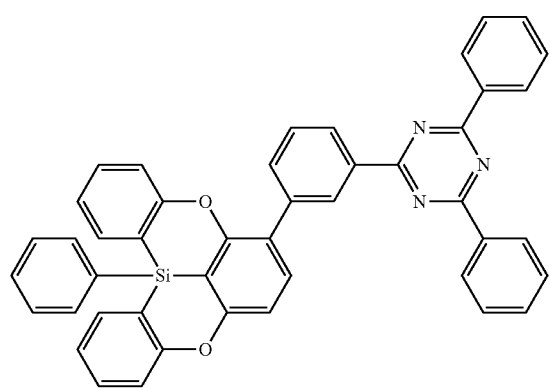
96
-continued
29
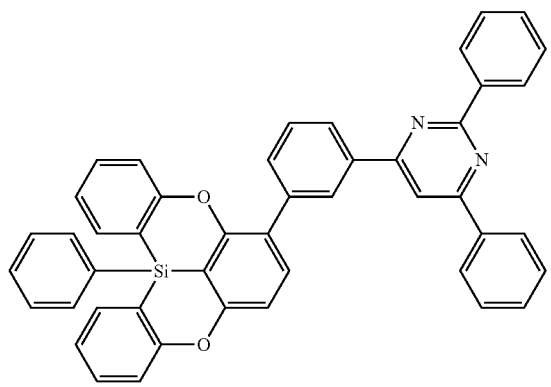
30
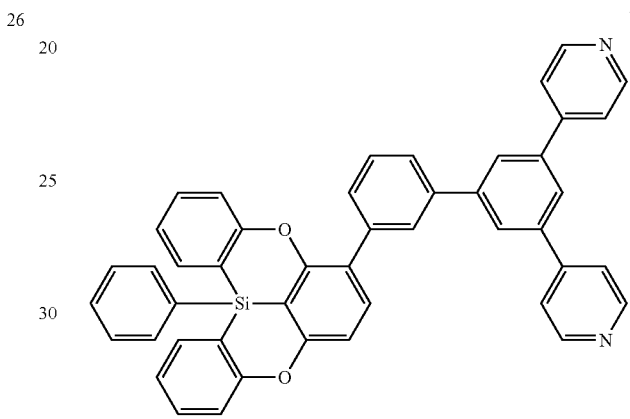
31
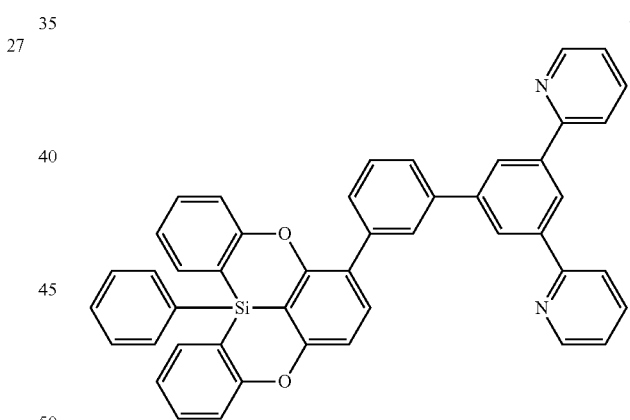
32

33
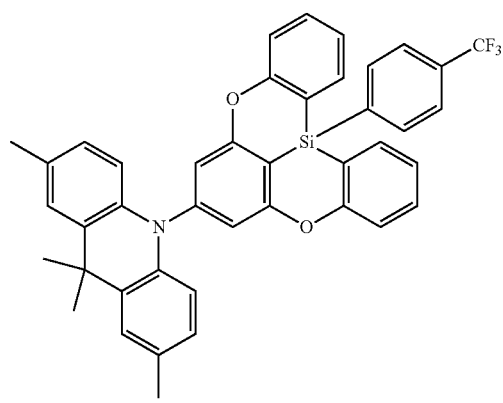
34
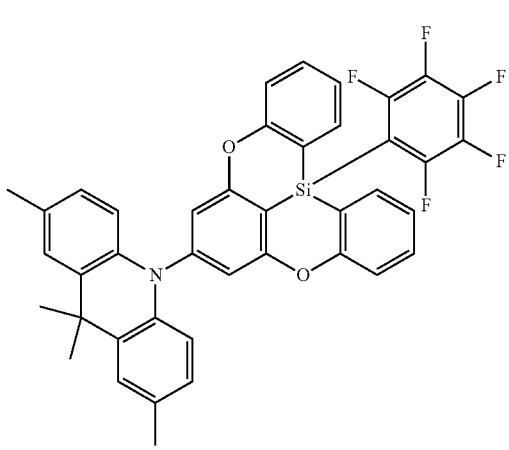
35
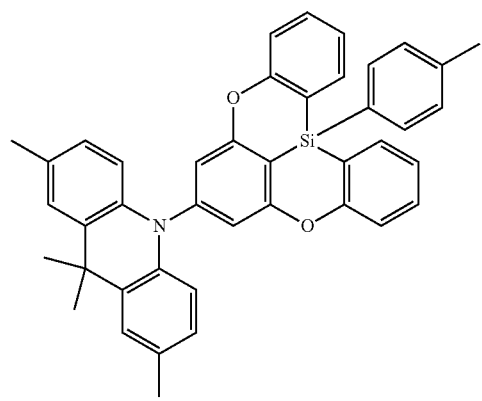
36
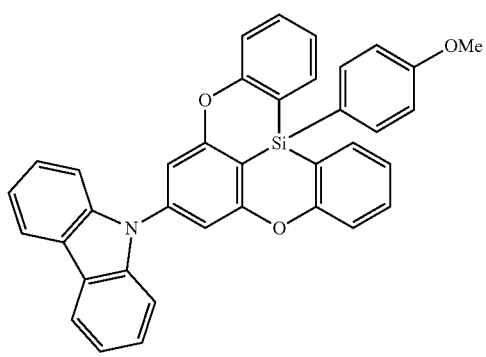
37
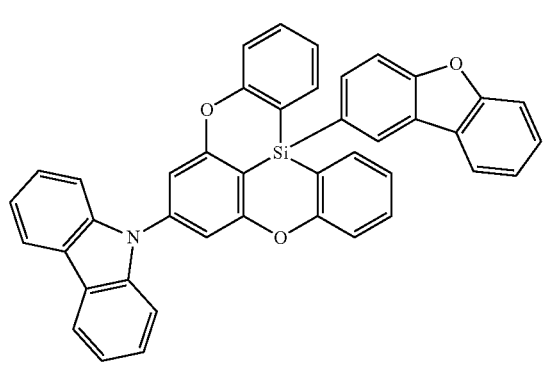
38
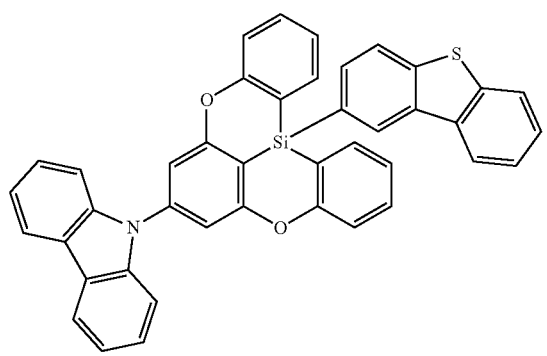
39
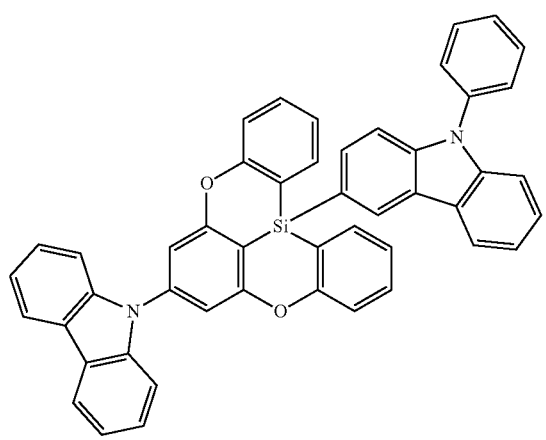
40
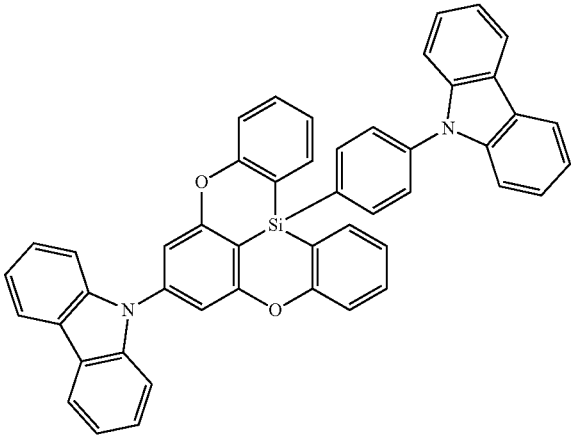

41
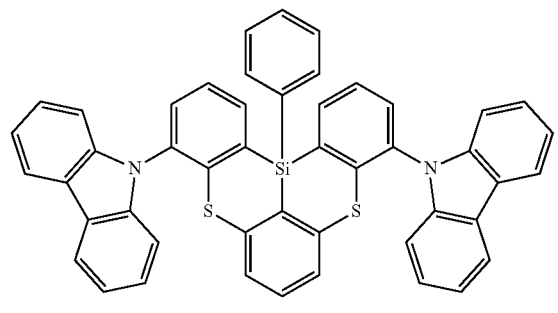
42
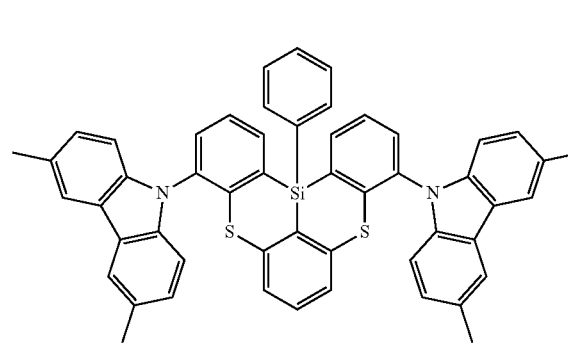
43
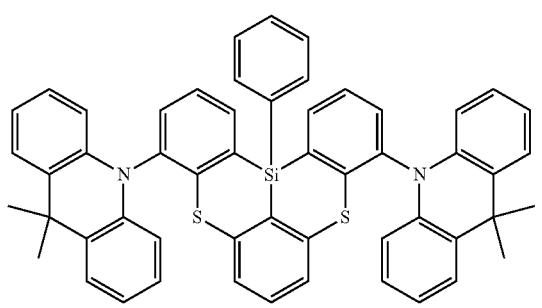
44
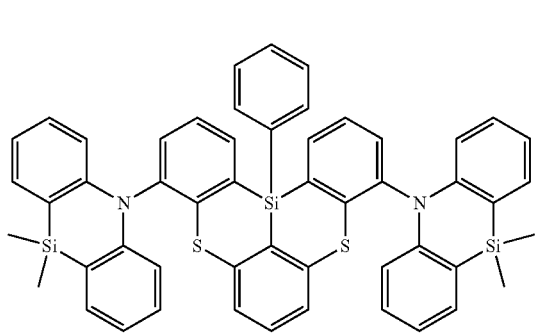
45
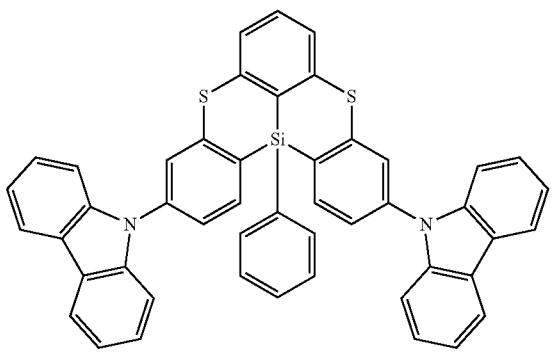
46
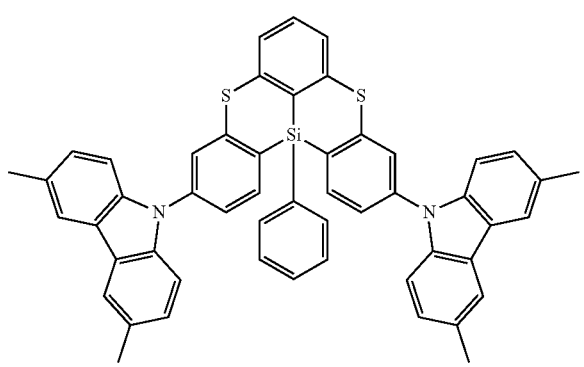
47
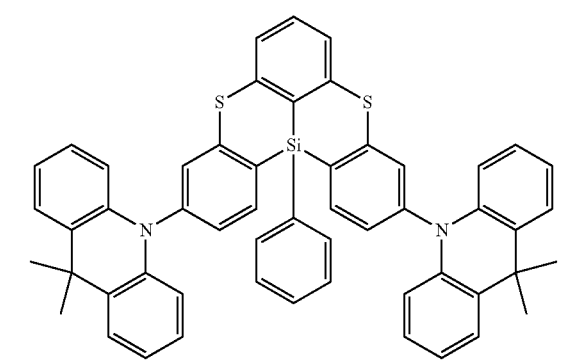
48
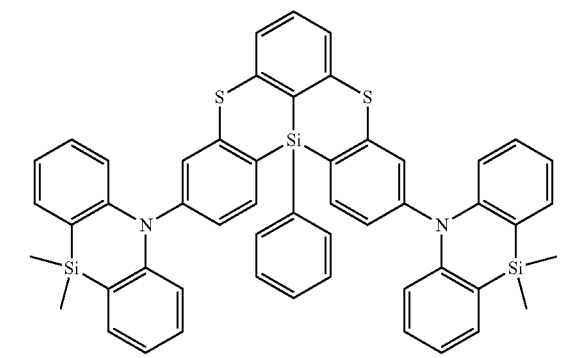

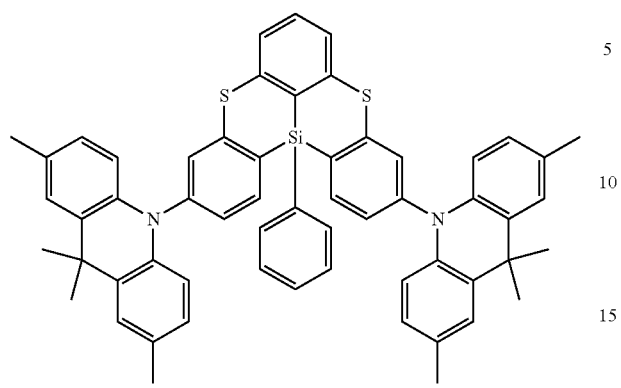
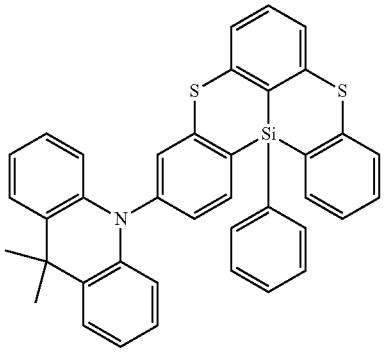
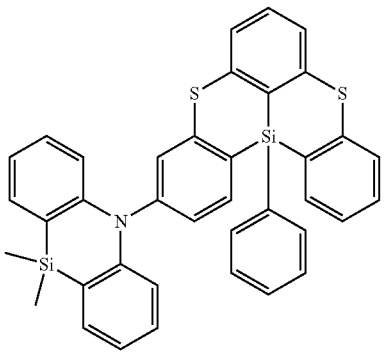
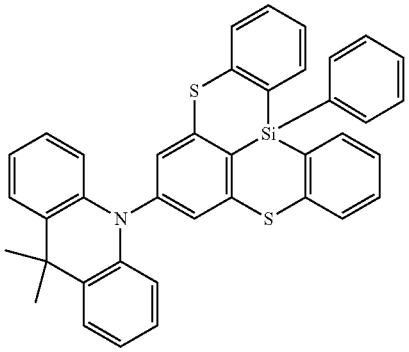
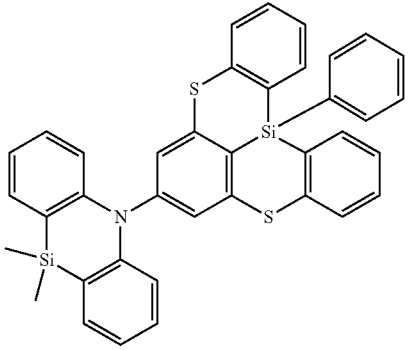

-continued
57
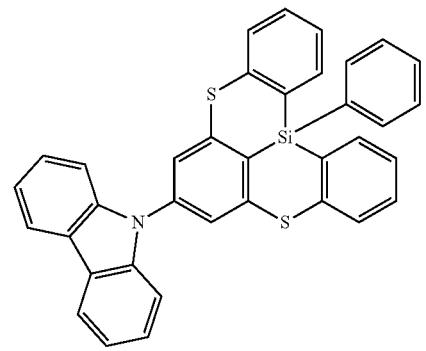
58
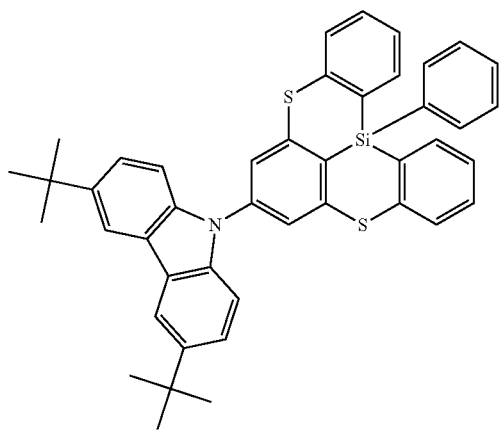
59
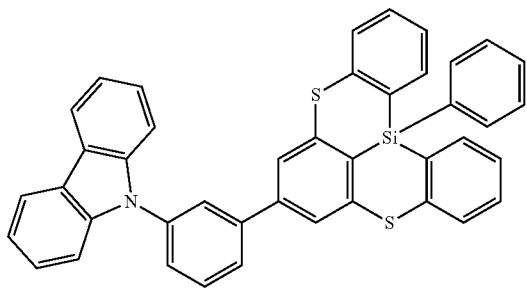
60
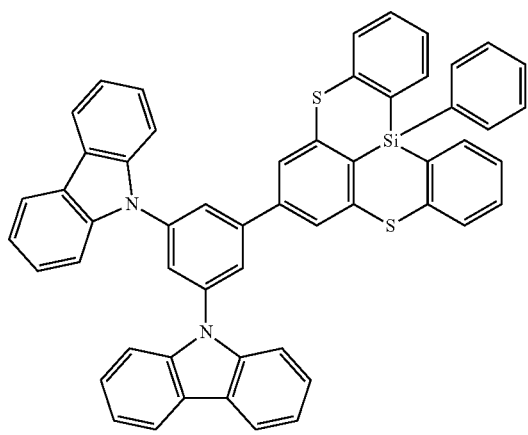
-continued
61
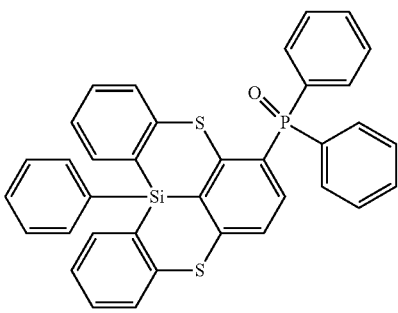
62
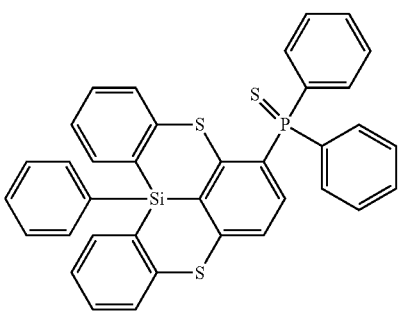
63
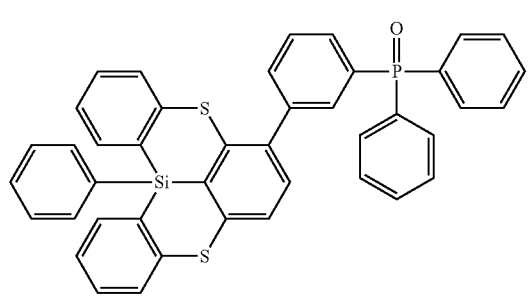
64
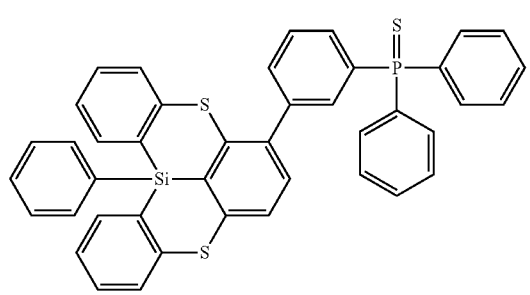
65
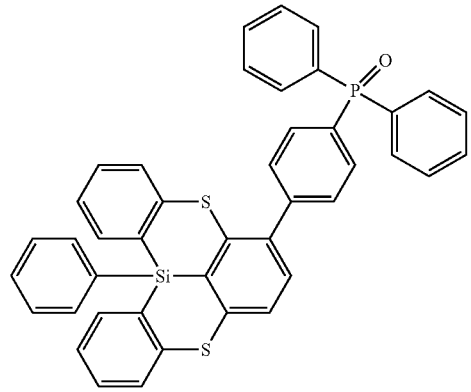

66
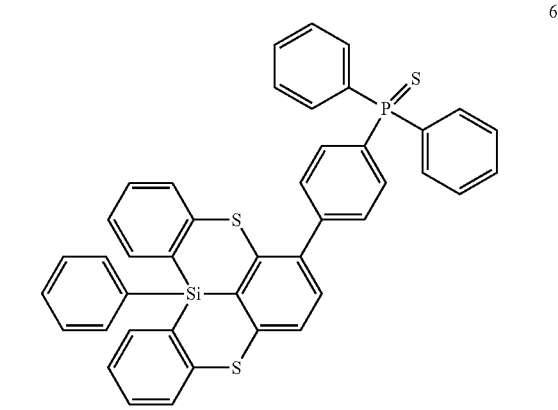
67
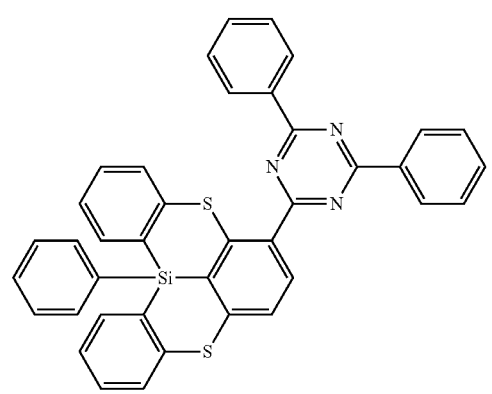
68
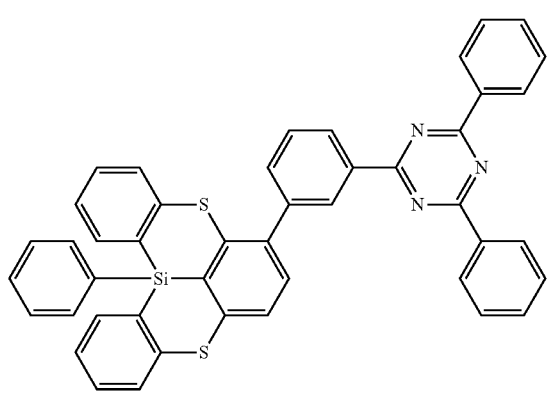
70
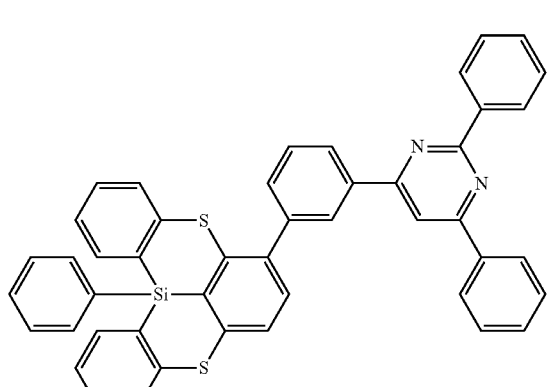
70
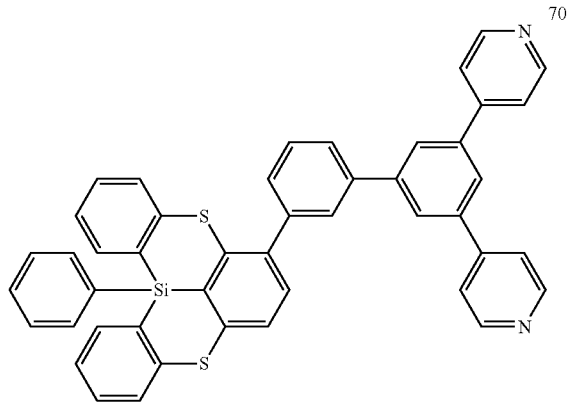
71
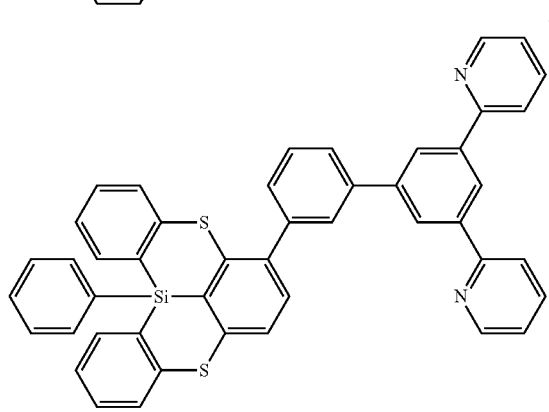
72
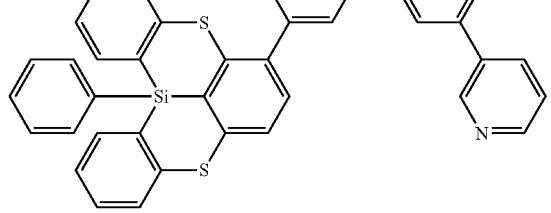
73
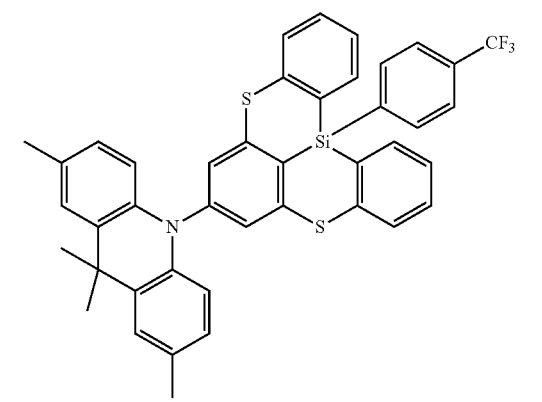

74
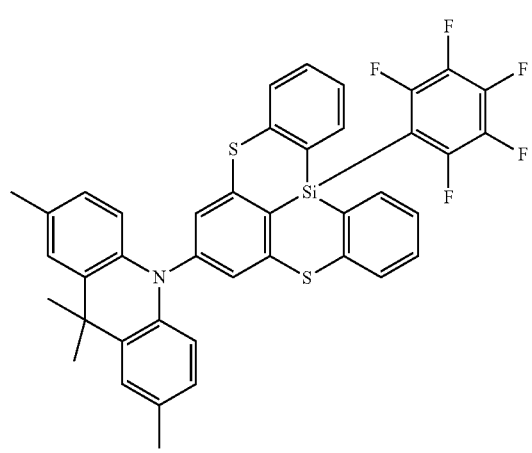
78
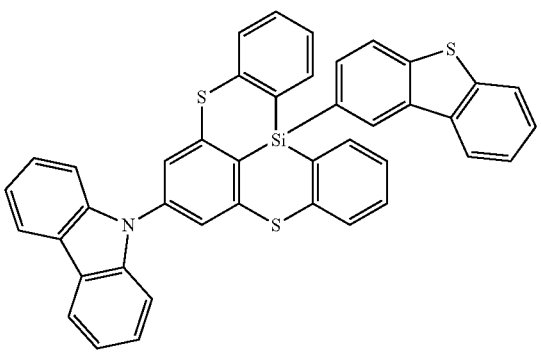
75
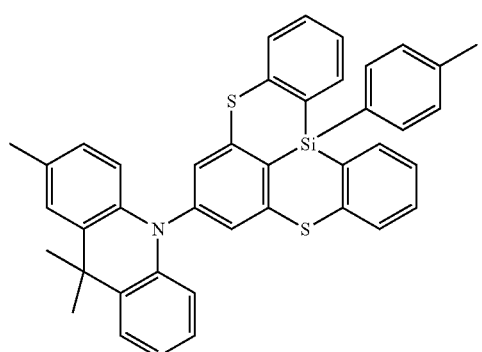
79
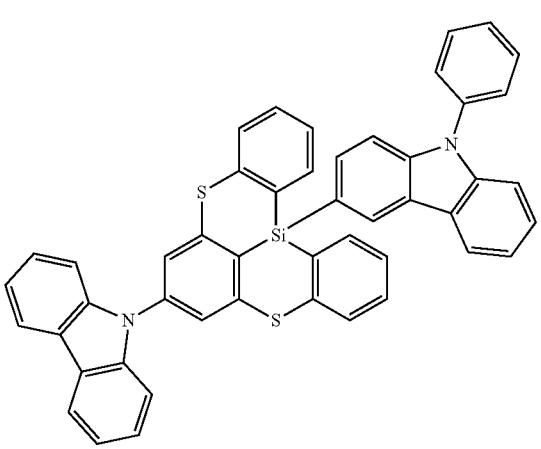
76
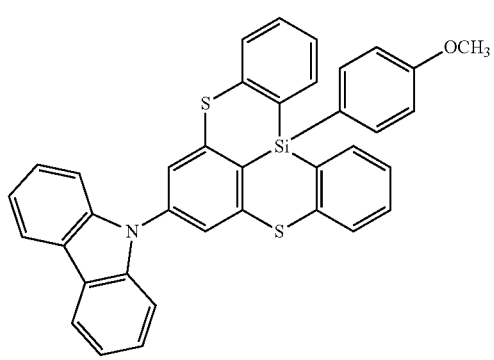
77
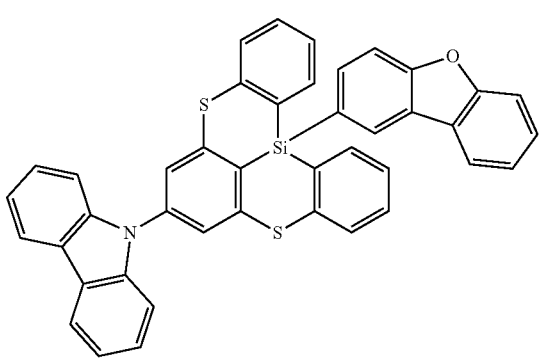
80
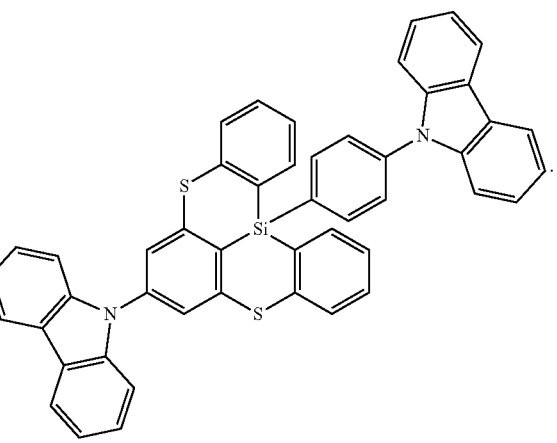
* * * * *